(12) United States Patent
Wada et al.

(10) Patent No.: US 12,549,180 B2
(45) Date of Patent: Feb. 10, 2026

(54) ISOLATION TRANSFORMER, ISOLATION MODULE, AND GATE DRIVER

(71) Applicant: ROHM CO., LTD., Kyoto (JP)

(72) Inventors: Keiji Wada, Kyoto (JP); Yasushi Hamazawa, Kyoto (JP)

(73) Assignee: ROHM CO., LTD., Kyoto (JP)

(*) Notice: Subject to any disclaimer, the term of this patent is extended or adjusted under 35 U.S.C. 154(b) by 203 days.

(21) Appl. No.: 18/475,216

(22) Filed: Sep. 27, 2023

(65) Prior Publication Data

US 2024/0022246 A1 Jan. 18, 2024

Related U.S. Application Data

(63) Continuation of application No. PCT/JP2022/015020, filed on Mar. 28, 2022.

(30) Foreign Application Priority Data

Mar. 29, 2021 (JP) .................... 2021-055724

(51) Int. Cl.
*H03K 17/691* (2006.01)
*H03K 17/06* (2006.01)

(52) U.S. Cl.
CPC ......... *H03K 17/691* (2013.01); *H03K 17/063* (2013.01); *H03K 2217/0063* (2013.01); *H03K 2217/0072* (2013.01)

(58) Field of Classification Search
None
See application file for complete search history.

(56) References Cited

U.S. PATENT DOCUMENTS

| 6,486,765 | B1 | 11/2002 | Katayanagi | |
|---|---|---|---|---|
| 9,367,386 | B2* | 6/2016 | Kaeriyama | ............... H03F 3/24 |
| 2013/0055052 | A1 | 2/2013 | Kaeriyama | |
| 2014/0325322 | A1 | 10/2014 | Kaeriyama | |
| 2021/0043361 | A1 | 2/2021 | Osada | |
| 2023/0124986 | A1 | 4/2023 | Osada | |

FOREIGN PATENT DOCUMENTS

| JP | 2001-085248 A | 3/2001 |
|---|---|---|
| JP | 2011-082371 A | 4/2011 |
| JP | 2012-257421 A | 12/2012 |
| JP | 2013-051547 A | 3/2013 |
| WO | 2017/013768 A1 | 1/2017 |
| WO | 2020/183867 A1 | 9/2020 |

OTHER PUBLICATIONS

International Search Report and Written Opinion mailed on May 17, 2022, received for PCT Application PCT/JP2022/015020, filed on Mar. 28, 2022, 19 pages including English Translation.

Office Action mailed Dec. 16, 2025 in corresponding Japanese patent application No. 2023-511265 (12 pages; with English translation).

* cited by examiner

*Primary Examiner* — Cassandra F Cox
(74) *Attorney, Agent, or Firm* — XSENSUS LLP

(57) ABSTRACT

An isolation transformer includes an insulation layer and a transformer. The transformer includes a first coil and a second coil embedded in the insulation layer. The first coil and the second coil are opposed to each other in a thickness-wise direction of the insulation layer. The first coil and the second coil include non-overlapping portions that do not overlap each other in the thickness-wise direction of the insulation layer.

15 Claims, 22 Drawing Sheets

ISOLATION TRANSFORMER, ISOLATION MODULE, AND GATE DRIVER

CROSS-REFERENCE TO RELATED APPLICATIONS

This application is a continuation of International Application No. PCT/JP2022/015020, filed Mar. 28, 2022, which claims priority to JP 2021-055724, filed Mar. 29, 2021, the entire contents of each are incorporated herein by reference.

BACKGROUND

1. Field

The following description relates to an isolation transformer, an isolation module, and a gate driver.

2. Description of Related Art

An example of a gate driver that applies a gate voltage to the gate of a switching element such as a transistor is an insulated gate driver. Japanese Laid-Open Patent Publication No. 2013-51547 describes an example of a semiconductor integrated circuit used as an insulated gate driver that includes a transformer. The transformer includes a first coil at the primary side and a second coil at the secondary side.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

This description provides a comprehensive understanding of the methods, apparatuses, and/or systems described. Modifications and equivalents of the methods, apparatuses, and/or systems described are apparent to one of ordinary skill in the art. Sequences of operations are exemplary, and may be changed as apparent to one of ordinary skill in the art, with the exception of operations necessarily occurring in a certain order. Descriptions of functions and constructions that are well known to one of ordinary skill in the art may be omitted.

Exemplary embodiments may have different forms, and are not limited to the examples described. However, the examples described are thorough and complete, and convey the full scope of the disclosure to one of ordinary skill in the art.

Embodiments of a gate driver will be described below with reference to the drawings. The embodiments described below exemplify configurations and methods for embodying a technical concept and are not intended to limit the material, shape, structure, layout, dimensions, and the like of each component to those described below.

First Embodiment

Figure 1:
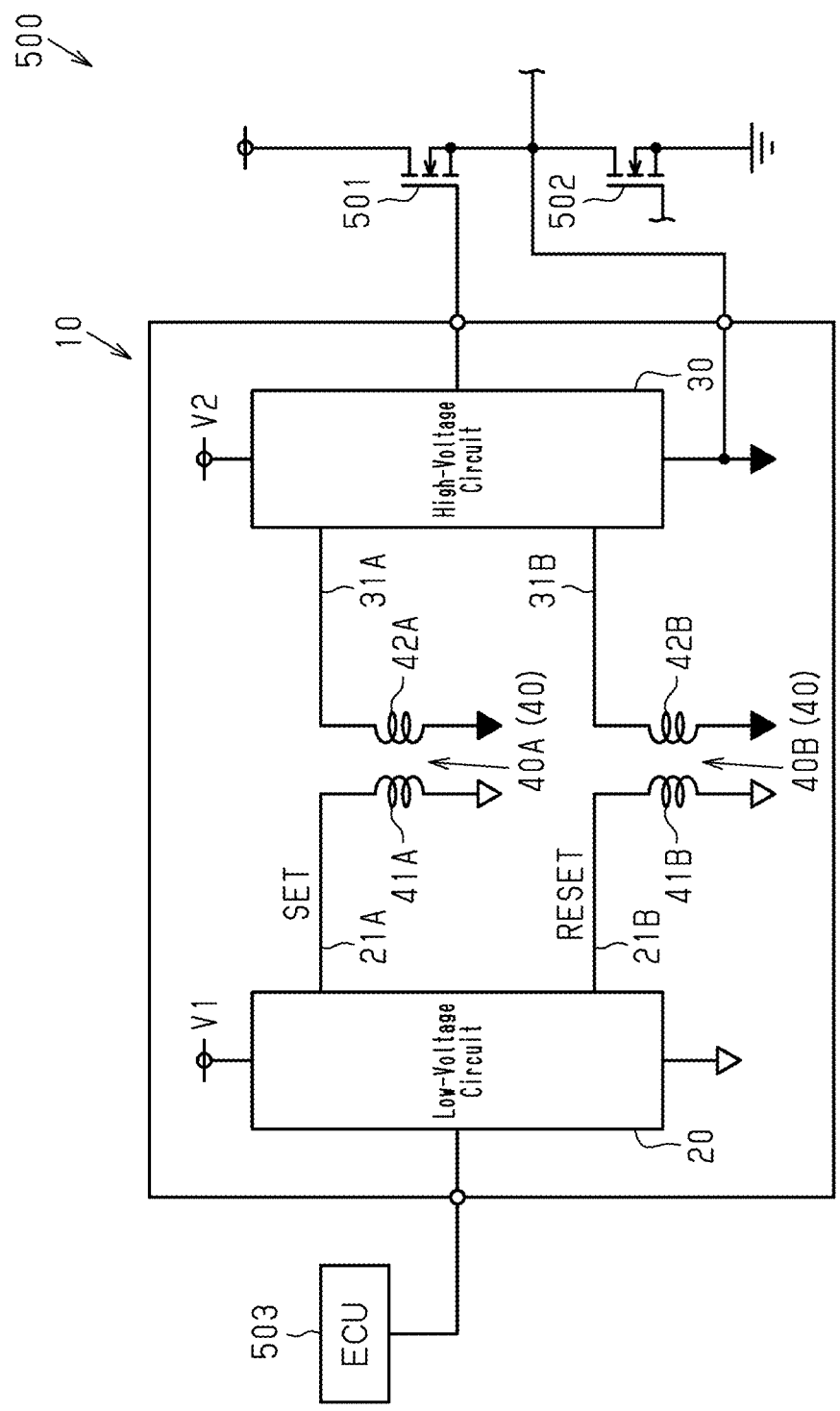
FIG. 1 is a schematic circuit diagram showing a first embodiment of a gate driver.

A first embodiment of a gate driver 10 will be described with reference to FIGS. 1 to 5. FIG. 1 schematically shows an example of a circuit configuration of the gate driver 10.

As shown in FIG. 1, the gate driver 10 is configured to apply a drive voltage signal to the gate of a switching element. In an example, the gate driver 10 is used in an inverter device 500 mounted on an electric vehicle or a hybrid electric vehicle. The inverter device 500 includes two switching elements 501 and 502 connected in series to each other, the gate driver 10, and an electronic control unit 503 (ECU) that controls the gate driver 10. In an example, the switching element 501 is a high-side switching element connected to a drive power supply. The switching element 502 is a low-side switching element. Examples of the switching elements 501 and 502 include transistors such as a Si metal-oxide-semiconductor field-effect transistor (Si MOSFET), a SiC MOSFET, and an insulated gate bipolar transistor (IGBT). The gate driver 10 of the present embodiment applies a drive voltage signal to the gate of the switching element 501. In the description hereafter, MOSFETs are used in the switching elements 501 and 502.

The gate driver 10 is provided for each of the switching elements 501 and 502 and separately drives the switching elements 501 and 502. In the present embodiment, the gate driver 10 that drives the switching element 501 will be described for the sake of convenience.

The gate driver 10 includes a low-voltage circuit 20 configured to be actuated by application of the first voltage V1, a high-voltage circuit 30 configured to be actuated by application of the second voltage V2 that is higher than the first voltage V1, and a transformer 40. The first voltage V1 and the second voltage V2 are direct current voltages. The gate driver 10 of the present embodiment is configured, based on a control signal from the ECU 503, which is an external control device, to transmit a signal from the low-voltage circuit 20 to the high-voltage circuit 30 through the transformer 40 and to output a drive voltage signal from the high-voltage circuit 30.

The signal transmitted from the low-voltage circuit 20 toward the high-voltage circuit 30, that is, a signal output from the low-voltage circuit 20, is, for example, for driving the switching element 501. Examples of the signal include a set signal and a reset signal. The set signal transmits a rising edge of the control signal from the ECU 503. The reset signal transmits a falling edge of the control signal from the ECU 503. In other words, the set signal and the reset signal are signals for generating a drive voltage signal of the switching element 501. The set signal and the reset signal correspond to a first signal.

The low-voltage circuit 20 is electrically connected to the ECU 503 and generates a set signal and a reset signal based on a control signal received from the ECU 503. In an example, the low-voltage circuit 20 generates the set signal in response to a rising edge of the control signal and generates the reset signal in response to a falling edge of the control signal. The low-voltage circuit 20 transmits the generated set signal and reset signal toward the high-voltage circuit 30.

The high-voltage circuit 30 is electrically connected to the gate of the switching element 501. Based on the set signal and the reset signal received from the low-voltage circuit 20, the high-voltage circuit 30 generates a drive voltage signal for driving the switching element 501 and applies the drive voltage signal to the gate of the switching element 501. In other words, the high-voltage circuit 30 generates a drive voltage signal that is applied to the gate of the switching element 501 based on the first signal output from the low-voltage circuit 20. More specifically, the high-voltage circuit 30 generates a drive voltage signal for activating the switching element 501 based on the set signal and applies the drive voltage signal to the gate of the switching element 501. The high-voltage circuit 30 generates a drive voltage signal for deactivating the switching element 501 based on the reset signal and applies the drive voltage signal to the gate of the switching element 501. Thus, the gate driver 10 controls the activation and deactivation of the switching element 501.

The high-voltage circuit 30 includes, for example, an R-S flip-flop circuit, into which a set signal and a reset signal are input, and a driver unit. The driver unit generates a drive voltage signal based on an output signal of the R-S flip-flop circuit. However, the high-voltage circuit 30 may have any specific circuit configuration.

The transformer 40 is arranged between the low-voltage circuit 20 and the high-voltage circuit 30. More specifically, the low-voltage circuit 20 and the high-voltage circuit 30 are electrically connected by the transformer 40. In the gate driver 10 of the present embodiment, the low-voltage circuit 20 and the high-voltage circuit 30 are insulated from each other by the transformer 40. More specifically, the transformer 40 restricts transmission of a direct current voltage between the low-voltage circuit 20 and the high-voltage circuit 30 while allowing transmission of various signals such as the set signal and the reset signal.

Thus, the state in which the low-voltage circuit 20 and the high-voltage circuit 30 are insulated from each other refers to a state in which transmission of a direct current voltage between the low-voltage circuit 20 and the high-voltage circuit 30 is interrupted, while transmission of a signal between the low-voltage circuit 20 and the high-voltage circuit 30 is allowed.

The insulation voltage of the gate driver 10 is, for example, in a range of 2500 Vrms to 7500 Vrms. In the present embodiment, the insulation voltage of the gate driver 10 is approximately 3750 Vrms. However, the insulation voltage of the gate driver 10 is not limited to these values and may be any specific numerical value.

In the present embodiment, the insulation voltage of the transformer 40 is in a range of, for example, 2500 Vrms to 7500 Vrms. The insulation voltage of the transformer 40 may be in a range of 2500 Vrms to 5700 Vrms. However, the insulation voltage of the transformer 40 is not limited to these values and may be any value.

In the present embodiment, the ground of the low-voltage circuit 20 and the ground of the high-voltage circuit 30 are arranged independently. In the description hereafter, the ground potential of the low-voltage circuit 20 is referred to as a first reference potential, and the ground potential of the high-voltage circuit 30 is referred to as a second reference potential. In this case, the first voltage V1 is a voltage from the first reference potential, and the second voltage V2 is a voltage from the second reference potential. The first voltage V1 is, for example, in a range of 4.5 V to 5.5 V. The second voltage V2 is, for example, in a range of 9 V to 24 V.

The transformer 40 will now be described in detail.

The gate driver 10 of the present embodiment includes two transformers 40 corresponding to two types of signals transmitted from the low-voltage circuit 20 to the high-voltage circuit 30. More specifically, the gate driver 10 includes a transformer 40 that is used to transmit a set signal and a transformer 40 that is used to transmit a reset signal. Hereinafter, for the sake of brevity, the transformer 40 used to transmit a set signal is referred to as a transformer 40A. The transformer 40 used to transmit a reset signal is referred to as a transformer 40B.

The gate driver 10 includes a low-voltage signal line 21A, which connects the low-voltage circuit 20 and the transformer 40A, and a low-voltage signal line 21B, which connects the low-voltage circuit 20 and the transformer 40B. Thus, the low-voltage signal line 21A transmits the set signal from the low-voltage circuit 20 to the transformer 40A. The low-voltage signal line 21B transmits the reset signal from the low-voltage circuit 20 to the transformer 40B.

The gate driver 10 includes a high-voltage signal line 31A, which connects the transformer 40A and the high-voltage circuit 30, and a high-voltage signal line 31B, which connects the transformer 40B and the high-voltage circuit 30. Thus, the high-voltage signal line 31A transmits the set signal from the transformer 40A to the high-voltage circuit 30. The high-voltage signal line 31B transmits the reset signal from the transformer 40B to the high-voltage circuit 30.

The transformer 40A includes a first coil 41A and a second coil 42A that is insulated from and configured to be magnetically coupled to the first coil 41A.

The first coil 41A is connected to the low-voltage circuit 20 by the low-voltage signal line 21A and is also connected to the ground of the low-voltage circuit 20. More specifically, the first coil 41A includes a first end electrically connected to the low-voltage circuit 20 and a second end electrically connected to the ground of the low-voltage circuit 20. Thus, the potential of the second end of the first coil 41A equals the first reference potential. The first reference potential is, for example, 0 V.

The second coil 42A is connected to the high-voltage circuit 30 by the high-voltage signal line 31A and is also connected to the ground of the high-voltage circuit 30. More specifically, the second coil 42A includes a first end electrically connected to the high-voltage circuit 30 and a second end electrically connected to the ground of the high-voltage circuit 30. Thus, the potential of the second end of the second coil 42A equals the second reference potential.

The ground of the high-voltage circuit 30 is connected to the source of the switching element 501. Thus, the second reference potential fluctuates as the inverter device 500 is driven and may become, for example, greater than or equal to 600 V.

The transformer 40B includes a first coil 41B, which is electrically connected to the low-voltage circuit 20 by the low-voltage signal line 21B, and a second coil 42B, which is insulated from and configured to be magnetically coupled to the first coil 41B. The second coil 42B is electrically connected to the high-voltage circuit 30. The transformer 40B is the same as the transformer 40A and thus will not be described in detail.

As described above, the set signal output from the low-voltage circuit 20 is transmitted through the first coil 41A and the second coil 42A, in this order, to the high-voltage circuit 30. The reset signal output from the low-voltage circuit 20 is transmitted through the first coil 41B and the second coil 42B, in this order, to the high-voltage circuit 30. The first coil 41A corresponds to a transmission coil that transmits the set signal to the second coil 42A. The second coil 42A corresponds to a reception coil that receives the set signal from the first coil 41A. The first coil 41B corresponds to a transmission coil that transmits the reset signal to the second coil 42B. The second coil 42B corresponds to a reception coil that receives the reset signal from the first coil 41B.

Figure 2:
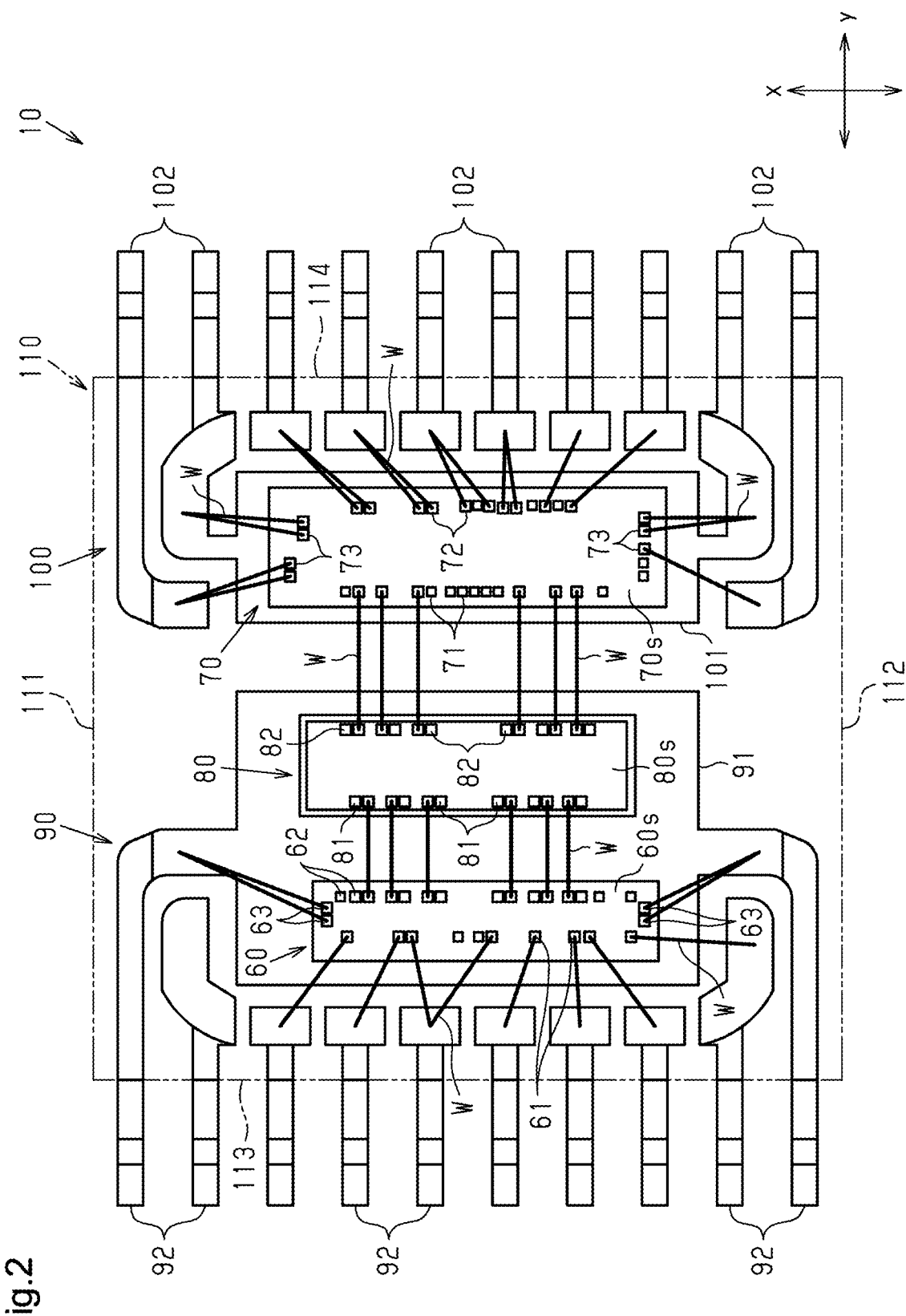
FIG. 2 is a plan view showing an internal structure of the gate driver of the first embodiment.

The structure of the gate driver 10 will now be described with reference to FIG. 2. FIG. 2 shows an example of a plan view showing the internal structure of the gate driver 10. FIG. 1 shows a simplified circuit configuration of the gate driver 10. Hence, the number of external terminals of the gate driver 10 shown in FIG. 2 is greater than the number of external terminals of the gate driver 10 shown in FIG. 1. The number of external terminals of the gate driver 10 is the number of external electrodes configured to connect the gate driver 10 to electronic components arranged outside the gate driver 10, such as the ECU 503 and the switching element 501 (refer to FIG. 1). The number of signal lines (the number of wires W described later) that transmit a signal from the low-voltage circuit 20 to the high-voltage circuit 30 in the gate driver 10 shown in FIG. 2 is greater than the number of signal lines in the gate driver 10 shown in FIG. 1.

As shown in FIG. 2, the gate driver 10 is a semiconductor device including multiple semiconductor chips arranged in a single package and is, for example, mounted on a circuit substrate arranged in the inverter device 500. Each of the switching elements 501 and 502 is mounted on a mount substrate that differs from the circuit substrate. A cooling unit is attached to the mount substrate.

The package type of the gate driver 10 is small outline (SO) and is a small outline package (SOP) in the present embodiment. The gate driver 10 includes a low-voltage circuit chip 60, a high-voltage circuit chip 70, and a transformer chip 80, which are semiconductor chips, a low-voltage lead frame 90 on which the low-voltage circuit chip 60 is mounted, a high-voltage lead frame 100 on which the high-voltage circuit chip 70 is mounted, and an encapsulation resin 110 that encapsulates the chips 60, 70, 80 and a part of the lead frames 90 and 100. In the present embodiment, the transformer chip 80 corresponds to an "isolation transformer." The transformer chip 80 and the encapsulation resin 110 correspond to an "isolation module" that insulates the low-voltage circuit 20 from the high-voltage circuit 30. In FIG. 2, the encapsulation resin 110 is indicated by double-dashed lines to illustrate the internal structure of the gate driver 10. The package type of the gate driver 10 may be changed in any manner.

The encapsulation resin 110 is formed from an electrically-insulative material and is formed from, for example, a black epoxy resin. The encapsulation resin 110 has the form of a rectangular plate having a thickness-wise direction conforming to the z-direction. The encapsulation resin 110 includes four resin side surfaces 111 to 114. More specifically, the encapsulation resin 110 includes two end surfaces in the x-direction, namely, the resin side surfaces 111 and 112, and two end surfaces in the y-direction, namely, the resin side surfaces 113 and 114. The x-direction and the y-direction are orthogonal to the z-direction. The x-direction and the y-direction are orthogonal to each other. In the description hereafter, a plan view means a view in the z-direction.

The low-voltage lead frame 90 and the high-voltage lead frame 100 are formed from a conductor and, in the present embodiment, are formed from copper (Cu). The lead frames 90 and 100 extend from the inside to the outside of the encapsulation resin 110.

The low-voltage lead frame 90 includes a low-voltage die pad 91 arranged in the encapsulation resin 110 and low-voltage leads 92 extending from the inside to the outside of the encapsulation resin 110. Each low-voltage lead 92 includes an external terminal configured to be electrically connected to an external electronic device such as the ECU 503 (refer to FIG. 1).

The low-voltage circuit chip 60 and the transformer chip 80 are mounted on the low-voltage die pad 91. In plan view, the low-voltage die pad 91 is arranged so that the center of the low-voltage die pad 91 in the y-direction is located closer in the y-direction to the resin side surface 113 than the center of the encapsulation resin 110 is. In the present embodiment, the low-voltage die pad 91 is not exposed from the encapsulation resin 110. In plan view, the low-voltage die pad 91 is rectangular so that the long sides extend in the x-direction and the short sides extend in the y-direction.

The low-voltage leads 92 are separated from each other in the x-direction. Among the low-voltage leads 92, the low-voltage leads 92 located at opposite ends in the x-direction are integrated with the low-voltage die pad 91. Each low-voltage lead 92 partially projects from the resin side surface 113 toward the outside of the encapsulation resin 110.

The high-voltage lead frame 100 includes a high-voltage die pad 101 arranged in the encapsulation resin 110 and high-voltage leads 102 extending from the inside to the outside of the encapsulation resin 110. Each high-voltage lead 102 includes an external terminal configured to be electrically connected to an external electronic device such as the gate of the switching element 501 (refer to FIG. 1).

The high-voltage circuit chip 70 is mounted on the high-voltage die pad 101. In plan view, the high-voltage die pad 101 is located closer in the y-direction to the resin side surface 114 than the low-voltage die pad 91 is. In the present embodiment, the high-voltage die pad 101 is not exposed from the encapsulation resin 110. In plan view, the high-voltage die pad 101 is rectangular so that the long sides extend in the x-direction and the short sides extend in the y-direction.

The low-voltage die pad 91 and the high-voltage die pad 101 are separated from each other in the y-direction. The y-direction may also be referred to as the arrangement direction of the two die pads 91 and 101.

The dimension of the low-voltage die pad 91 and the high-voltage die pad 101 in the y-direction is set in accordance with the size and the number of semiconductor chips that are mounted. In the present embodiment, the low-voltage circuit chip 60 and the transformer chip 80 are mounted on the low-voltage die pad 91, and the high-voltage circuit chip 70 is mounted on the high-voltage die pad 101. Hence, the low-voltage die pad 91 is greater than the high-voltage die pad 101 in dimension in the y-direction.

The high-voltage leads 102 are separated from each other in the x-direction. Among the high-voltage leads 102, two of the high-voltage leads 102 are integrated with the high-voltage die pad 101. Each high-voltage lead 102 partially projects from the resin side surface 114 toward the outside of the encapsulation resin 110.

In the present embodiment, the number of the high-voltage leads 102 is the same as the number of the low-voltage leads 92. As shown in FIG. 2, the low-voltage leads 92 and the high-voltage leads 102 are arranged in a direction (x-direction) orthogonal to the arrangement direction (y-direction) of the low-voltage die pad 91 and the high-voltage die pad 101. The number of the high-voltage leads 102 and the number of the low-voltage leads 92 may be changed in any manner.

In the present embodiment, the low-voltage die pad 91 is supported by the two low-voltage leads 92 integrated with the low-voltage die pad 91, and the high-voltage die pad 101 is supported by the two high-voltage leads 102 integrated with the high-voltage die pad 101. Thus, the die pads 91 and 101 do not include suspension leads exposed from the resin side surfaces 111 and 112. This allows for an increase in the insulation distance between the low-voltage lead frame 90 and the high-voltage lead frame 100.

The low-voltage circuit chip 60, the high-voltage circuit chip 70, and the transformer chip 80 are separated from each other in the y-direction. In other words, in plan view, the low-voltage circuit chip 60, the high-voltage circuit chip 70, and the transformer chip 80 are separated apart from each other in the arrangement direction of the die pads 91 and 101. In the present embodiment, the low-voltage circuit chip 60, the transformer chip 80, and the high-voltage circuit chip 70 are arranged in this order from the resin side surface 113 toward the resin side surface 114 in the y-direction.

Since the leads 92 and 102 are arranged in the x-direction, the x-direction may also be referred to as the arrangement direction of the leads 92 and 102. The y-direction may also be referred to as a direction orthogonal to the arrangement direction of the leads 92 and 102 in plan view. Thus, in other words, the low-voltage circuit chip 60, the high-voltage circuit chip 70, and the transformer chip 80 are separated from each other in the direction orthogonal to the arrangement direction of the leads 92 and 102 in plan view. In plan view, the low-voltage circuit chip 60, the transformer chip 80, and the high-voltage circuit chip 70 are arranged in this order from the low-voltage leads 92 toward the high-voltage leads 102.

The low-voltage circuit chip 60 includes the low-voltage circuit 20 shown in FIG. 1. In plan view, the low-voltage circuit chip 60 is rectangular and has short sides and long sides. In plan view, the low-voltage circuit chip 60 is mounted on the low-voltage die pad 91 such that the long sides extend in the x-direction and the short sides extend in the y-direction. The low-voltage circuit chip 60 includes a chip main surface 60s and a chip back surface (not shown) facing opposite directions in the z-direction. The chip back surface of the low-voltage circuit chip 60 is bonded to the low-voltage die pad 91 by a conductive bonding material such as solder or silver (Ag) paste.

First electrode pads 61, second electrode pads 62, and third electrode pads 63 are formed on the chip main surface 60s of the low-voltage circuit chip 60. The electrode pads 61 to 63 are electrically connected to the low-voltage circuit 20 shown in FIG. 1.

The first electrode pads 61 are located on the chip main surface 60s between the center of the chip main surface 60s in the y-direction and the low-voltage leads 92. The first electrode pads 61 are arranged in the x-direction. The second electrode pads 62 are arranged on one of the opposite ends of the chip main surface 60s in the y-direction located closer to the transformer chip 80. The second electrode pads 62 are arranged in the x-direction. The third electrode pads 63 are arranged on opposite ends of the chip main surface 60s in the x-direction.

The transformer chip 80 includes the transformers 40A and 40B shown in FIG. 1. In plan view, the transformer chip 80 is rectangular and has short sides and long sides. In the present embodiment, in plan view, the transformer chip 80 is mounted on the low-voltage die pad 91 such that the long sides extend in the x-direction and the short sides extend in the y-direction.

The transformer chip 80 is arranged adjacent to the low-voltage circuit chip 60 in the y-direction. In the present embodiment, the transformer chip 80 is arranged closer to the high-voltage circuit chip 70 than the low-voltage circuit chip 60 is.

Figure 5:
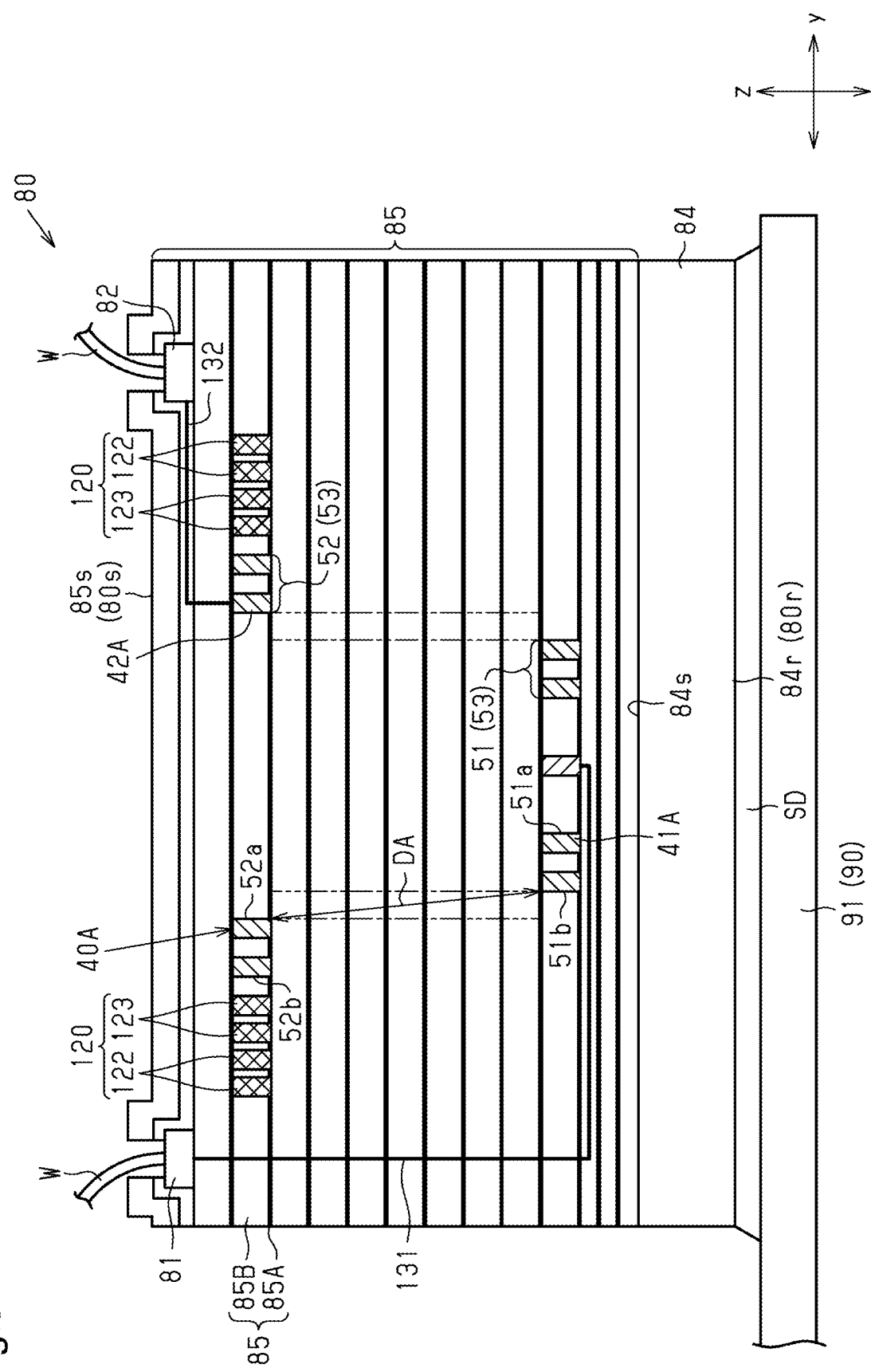
FIG. 5 is a schematic cross-sectional view of the transformer chip shown in FIG. 3 taken along line 5-5.

As shown in FIG. 5, the transformer chip 80 includes a chip main surface 80s and a chip back surface 80r facing in opposite directions in the z-direction. The chip main surface and the chip main surface 60s (refer to FIG. 2) of the low-voltage circuit chip 60 face in the same direction. The chip back surface 80r and the chip back surface of the low-voltage circuit chip 60 face in the same direction. The chip back surface 80r of the transformer chip is bonded to the low-voltage die pad 91 by the conductive bonding material SD.

As shown in FIG. 2, first electrode pads 81 and second electrode pads 82 are formed on the chip main surface 80s of the transformer chip 80. The first electrode pads 81 are arranged, for example, on one of the opposite ends of the chip main surface 80s in the y-direction located closer to the low-voltage circuit chip 60. The first electrode pads 81 are arranged in the x-direction. The second electrode pads 82 are arranged near the center of the chip main surface 80s in the y-direction. The second electrode pads 82 are arranged in the x-direction.

The lead frames 90 and 100 are closest to each other at the low-voltage die pad 91 and the high-voltage die pad 101. Therefore, the low-voltage die pad 91 and the high-voltage die pad 101 need to be separated from each other by a predetermined distance or more so that the gate driver 10 has a predetermined insulation voltage. Hence, in plan view, the distance between the high-voltage circuit chip 70 and the transformer chip 80 is greater than the distance between the low-voltage circuit chip 60 and the transformer chip 80.

The transformer chip 80 includes the transformers 40A and 40B (refer to FIG. 1). More specifically, the transformers 40A and 40B are integrated in a single chip. The transformer chip 80 is a semiconductor chip that is separate from the low-voltage circuit chip and the high-voltage circuit chip 70 (refer to FIG. 2) and is dedicated to the transformers 40A and 40B.

The first coil 41A of the transformer 40A and the first coil 41B of the transformer (refer to FIG. 1) are separately electrically connected to the first electrode pads 81. The second coil 42A of the transformer 40A and the second coil 42B of the transformer 40B (refer to FIG. 1) are separately electrically connected to the second electrode pads 82.

As shown in FIG. 2, the high-voltage circuit chip 70 includes the high-voltage circuit (refer to FIG. 1). In plan view, the high-voltage circuit chip 70 is rectangular and has short sides and long sides. In plan view, the high-voltage circuit chip 70 is mounted on the high-voltage die pad 101 such that the long sides extend in the x-direction and the short sides extend in the y-direction. The high-voltage circuit chip 70 includes a chip main surface 70s and a chip back surface (not shown) facing opposite directions in the z-direction. The chip main surface 70s and the chip main surface 80s of the transformer chip 80 face in the same direction. The chip back surface of the high-voltage circuit chip 70 and the chip back surface of the transformer chip 80 (refer to FIG. 5) face in the same direction. The chip back surface of the high-voltage circuit chip 70 is bonded to the high-voltage die pad 101 by a conductive bonding material.

As shown in FIG. 2, first electrode pads 71, second electrode pads 72, and third electrode pads 73 are formed on the chip main surface 70s of the high-voltage circuit chip 70. The first electrode pads 71 are arranged on one of the opposite ends of the chip main surface 70s in the y-direction located closer to the transformer chip 80. The first electrode pads 71 are arranged in the x-direction. The second electrode pads 72 are arranged on one of the opposite ends of the chip main surface 70s in the y-direction located farther away from the transformer chip 80. The second electrode pads 72 are arranged in the x-direction. The third electrode pads 73 are arranged on opposite ends of the chip main surface 70s in the x-direction. The electrode pads 71 to 73 are electrically connected to the high-voltage circuit (refer to FIG. 1) in the high-voltage circuit chip 70.

Wires W are connected to each of the low-voltage circuit chip 60, the transformer chip 80, and the high-voltage circuit chip 70. Each of the wires W is a bonding wire formed by a wire bonder and is, for example, formed from a conductor such as gold (Au), aluminum (Al), or Cu.

The low-voltage circuit chip 60 is electrically connected to the low-voltage lead frame 90 by wires W. More specifically, the first electrode pads 61 of the low-voltage circuit chip 60 are connected to the low-voltage leads 92 by wires W. The third electrode pads 63 of the low-voltage circuit chip 60 are connected by wires W to the two low-voltage leads 92 integrated with the low-voltage die pad 91. Thus, the low-voltage circuit 20 (refer to FIG. 1) is electrically connected to the low-voltage leads 92 (external electrodes of the gate driver 10 that are electrically connected to the ECU 503). In the present embodiment, the two low-voltage leads 92 integrated with the low-voltage die pad 91 include a ground terminal, and the low-voltage circuit 20 is electrically connected to the low-voltage die pad 91 by the wires W. Thus, the low-voltage die pad 91 has the same potential as the ground of the low-voltage circuit 20.

The low-voltage circuit chip 60 and the transformer chip 80 are electrically connected by wires W. More specifically, the second electrode pads 62 of the low-voltage circuit chip 60 and the first electrode pads 81 of the transformer chip 80 are connected by the wires W. Thus, the low-voltage circuit 20 is electrically connected to the first coils 41A and 41B of the transformers 40A and 40B (refer to FIG. 1).

The first coils 41A and 41B are electrically connected to the low-voltage die pad 91 by the first electrode pads 81, the wires W connecting the transformer chip 80 to the low-voltage circuit chip 60, the second electrode pads 62, the low-voltage circuit 20, the third electrode pads 63, and the wires W connected to the third electrode pads 63. Thus, the first coils 41A and 41B of the transformers 40A and 40B are electrically connected to the ground of the low-voltage circuit 20.

The transformer chip 80 and the high-voltage circuit chip 70 are electrically connected by wires W. More specifically, the second electrode pads 82 of the transformer chip 80 and the first electrode pads 71 of the high-voltage circuit chip 70 are connected by the wires W. Thus, the second coil 42A of the transformer 40A is electrically connected to the high-voltage circuit 30 (refer to FIG. 1), and the second coil 42B of the transformer 40B is electrically connected to the high-voltage circuit 30 (refer to FIG. 1).

The high-voltage circuit chip 70 and the high-voltage leads 102 of the high-voltage lead frame 100 are electrically connected by wires W. More specifically, the second electrode pads 72 and the third electrode pads 73 of the high-voltage circuit chip 70 are connected to the high-voltage leads 102 by the wires W. Thus, the high-voltage circuit 30 is electrically connected to the high-voltage leads 102 (external electrodes of the gate driver 10 that are electrically connected to the inverter device 500 such as the switching element 501). In the present embodiment, the two high-voltage leads 102 integrated with the high-voltage die pad 101 include a ground terminal, and the high-voltage circuit 30 is electrically connected to the high-voltage die pad 101 by the wires W. Thus, the high-voltage die pad 101 has the same potential as the ground of the high-voltage circuit 30.

The second coils 42A and 42B (refer to FIG. 1) of the transformers 40A and 40B are electrically connected to the ground of the high-voltage circuit 30. More specifically, the coils 42A and 42B are electrically connected to the high-voltage die pad 101 by the second electrode pads 82, the wires W connecting the transformer chip 80 to the high-voltage circuit chip 70, the first electrode pads 71, the high-voltage circuit 30, the third electrode pads 73, and the wires W that are connected to the third electrode pads 73 and to the high-voltage leads 102 integrated with the high-voltage die pad 101.

Structure of Transformer Chip

The structure of the transformer chip 80 will now be described in detail with reference to FIGS. 3 to 5. The structure of the transformer 40B is the same as that of the transformer 40A and thus will not be described in detail. In the following description, a direction from the chip back surface 80r of the transformer chip 80 toward the chip main surface 80s is referred to as an upward direction, and a direction from the chip main surface toward the chip back surface 80r is referred to as a downward direction.

Figure 3:
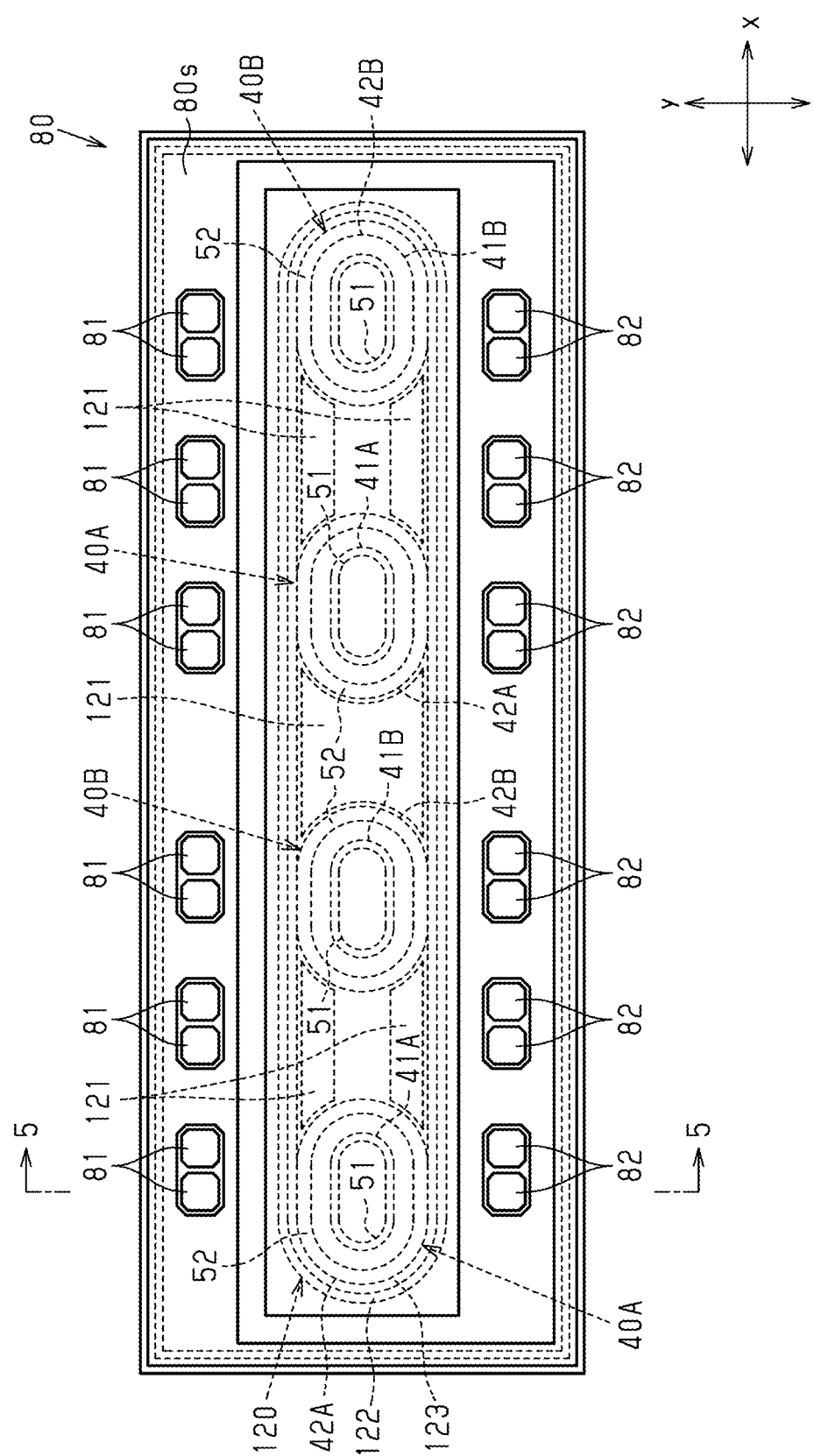
FIG. 3 is a schematic plan view of a transformer chip in the gate driver shown in FIG. 2.

FIG. 3 is a plan view showing an example of the transformer chip 80. For the sake of illustration, the transformers 40A and 40B and a dummy pattern 120, which will be described later, are indicated by broken lines. The transformer chip 80 shown in FIG. 3 includes two transformers 40A and two transformers 40B. More specifically, the transformer chip 80 shown in FIG. 3 has four transmission paths that transmit signals with the low-voltage circuit 20 and the high-voltage circuit 30 (refer to FIG. 1), which is different from the circuit diagram shown in FIG. 1. Alternatively, as in the circuit diagram shown in FIG. 1, the transformer chip 80 may have the two transformers 40A and 40B.

In the transformer chip 80 shown in FIG. 3, the two transformers 40A and the two transformers 40B are aligned with each other in a direction (in the present embodiment, y-direction) in which the short sides of the transformer chip 80 extend and separated from each other in a direction (in the present embodiment, x-direction) in which the long sides of the transformer chip 80 extend. In plan view, the two transformers 40A and the two transformers 40B are arranged in a direction orthogonal to a direction in which the chips 60, 70, 80 are arranged. For the sake of convenience, the transformers 40A and the transformers 40B are alternately arranged in the x-direction. More specifically, when one of the transformers 40A is located closest to the resin side surface 112 (refer to FIG. 2) of the transformer chip 80, the transformers 40A and the transformers 40B are alternately arranged in the x-direction.

Figure 4:
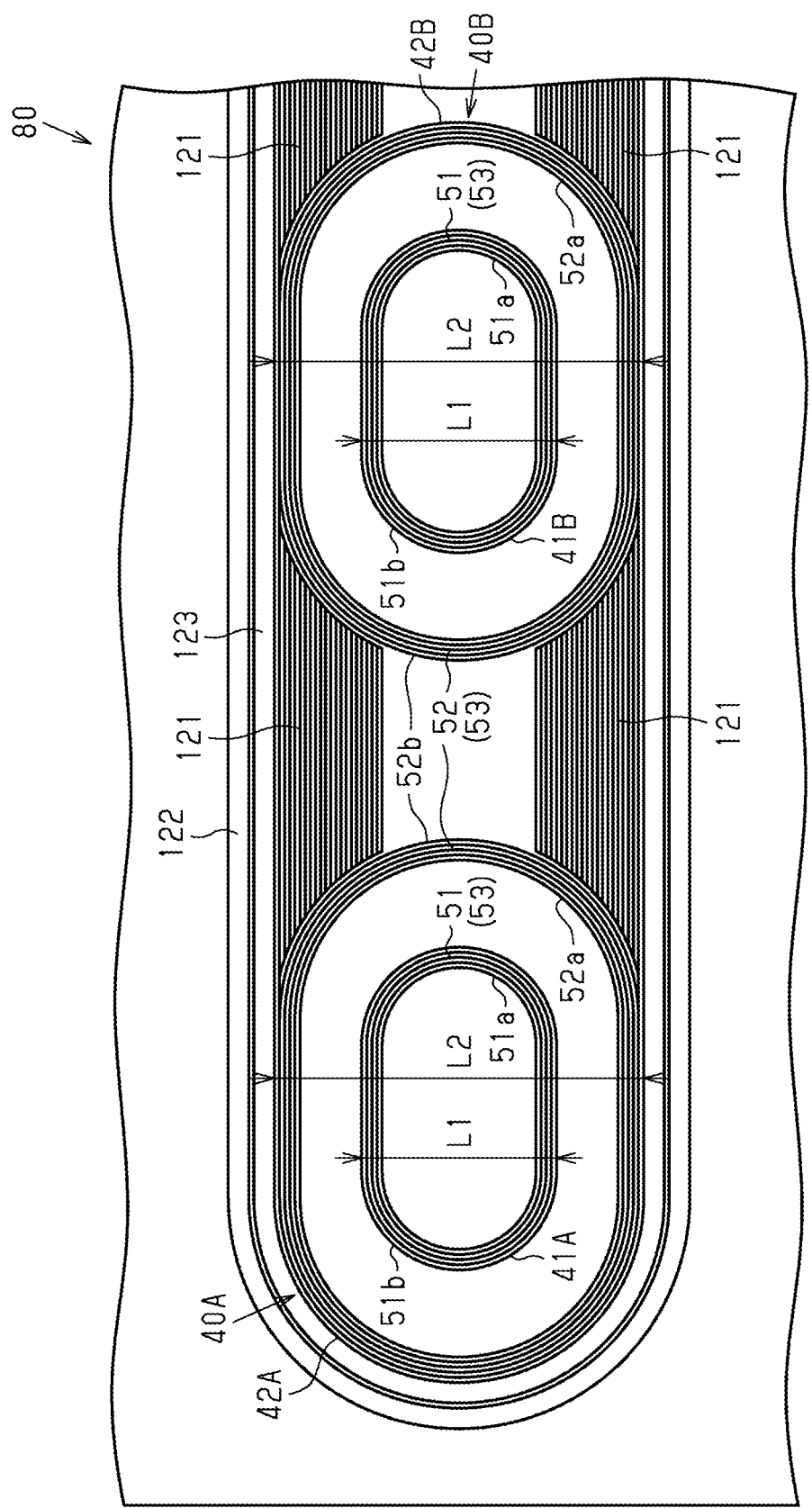
FIG. 4 is a schematic plan view showing the positional relationship among a first coil, a second coil, and a dummy pattern in the transformer chip shown in FIG. 2.

FIG. 4 is a schematic plan view showing the positional relationship of the dummy pattern 120 with the first coils 41A and 41B and the second coils 42A and 42B of the transformers 40A and 40B in the transformer chip 80 located close to the resin side surface 112. For the sake of illustration, the first coils 41A and 41B, which are located below the second coils 42A and 42B, are also indicated by solid lines.

FIG. 5 is a schematic cross-sectional view of the transformer 40A of the transformer chip 80 and its surroundings taken along line 5-5 in FIG. 3. FIG. 5 partially does not show hatching for simplicity and clarity. In FIG. 5, to facilitate understanding of the positional relationship of the first coil 41A and the second coil 42A, double-dashed auxiliary lines extend between the first coil 41A and the second coil 42A in the z-direction.

As shown in FIG. 5, the transformer chip 80 includes a substrate 84 and insulation layers 85 disposed on the substrate 84.

The substrate 84 is formed of, for example, a semiconductor substrate. In the present embodiment, the substrate 84 is formed from a material containing silicon (Si). As the semiconductor substrate, a wide-bandgap semiconductor or a compound semiconductor may be used in the substrate 84. Alternatively, instead of using the semiconductor substrate, an insulating substrate formed from a glass-containing material may be used in the substrate 84.

The wide-bandgap semiconductor is a semiconductor substrate having a band gap that is greater than or equal to 2.0 eV. The wide-bandgap semiconductor may be silicon carbide (SiC). The compound semiconductor may be a group III-V compound semiconductor. The compound semiconductor may include at least one of aluminum nitride (AlN), indium nitride (InN), gallium nitride (GaN), and gallium arsenide (GaAs).

The substrate 84 includes a substrate main surface 84s and a substrate back surface 84r facing opposite directions in the z-direction. The substrate back surface 84r defines the chip back surface 80r of the transformer chip 80.

In the present embodiment, multiple insulation layers 85 are stacked on the substrate main surface 84s of the substrate 84 in the z-direction. Thus, the z-direction may be referred to as a thickness-wise direction of the insulation layers 85. The insulation layers 85 are formed on the substrate main surface 84s of the substrate 84. In the present embodiment, the uppermost one of the insulation layers 85 includes a surface 85s defining the chip main surface 80s. In the present embodiment, the total thickness of the insulation layers 85 is greater than the thickness of the substrate 84. The number of insulation layers 85 stacked is set in accordance with an insulation voltage required of the transformer chip 80. Therefore, the total thickness of the insulation layers 85 may be smaller than the thickness of the substrate 84 depending on the number of insulation layers 85 stacked.

Each insulation layer 85 includes a first insulation film 85A and a second insulation film 85B formed on the first insulation film 85A.

The first insulation film 85A is, for example, an etching stopper film, and is formed from a material including silicon nitride (SiN), SiC, nitrogen-added silicon carbide (SiCN), or the like. In the present embodiment, the first insulation film 85A is formed from a material including SiN. The second insulation film 85B is, for example, an interlayer insulation film and is an oxide film formed from a material including silicon oxide ($SiO_2$). As shown in FIG. 5, the thickness of the second insulation film 85B is greater than the thickness of the first insulation film 85A. The thickness of the first insulation film 85A may be in a range of 100 nm to 1000 nm. The thickness of the second insulation film 85B may be in a range of 1000 nm to 3000 nm. In the present embodiment, the thickness of the first insulation film 85A is, for example, approximately 300 nm, and the thickness of the second insulation film 85B is, for example, approximately 2000 nm.

The two transformers 40A and the two transformers 40B (refer to FIG. 3) are embedded in the insulation layers 85. The two transformers 40A and the two transformers are aligned with each other in the z-direction.

As shown in FIG. 5, the first coil 41A and the second coil 42A of the transformer are opposed to each other in the z-direction with one or more insulation layers 85 interposed. In the present embodiment, the first coil 41A and the second coil 42A are opposed to each other in the z-direction with multiple insulation layers 85 interposed.

Each of the coils 41A and 42A is formed as a conductive layer embedded in one of the insulation layers 85. More specifically, insulation layers 85 in which the coils 41A and 42A are respectively embedded include grooves extending through the first insulation film 85A and the second insulation film 85B in the z-direction. The conductive layers forming the coils 41A and 42A are embedded in the grooves of the insulation layers 85. Each of the insulation layers 85 in which the coils 41A and 42A are embedded is covered by adjacent insulation layers 85 in the z-direction. Thus, the coils 41A and 42A are embedded in the insulation layers 85.

In the z-direction, the second coil 42A is located farther away from the substrate 84 than the first coil 41A is. In other words, the second coil 42A is located above the first coil 41A. Also, the first coil 41A is located closer to the substrate 84 than the second coil 42A is. In the present embodiment, the distance between the first coil 41A and the second coil 42A in the z-direction is greater than the distance between the first coil 41A and the substrate main surface 84s of the substrate 84.

As shown in FIG. 5, the electrode pads 81 and 82 are embedded in the insulation layers 85. In the present embodiment, the electrode pad 81 and the electrode pad 82 are located farther away from the substrate 84 than the second coil 42A of the transformer 40A is. In other words, the electrode pads 81 and 82 are located above the second coil 42A of the transformer 40A. In the present embodiment, the distance between the first coil 41A and the second coil 42A is greater than the distance between the second coil 42A and each of the electrode pads 81 and 82 in the z-direction. The positional relationship of the second coil 42B of the transformer 40B with the electrode pads 81 and 82 in the z-direction is the same as the positional relationship of the second coil 42A of the transformer 40A with the electrode pads 81 and 82 in the z-direction.

As shown in FIG. 3, in plan view, each first electrode pad 81 is aligned with one of the two transformers 40A or one of the two transformers 40B in the x-direction or arranged between the transformer 40A and the transformer 40B located next to each other in the x-direction. As shown in FIGS. 2 and 3, the first electrode pads 81 are arranged closer to the low-voltage circuit chip 60 in the y-direction than the two transformers 40A and the two transformers 40B are. In plan view, the first electrode pads 81 are arranged closer to the low-voltage leads 92 (refer to FIG. 2) than the two transformers 40A and the two transformers 40B are.

As shown in FIG. 3, in plan view, each second electrode pad 82 is aligned with one of the two transformers 40A or one of the two transformers 40B in the x-direction or arranged between the transformer 40A and the transformer 40B located next to each other in the x-direction. As shown in FIGS. 2 and 3, the second electrode pads 82 are arranged closer to the high-voltage circuit chip 70 in the y-direction than the two transformers 40A and the two transformers 40B are.

The first electrode pads 81 are separately electrically connected to the first coils 41A and 41B of the two transformers 40A and the two transformers 40B. The second electrode pads 82 are separately electrically connected to the second coils 42A and 42B of the two transformers 40A and the two transformers 40B.

As shown in FIG. 4, the second coil 42A is elliptical and spiral in plan view. The first coil 41A is similar in shape to the second coil 42A. The shapes of the first coil 41A and the second coil 42A may be changed in any manner. In an example, the first coil 41A and the second coil 42A may be annular.

In the present embodiment, in plan view, the first coil 41A has geometrical similarity with the second coil 42A. The first coil 41A and the second coil 42A are formed in the same winding direction in plan view. In the present embodiment, the first coil 41A and the second coil 42A are wound the same number of times. In plan view, the first coil 41A is concentric with the second coil 42A. The first coil 41A and the second coil 42A being concentric with each other includes the center of the first coil 41A being misaligned with the center of the second coil 42A due to a manufacturing error when the first coil 41A and the second coil 42A are formed in the insulation layers 85. One or more from Ti, TiN, Au, Ag, Cu, Al, and W are selected for each of the coils 41A and 42A. In the present embodiment, the coils 41A and 42A are formed from a material including Cu. The structure of the transformer 40B is the same as that of the transformer 40A and thus will not be described in detail.

The first coil 41A includes an elliptical, spiral first coil wiring 51, a first ground terminal (not shown), and a first signal terminal (not shown) opposite to the first ground terminal with respect to the first coil wiring 51.

The first signal terminal is electrically connected to the low-voltage circuit 20. More specifically, the first signal terminal is a portion leading from an innermost circumference 51*a* of the first coil wiring 51. The first signal terminal is electrically connected to the first electrode pad 81 corresponding to the first signal terminal of the first coil 41A by a first interconnect 131 (refer to FIG. 5) arranged in the transformer chip 80.

The first ground terminal is electrically connected to the ground of the low-voltage circuit 20 (refer to FIG. 1). More specifically, the first ground terminal is a portion leading from an outermost circumference 51*b* of the first coil wiring 51. Although not shown, the first ground terminal of the first coil 41A is connected to the first ground terminal of the first coil 41B in the transformer 40B and also connected to the first electrode pads 81 (not shown in FIG. 5) corresponding to the first ground terminals of the coils 41A and 41B.

The first coil wiring 51 is a wound portion of the wiring forming the first coil 41A. In the present embodiment, the first coil 41A is arranged so that the longitudinal direction of the first coil wiring 51 extends in the x-direction and that the lateral direction of the first coil wiring 51 extends in the y-direction. The shape of the first coil 41A in plan view described above refers to the shape of the first coil wiring 51 in plan view.

The second coil 42A includes an elliptical, spiral second coil wiring 52, a second ground terminal (not shown), and a second signal terminal (not shown) opposite to the second ground terminal with respect to the second coil wiring 52.

The second signal terminal is electrically connected to the high-voltage circuit 30. More specifically, the second signal terminal is a portion leading from an innermost circumference 52*a* of the second coil wiring 52. The second signal terminal is electrically connected to the second electrode pad 82 corresponding to the second signal terminal of the second coil 42A by a second interconnect 132 (refer to FIG. 5) arranged in the transformer chip 80.

The second ground terminal is electrically connected to the ground of the high-voltage circuit 30 (refer to FIG. 1). More specifically, the second ground terminal is a portion leading from an outermost circumference 52*b* of the second coil wiring 52. Although not shown, the second ground terminal of the second coil 42A is connected to the second ground terminal of the second coil 42B in the transformer 40B and also connected to the second electrode pads 82 (not shown in FIG. 5) corresponding to the second ground terminals of the coils 42A and 42B.

The second coil wiring 52 is a wound portion of the wiring forming the second coil 42A. In the present embodiment, the second coil 42A is arranged so that the longitudinal direction of the second coil wiring 52 extends in the x-direction and that the lateral direction of the second coil wiring 52 extends in the y-direction. The shape of the second coil 42A in plan view described above refers to the shape of the second coil wiring 52 in plan view.

As shown in FIG. 4, in plan view, the first coil 41A differs in size from the second coil 42A. More specifically, the first coil 41A is smaller in size than the second coil 42A. The size of the first coil 41A refers to the size of the first coil wiring 51 of the first coil 41A and is the length of a straight line L1 connecting two points of the outermost circumference 51*b* of the first coil wiring 51 in a direction orthogonal to the z-direction. The size of the second coil 42A refers to the size of the second coil wiring 52 of the second coil 42A and is the length of a straight line L2 connecting two points of the outermost circumference 52*b* of the second coil wiring 52 in a direction orthogonal to the z-direction. In the example shown, the straight lines L1 and L2 extend in the y-direction. The straight lines L1 and L2 may be any straight lines extending in the same direction. In an example, the straight lines L1 and L2 may extend in the x-direction.

In the present embodiment, in plan view, the innermost circumference 52*a* of the second coil 42A is larger than the outermost circumference 51*b* of the first coil 41A so that the second coil 42A surrounds the first coil 41A. More specifically, in plan view, the innermost circumference 52a of the second coil wiring 52 of the second coil 42A is located outward from the outermost circumference 51b of the first coil wiring 51 of the first coil 41A. In other words, the outermost circumference 51b of the first coil wiring 51 of the first coil 41A is located inward from the innermost circumference 52a of the second coil wiring 52 of the second coil 42A. The term "outward" refers to a direction extending away from the center of the first coil 41A and the center of the second coil 42A in plan view. The term "inward" refers to a direction extending toward the center of the first coil 41A and the center of the second coil 42A in plan view. In the present embodiment, in plan view, the innermost circumference 52a of the second coil wiring 52 is outwardly spaced apart from the outermost circumference 51b of the first coil wiring 51.

More specifically, in plan view, the innermost circumference 52a of the second coil wiring 52 of the second coil 42A is located outward from the outermost circumference 51b of the first coil wiring 51 of the first coil 41A along the entire circumference in the winding direction of the second coil wiring 52. In other words, the outermost circumference 51b of the first coil wiring 51 of the first coil 41A is located inward from the innermost circumference 52a of the second coil wiring 52 of the second coil 42A along the entire circumference in the winding direction of the first coil wiring 51.

As described above, in the present embodiment, in plan view, the first coil wiring 51 of the first coil 41A and the second coil wiring 52 of the second coil 42A are arranged to entirely avoid an overlap with each other. In other words, as shown in FIG. 5, the first coil 41A and the second coil 42A include non-overlapping portions 53 that do not overlap in plan view. In the present embodiment, the entirety of the first coil wiring 51 of the first coil 41A is the non-overlapping portion 53. The entirety of the second coil wiring 52 of the second coil 42A is the non-overlapping portion 53. Thus, the first coil 41A and the second coil 42A are arranged not to overlap each other in plan view.

As shown in FIGS. 3 to 5, in the present embodiment, the transformer chip 80 includes the dummy pattern 120 arranged around the second coils 42A and 42B of the two transformers 40A and the two transformers 40B.

As shown in FIG. 3, the dummy pattern 120 includes a first dummy pattern 121, a second dummy pattern 122, and a third dummy pattern 123. The dummy patterns 121 to 123 are formed from one or more materials selected from Ti, TiN, Au, Ag, Cu, Al, and W.

In plan view, among the two transformers 40A and the two transformers 40B, the first dummy pattern 121 is arranged between the transformer 40A and the transformer 40B that are adjacent to each other in the x-direction.

The first dummy pattern 121 is electrically connected to the second coil 42B. The first dummy pattern 121 may be electrically connected to the second coil 42A. In other words, the first dummy pattern 121 may be electrically connected to at least one of the second coils 42A and 42B. Thus, the first dummy pattern 121 has the same potential as the second coils 42A and 42B. Therefore, as the second reference potential of the second coils 42A and 42B changes, the voltage of the first dummy pattern 121 may become higher than that of the first coil 41B in the same manner as the second coil 42B. As shown in FIG. 4, the first dummy pattern 121 is patterned differently from the second coils 42A and 42B.

Although not shown, the first dummy pattern 121 is aligned with the second coils 42A and 42B in the z-direction. Thus, the first dummy pattern 121 is located farther away from the substrate 84 than the first coils 41A and 41B are. In other words, the dummy pattern 120 is arranged around coils of the two transformers 40A and the two transformers 40B located closer to the chip main surface 80s of the transformer chip 80.

When the first dummy pattern 121 and the second coils 42A and 42B have the same voltage, a voltage drop between the first dummy pattern 121 and the second coils 42A and 42B is limited. This limits concentration of an electric field on the second coils 42A and 42B.

As shown in FIG. 3, in plan view, the third dummy pattern 123 is formed to surround the second coils 42A and 42B of the two transformers 40A and the two transformers 40B. The third dummy pattern 123 is electrically connected to the first dummy pattern 121. Thus, in the third dummy pattern 123, similar to the first dummy pattern 121, as the second reference potential of the second coil 42B changes, the voltage of the third dummy pattern 123 may become higher than that of the first coil 41B.

As shown in FIG. 5, the third dummy pattern 123 is aligned with the second coil 42A in the z-direction. Although not shown, the third dummy pattern 123 is also aligned with the second coil 42B in the z-direction. Thus, the third dummy pattern 123 is located farther away from the substrate 84 than the first coils 41A and 41B are. In other words, the third dummy pattern 123 is located closer to the chip main surface 80s than the first coils 41A and 41B are.

When the third dummy pattern 123 and the second coils 42A and 42B have the same voltage, a voltage drop between the third dummy pattern 123 and the second coils 42A and 42B is limited. This limits concentration of an electric field on the second coils 42A and 42B.

The second dummy pattern 122 is arranged to surround the third dummy pattern 123 in plan view. The second dummy pattern 122 is independent of the second coils 42A and 42B. In other words, the second dummy pattern 122 is not electrically connected to the second coils 42A and 42B.

As shown in FIG. 5, the second dummy pattern 122 is aligned with the second coil 42A in the z-direction. Although not shown, the second dummy pattern 122 is also aligned with the second coil 42B in the z-direction. That is, the second dummy pattern 122 is located farther away from the substrate 84 than the first coils 41A and 41B are. As described above, the dummy patterns 121 to 123 are aligned with each other in the z-direction. The second dummy pattern 122 limits an increase in the electric field strength around the second coils 42A and 42B and also concentration of the electric field on the second electrode pad 82.

Operation of Gate Driver of Present Embodiment

Figure 6:
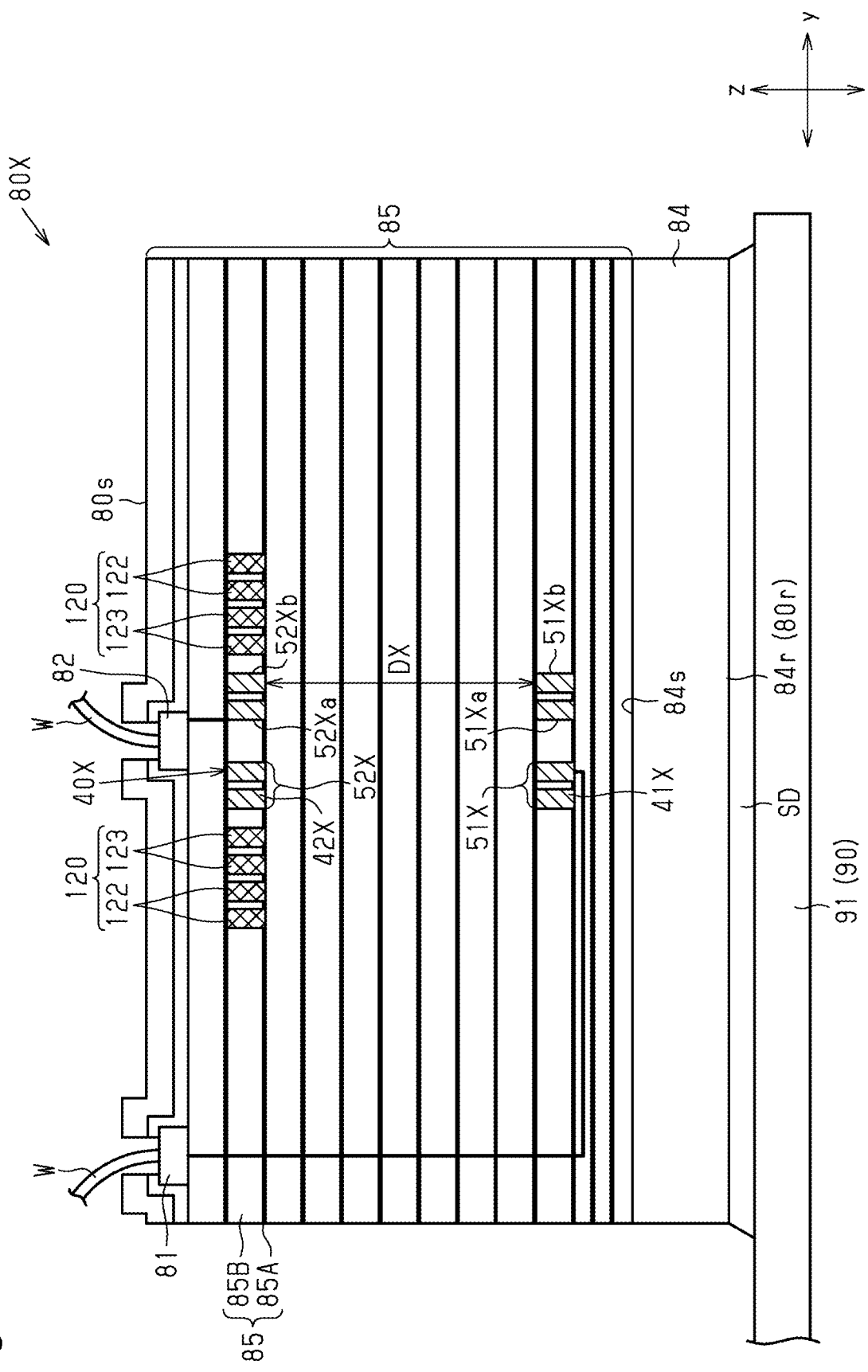
FIG. 6 is a schematic cross-sectional view of a transformer chip in a comparative example of a gate driver.

The operation of the gate driver 10 according to the present embodiment will now be described. FIG. 6 shows a cross-sectional structure of a comparative example of a transformer chip 80X. The transformer chip 80X of the comparative example differs from the transformer chip 80 of the present embodiment mainly in the arrangement of a first coil 41X and a second coil 42X of a transformer 40X.

More specifically, the first coil 41X includes a first coil wiring 51X, the second coil 42X includes a second coil wiring 52X, and the first coil wiring 51X is equal in size to the second coil wiring 52X. The first coil 41X is concentric with the second coil 42X. In plan view, the first coil 41X and the second coil 42X are arranged so that an innermost circumference 51Xa of the first coil wiring 51X overlaps an innermost circumference 52Xa of the second coil wiring 52X and that an outermost circumference 51Xb of the first coil wiring 51X overlaps an outermost circumference 52Xb of the second coil wiring 52X. That is, in plan view, the first coil 41X and the second coil 42X are arranged so that the entirety of the first coil wiring 51X overlaps the entirety of the second coil wiring 52X.

In the transformer chip 80X of the comparative example, the shortest distance DX between the first coil 41X and the second coil 42X is the length of the straight line in the z-direction between the first coil 41X and the second coil 42X in the z-direction. To increase the shortest distance DX, the first coil wiring 51X and the second coil wiring 52X need to be separated farther away from each other in the z-direction. In this case, the number of insulation layers 85 arranged between the first coil wiring 51X and the second coil wiring 52X need to be increased. This increases the total thickness of (dimension in the z-direction) of the insulation layers 85 stacked on the substrate 84. As a result, the insulation layers 85 stacked on the substrate 84 is prone to warpage. In addition, the increase in the number of insulation layers 85 increases the number of steps of manufacturing the transformer chip and results in an increase in manufacturing costs.

In the present embodiment, as shown in FIG. 5, in plan view, the innermost circumference 52a of the second coil wiring 52 of the second coil 42A is located outward from the outermost circumference 51b of the first coil wiring 51 of the first coil 41A. Thus, a shortest distance DA between the first coil 41A and the second coil 42A is the length of the straight line between the outermost circumference 51b of the first coil wiring 51 and the innermost circumference 52a of the second coil wiring 52. Since this straight line is inclined from the z-direction, the shortest distance DA is longer than the shortest distance DX.

As described above, even when the first coil 41A and the first coil 41X are arranged in the same insulation layer 85, and the second coil 42A and the second coil 42X are arranged in the same insulation layer 85, the shortest distance DA between the first coil 41A and the second coil 42A is longer than the shortest distance DX between the first coil 41X and the second coil 42X. Thus, the shortest distance DA between the first coil 41A and the second coil 42A is greater than the shortest distance DX with no increase in the total thickness of insulation layers 85 stacked on the substrate 84. In addition, since the number of insulation layers 85 is not increased, the number of steps of manufacturing the transformer chip 80 will not be increased. This avoids an increase in manufacturing costs.

Effects of Present Embodiment

The gate driver 10 of the present embodiment obtains the following advantages.

(1-1) The gate driver 10 includes the low-voltage circuit chip 60 including the low-voltage circuit 20 configured to be actuated by application of the first voltage V1, the high-voltage circuit chip 70 including the high-voltage circuit 30 configured to be actuated by application of the second voltage V2 being greater than the first voltage V1, and the transformer chip 80 connected between the low-voltage circuit chip 60 and the high-voltage circuit chip 70. The transformer chip 80 includes the insulation layers 85 and the first coil 41A (41B) and the second coil 42A (42B) embedded in the insulation layers 85 and opposed to each other in the z-direction. The first coil 41A (41B) and the second coil 42A (42B) include the non-overlapping portions 53 that do not overlap each other as viewed in the z-direction.

In this structure, the shortest distance DA between the first coil 41A (41B) and the second coil 42A (42B) is increased as compared to a structure in which the first coil 41X and the second coil 42X overlap each other as viewed in the z-direction as in the transformer chip 80X of the comparative example. Thus, the dielectric strength of the transformer 40 is improved without an increase in the thickness of the transformer chip 80, in other words, without an increase in the number of insulation layers 85.

In addition, formation of the non-overlapping portions 53 decreases the area in which the first coil 41A (41B) and the second coil 42A (42B) are opposed to each other in the z-direction as compared to a structure in which the first coil 41X and the second coil 42X entirely overlap each other in plan view as in the transformer chip 80X of the comparative example shown in FIG. 6. Thus, the capacitive component between the first coil 41A (41B) and the second coil 42A (42B) is reduced. In addition, a path that short-circuits the first coil 41A and the second coil 42A is less likely to be formed between the first coil 41A and the second coil 42A. Thus, the dielectric strength of the transformer chip 80 is improved.

(1-2) The first coil wiring 51 of the first coil 41A (41B) and the second coil wiring 52 of the second coil 42A (42B) are entirely the non-overlapping portions 53.

In this structure, the shortest distance DA between the first coil 41A (41B) and the second coil 42A (42B) is the distance between the outermost circumference 51b of the first coil wiring 51 of the first coil 41A (41B) and the innermost circumference 52a of the second coil wiring 52 of the second coil 42A (42B). Thus, the shortest distance DA is longer than that in a structure in which the first coil wiring 51 of the first coil 41A (41B) and the second coil wiring 52 of the second coil 42A (42B) at least partially overlap each other.

In addition, as compared to a structure in which the first coil 41A (41B) is opposed to the second coil 42A (42B), the capacitive component, caused by the opposing area, between the first coil 41A (41B) and the second coil 42A (42B) is reduced since the first coil 41A (41B) is not opposed to the second coil 42A (42B) in the z-direction. In addition, a path that short-circuits the first coil 41A and the second coil 42A is even less likely to be formed between the first coil 41A and the second coil 42A. Thus, the dielectric strength of the transformer chip 80 is further improved.

(1-3) The first coil 41A (41B) is a transmission coil that transmits a signal. The second coil 42A (42B) is a reception coil that receives a signal from the first coil 41A (41B). The first coil 41A (41B) is spiral (for example, elliptical and spiral). The second coil 42A (42B) is spiral (for example, elliptical and spiral) and has the innermost circumference 52a greater than the outermost circumference 51b of the first coil 41A (41B) so that the second coil 42A (42B) surrounds the first coil 41A (41B).

This structure allows a magnetic flux generated in the first coil 41A (41B), that is, the transmission coil, to readily pass through the second coil wiring 52 of the second coil 42A (42B). This reduces leakage of the magnetic flux between the first coil 41A (41B) and the second coil 42A (42B), thereby increasing the coupling coefficient. As a result, a signal is readily transmitted from the first coil 41A (41B) to the second coil 42A (42B).

(1-4) The first electrode pads 81, which are electrically connected to the first coil 41A (41B), are arranged on the chip main surface 80s of the transformer chip 80 near the low-voltage circuit chip 60. The second electrode pads 82, which are electrically connected to the second coil 42A (42B), are arranged on the chip main surface 80s near the high-voltage circuit chip 70.

In this structure, wires W that separately connect the first electrode pads 81 to the second electrode pads 62 of the low-voltage circuit chip 60 may be shortened. Also, wires W that separately connect the second electrode pads 82 to the first electrode pads 71 of the high-voltage circuit chip 70 may be shortened. Accordingly, inductance caused by the length of the wires W is reduced.

Second Embodiment

A second embodiment of a gate driver 10 will be described with reference to FIGS. 7 to 10. The gate driver 10 of the present embodiment differs from the gate driver 10 of the first embodiment mainly in the number of transformers that are connected in series. In the following description, the differences from the first embodiment will be described. The same reference characters are given to those components that are the same as the corresponding components of the gate driver 10 of the first embodiment. Such components will not be described in detail.

Figure 7:
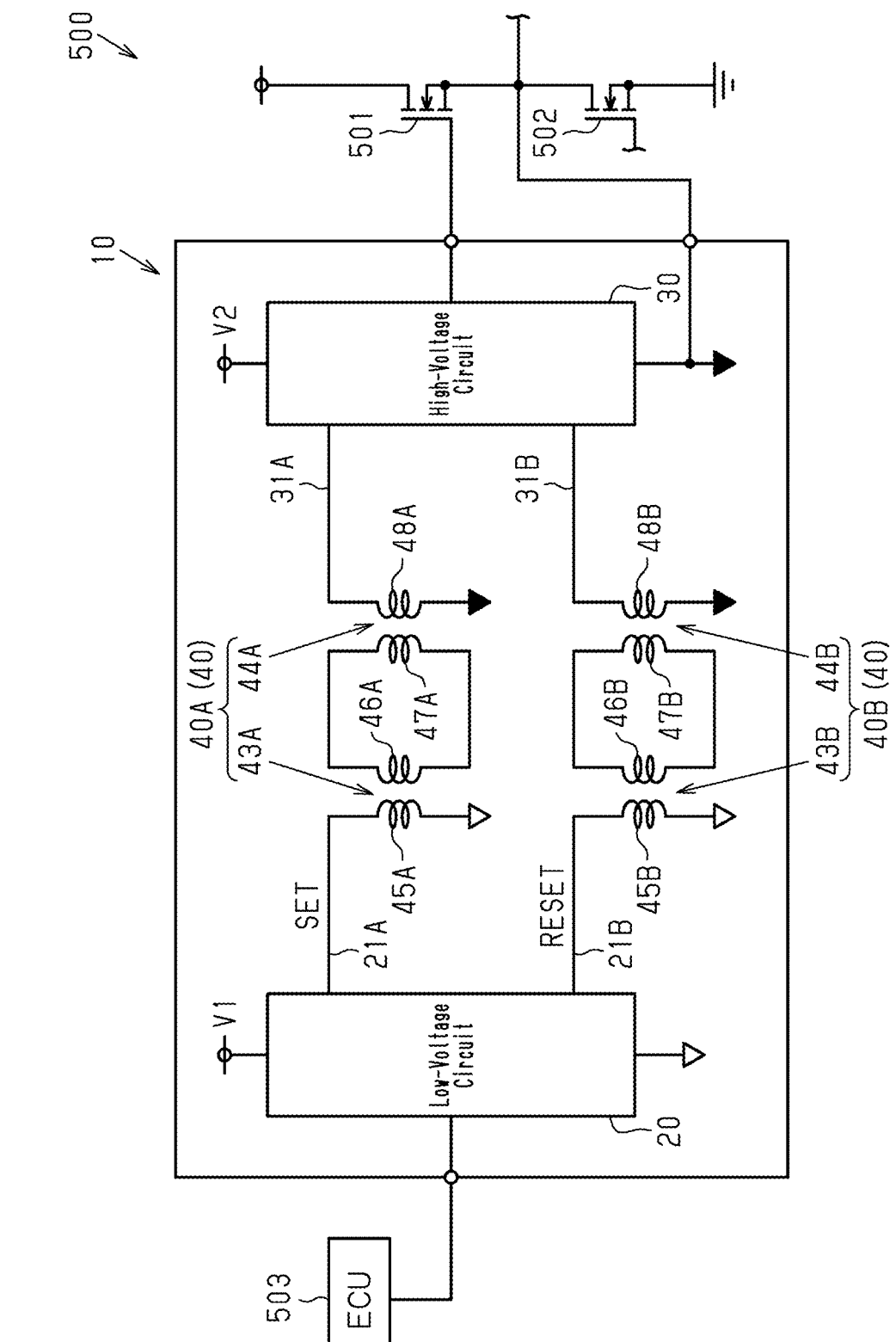
FIG. 7 is a schematic circuit diagram showing a second embodiment of a gate driver.

As shown in FIG. 7, the gate driver 10 of the present embodiment includes multiple transformers having a double insulation structure. More specifically, the transformer 40A includes a first transformer 43A and a second transformer 44A connected in series to each other. The transformer 40B includes a first transformer 43B and a second transformer 44B connected in series. As described above, each of the transformers 40A and 40B has a double insulation structure. Thus, the insulation voltage of the gate driver 10 is greater than that in the first embodiment and is, for example, approximately 7500 Vrms.

The first transformer 43A is electrically connected to the low-voltage circuit 20. The first transformer 43A includes a first coil 45A and a second coil 46A that is insulated from and configured to be magnetically coupled to the first coil 45A.

The second transformer 44A is electrically connected to the high-voltage circuit 30. The second transformer 44A connects the first transformer 43A and the high-voltage circuit 30. The second transformer 44A includes a first coil 47A and a second coil 48A that is insulated from and configured to be magnetically coupled to the first coil 47A.

The first coil 45A is electrically connected to the low-voltage circuit 20 by the low-voltage signal line 21A and is also connected to the ground of the low-voltage circuit 20. More specifically, the first coil 45A includes a first end electrically connected to the low-voltage circuit 20 and a second end electrically connected to the ground of the low-voltage circuit 20. Thus, the potential of the second end of the first coil 45A equals the first reference potential. The first reference potential is, for example, 0 V.

The second coil 46A is connected to the first coil 47A of the second transformer 44A. In an example, the second coil 46A and the first coil 47A are connected to each other so as to be electrically floating. More specifically, the second coil 46A includes a first end connected to a first end of the first coil 47A and a second end connected to a second end of the first coil 47A. Thus, the second coil 46A and the first coil 47A serve as relay coils that relay transmission of a set signal from the first coil 45A to the second coil 48A.

The second coil 48A is electrically connected to the high-voltage circuit 30 by the high-voltage signal line 31A and is also connected to the ground of the high-voltage circuit More specifically, the second coil 48A includes a first end connected to the high-voltage circuit 30 and a second end connected to the ground of the high-voltage circuit 30. Thus, the potential of the second end of the second coil 48A equals the second reference potential. The second reference potential varies as the inverter device 500 is driven and may become, for example, greater than or equal to 600 V.

The coils 45A and 46A of the first transformer 43A and the coils 47A and 48A of the second transformer 44A are each elliptical and spiral in plan view as in the first embodiment. The winding direction of the coils 45A and 46A of the first transformer 43A is opposite to the winding direction of the coils 47A and 48A of the second transformer 44A. The winding direction of each of the coils 45A, 46A, 47A, and 48A may be changed in any manner. In an example, the winding direction of the coils 45A and 46A may be the same as the winding direction of the coils 47A and 48A.

The first transformer 43B of the transformer 40B includes a first coil 45B electrically connected to the low-voltage circuit 20 and a second coil 46B insulated from and configured to be magnetically coupled to the first coil 45B.

The second transformer 44B of the transformer 40B includes a first coil 47B electrically connected to the high-voltage circuit 30 and a second coil 48B insulated from and configured to be magnetically coupled to the first coil 47B. The transformer 40B is the same as the transformer 40A and thus will not be described in detail.

Thus, in the first transformer 43A, the first coil 45A corresponds to a transmission coil that transmits a set signal to the second coil 46A. The second coil 46A corresponds to a reception coil that receives the set signal from the first coil 45A. In the second transformer 44A, the first coil 47A corresponds to a transmission coil that transmits a set signal to the second coil 48A. The second coil 48A corresponds to a reception coil that receives the set signal from the first coil 47A. In the first transformer 43B, the first coil 45B corresponds to a transmission coil that transmits a reset signal to the second coil 46B. The second coil 46B corresponds to a reception coil that receives the reset signal from the first coil 45B. In the second transformer 44B, the first coil 47B corresponds to a transmission coil that transmits a reset signal to the second coil 48B. The second coil 48B corresponds to a reception coil that receives the reset signal from the first coil 47B.

Figure 8:
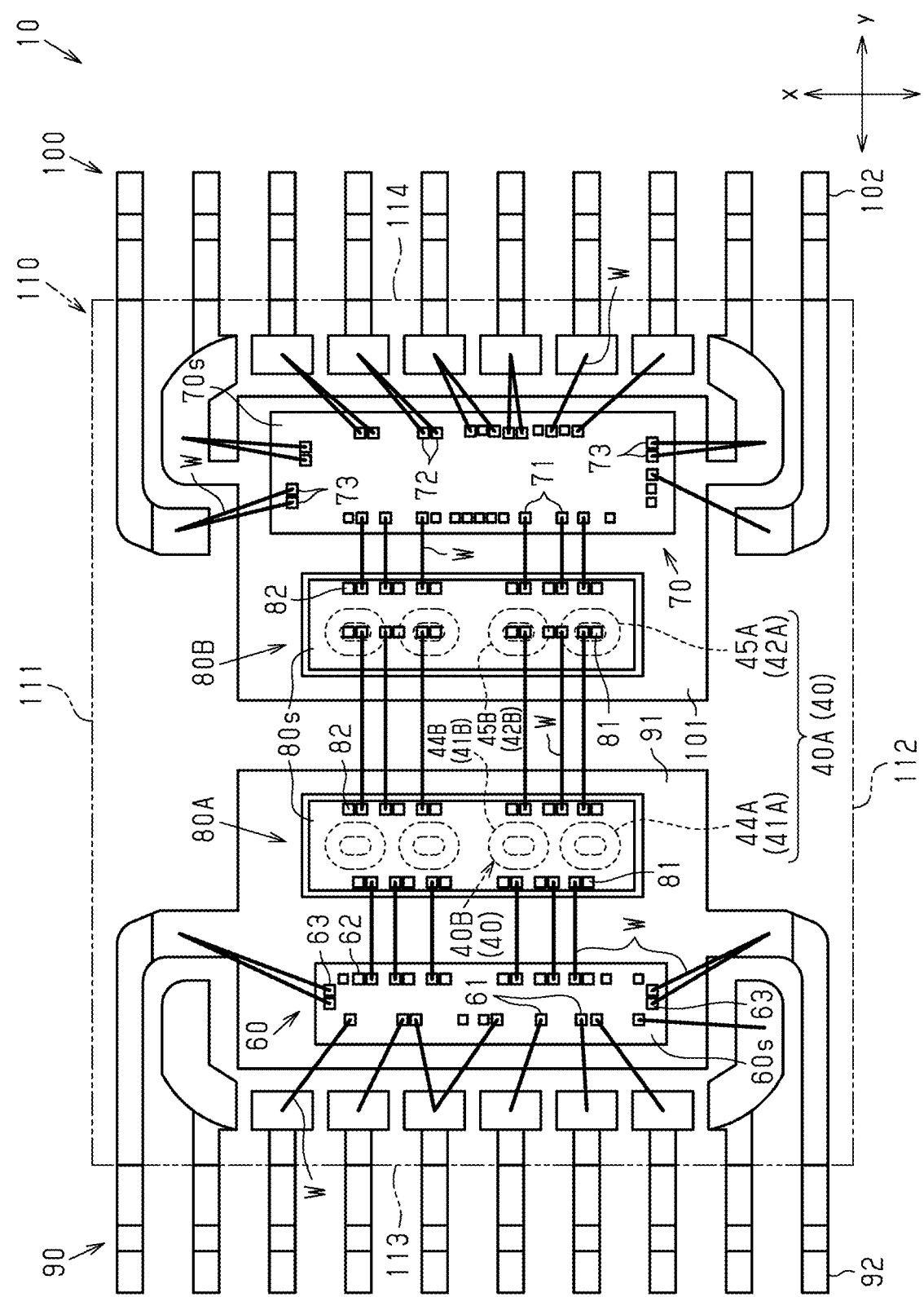
FIG. 8 is a plan view showing an internal structure of the gate driver of the second embodiment.

FIG. 8 shows an example of a plan view showing the internal structure of the gate driver 10. FIG. 7 shows a simplified circuit configuration of the gate driver 10. Hence, the number of external terminals of the gate driver 10 shown in FIG. 8 is greater than the number of external terminals of the gate driver 10 shown in FIG. 7. The number of external terminals of the gate driver 10 is the number of external electrodes configured to connect the gate driver 10 to electronic components arranged outside the gate driver 10, such as the ECU 503 and the switching element 501 (refer to FIG. 7). The number of signal lines (the number of wires W described later) that transmit a signal from the low-voltage circuit 20 to the high-voltage circuit 30 in the gate driver 10 shown in FIG. 8 is greater than the number of signal lines in the gate driver 10 shown in FIG. 7.

As shown in FIG. 8, the gate driver 10 includes a first transformer chip 80A and a second transformer chip 80B instead of the transformer chip 80 of the first embodiment. More specifically, the gate driver 10 includes the low-voltage circuit chip 60, the high-voltage circuit chip 70, a first transformer chip 80A, and a second transformer chip 80B. The low-voltage circuit chip 60, the high-voltage circuit chip 70, the first transformer chip 80A, and the second transformer chip 80B are spaced apart from each other in the y-direction. In other words, the chips 60, 70, 80A, and 80B are arranged in the arrangement direction of the low-voltage die pad 91 and the high-voltage die pad 101.

The low-voltage circuit chip 60, the first transformer chip 80A, the second transformer chip 80B, and the high-voltage circuit chip 70 are arranged in this order from the low-voltage leads 92 toward the high-voltage leads 102 in the y-direction. In other words, in plan view, the transformer chips 80A and 80B are arranged between the low-voltage circuit chip 60 and the high-voltage circuit chip 70.

In the present embodiment, the low-voltage circuit chip 60 and the first transformer chip 80A are mounted on the low-voltage die pad 91 of the low-voltage lead frame 90. The high-voltage circuit chip 70 and the second transformer chip 80B are mounted on the high-voltage die pad 101 of the high-voltage lead frame 100.

The first transformer chip 80A includes the first transformer 43A of the transformer 40A and the first transformer 43B of the transformer 40B. More specifically, the transformers 43A and 43B are arranged into a single package. Thus, the first transformer chip 80A includes transformers of the transformers 40A and 40B that are located closer to the low-voltage circuit 20 than to the high-voltage circuit 30 in the circuitry.

The second transformer chip 80B includes the second transformer 44A of the transformer 40A and the second transformer 44B of the transformer 40B. More specifically, the transformers 44A and 44B are arranged into a single package. Thus, the second transformer chip 80B includes ones of the transformers 40A and 40B that are located closer to the high-voltage circuit 30 than to the low-voltage circuit 20 in the circuitry.

In the present embodiment, the first transformer chip 80A has the same structure as the transformer chip 80 of the first embodiment. The second transformer chip 80B differs from the transformer chip 80 of the first embodiment in the arrangement of the coils 47A, 47B, 48A, and 48B and arrangement of the coils 47A, 47B, 48A, and 48B with respect to the electrode pads 81 and 82.

More specifically, the first electrode pads 81 of the second transformer chip 80B are arranged near the center of the chip main surface 80s of the second transformer chip 80B in the y-direction. The second electrode pads 82 of the second transformer chip 80B are arranged on one of opposite ends of the chip main surface 80s of the second transformer chip 80B in the y-direction located closer to the high-voltage circuit chip 70.

Although not shown, in the second transformer chip 80B, the first coils 47A and 47B are arranged farther away from the substrate 84 than the second coils 48A and 48B are. In other words, the second coils 48A and 48B are arranged closer to the substrate 84 than the first coils 47A and 47B are. The first coils 47A and 47B are separately electrically connected to the first electrode pads 81 of the second transformer chip 80B. The second coils 48A and 48B are separately electrically connected to the second electrode pads 82 of the second transformer chip 80B.

The low-voltage circuit chip 60 and the first transformer chip 80A are connected by wires W. More specifically, the second electrode pads 62 of the low-voltage circuit chip 60 and the first electrode pads 81 of the first transformer chip 80A are connected by the wires W. Thus, the low-voltage circuit 20 is electrically connected to the first coil 45A (refer to FIG. 7) of the first transformer 43A, and the low-voltage circuit 20 is electrically connected to the first coil 45B (refer to FIG. 7) of the first transformer 43B.

The first transformer chip 80A and the second transformer chip 80B are connected by wires W. More specifically, the second electrode pads 82 of the first transformer chip 80A and the first electrode pads 81 of the second transformer chip 80B are connected by the wires W. Thus, the second coil 46A of the first transformer 43A is electrically connected to the first coil 47A of the second transformer 44A, and the second coil 46B of the first transformer 43B is electrically connected to the first coil 47B of the second transformer 44B.

The second transformer chip 80B and the high-voltage circuit chip 70 are connected by wires W. More specifically, the second electrode pads 82 of the second transformer chip 80B and the first electrode pads 71 of the high-voltage circuit chip 70 are connected by the wires W. Thus, the second coil 48A (refer to FIG. 7) of the second transformer 44A is electrically connected to the high-voltage circuit 30, and the second coil 48B (refer to FIG. 7) of the second transformer 44B is electrically connected to the high-voltage circuit 30.

Figure 9:
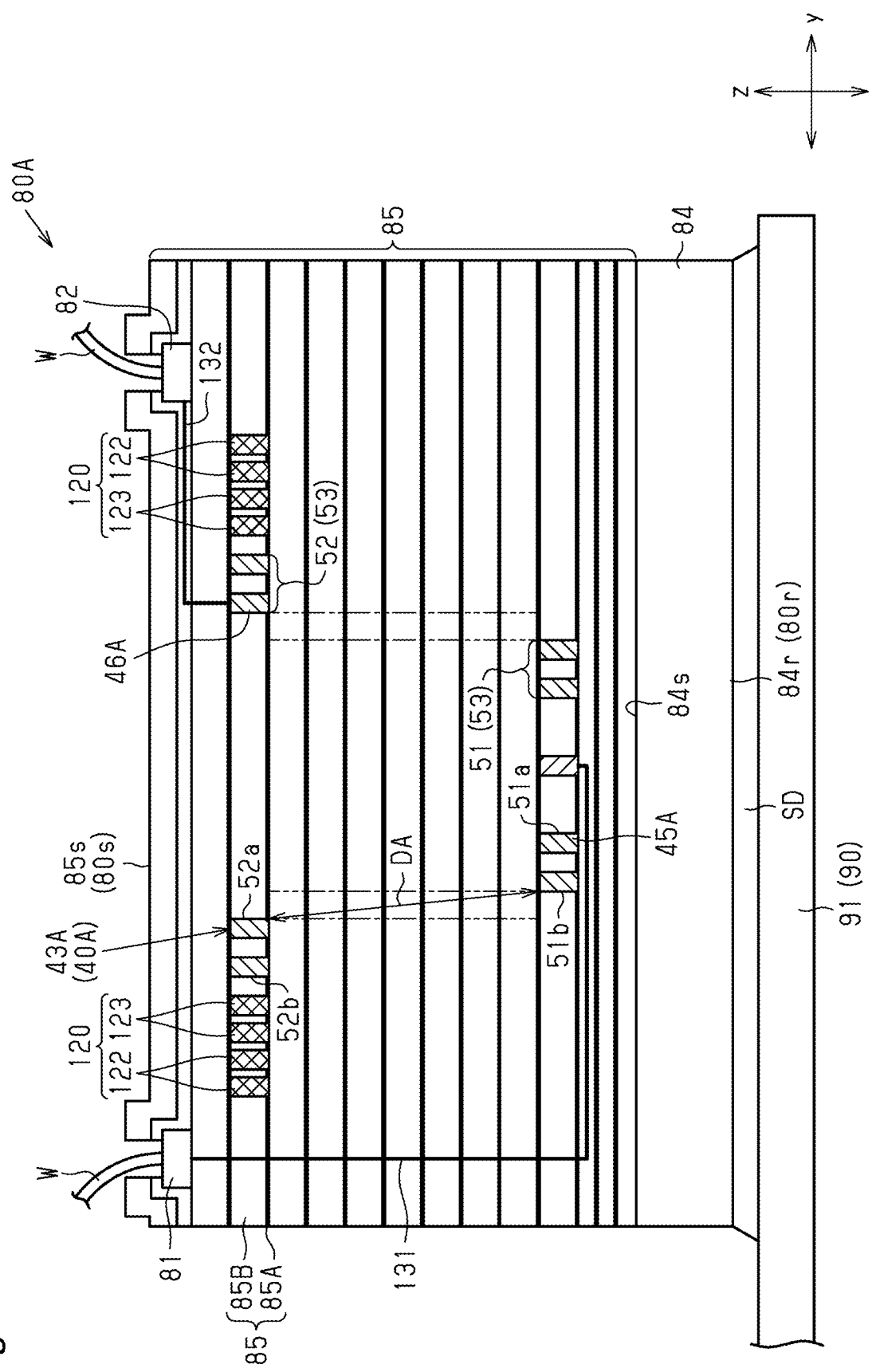
FIG. 9 is a schematic cross-sectional view of a first transformer chip in the gate driver shown in FIG. 8.
Figure 10:
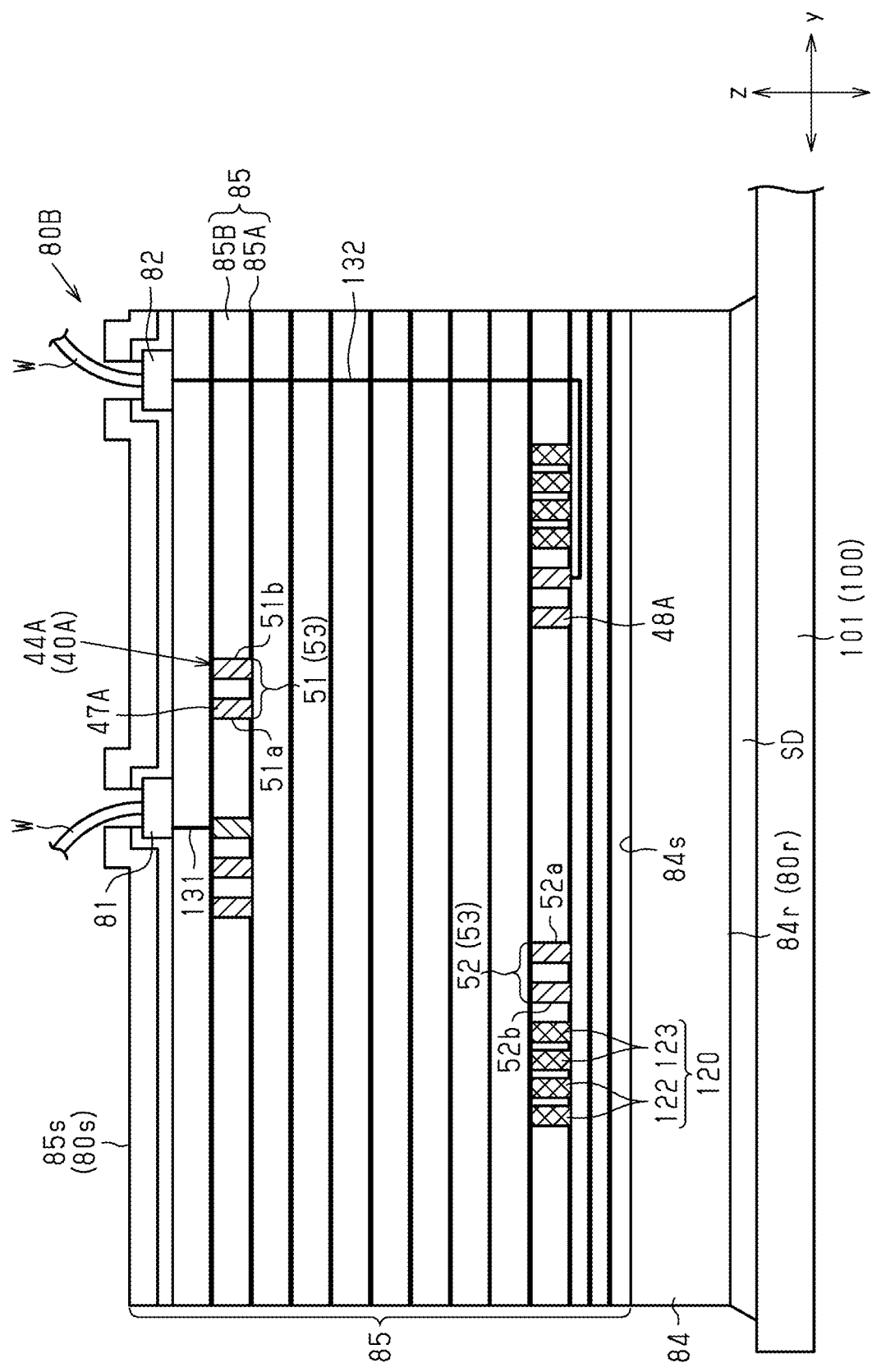
FIG. 10 is a schematic cross-sectional view of a second transformer chip in the gate driver shown in FIG. 8.

FIG. 9 shows a schematic cross-sectional structure of the first transformer chip 80A. FIG. 10 shows a schematic cross-sectional structure of the second transformer chip 80B. More specifically, FIG. 9 is a schematic cross-sectional view near the first coil 45A and the second coil 46A taken along a plane extending in the y-direction and the z-direction. FIG. 10 is a schematic cross-sectional view near the first coil 47A and the second coil 48A taken along a plane extending in the y-direction and the z-direction.

As shown in FIG. 9, the arrangement of the first coil 45A and the second coil 46A in the first transformer chip 80A is the same as that of the first coil 41A and the second coil 42A in the transformer chip 80 of the first embodiment. That is, the first coil 45A corresponds to the first coil 41A, and the second coil 46A corresponds to the second coil 42A. The first coil 45A is arranged farther away from the substrate 84 than the second coil 46A is. The first coil 45A is identical in shape and size in plan view to the first coil 41A. The second coil 46A is identical in shape and size in plan view to the second coil 42A. Therefore, the first coil 45A and the second coil 46A have the non-overlapping portions 53 in the same manner as the first coil 41A and the second coil 42A of the first embodiment.

The first transformer chip 80A includes a dummy pattern 120 in the same manner as the transformer chip 80. The dummy pattern 120 is arranged around the second coil 46A. In other words, the dummy pattern 120 is arranged around the second coil 42A, which is a coil located near the chip main surface 80s of the first transformer chip 80A.

As shown in FIG. 10, in the second transformer chip 80B, the first coil 47A is arranged farther away from the substrate 84 than the second coil 48A is. As described above, the arrangement of the first coil 47A and the second coil 48A is the same as that of the first coil 41A and the second coil 42A of the transformer chip 80 in the first embodiment when the first coil 41A and the second coil 42A are switched positions. Hence, although the positional relationship of the first coil and the second coil differs, the first coil 47A corresponds to the first coil 41A, and the second coil 48A corresponds to the second coil 42A. The first coil 47A is identical in shape and size in plan view to the first coil 41A. The second coil 48A is identical in shape and size in plan view to the second coil 42A. Therefore, the first coil wiring 51 of the first coil 47A, which is arranged farther away from the substrate 84 than the second coil 48A, is smaller in size than the second coil wiring 52 of the second coil 48A. In other words, the second coil wiring 52 of the second coil 48A, which is arranged closer to the substrate 84 than the first coil 47A, is larger in size than the first coil wiring 51 of the first coil 47A. Therefore, the first coil 47A and the second coil 48A have the non-overlapping portions 53 in the same manner as the first coil 41A and the second coil 42A of the first embodiment.

The second transformer chip 80B includes a dummy pattern 120 in the same manner as the transformer chip 80. The dummy pattern 120 is arranged around the second coil 48A. In other words, the dummy pattern 120 is arranged around the second coil 48A, which is a coil located near the chip back surface 80r of the second transformer chip 80B.

Advantages of Second Embodiment

The gate driver 10 of the present embodiment obtains the following advantages in addition to the advantages of the first embodiment.

(2-1) The transformer 40A includes the first transformer 43A and the second transformer 44A connected in series. The transformer 40B includes the first transformer 43B and the second transformer 44B connected in series. With this structure, the first transformer 43A and the second transformer 44A form a double insulation structure between the low-voltage circuit 20 and the high-voltage circuit 30 in the signal line that transmits the set signal. The first transformer 43B and the second transformer 44B form a double insulation structure between the low-voltage circuit 20 and the high-voltage circuit 30 in the signal line that transmits the reset signal. This improves the dielectric strength of the gate driver 10.

Third Embodiment

A third embodiment of a gate driver 10 will be described with reference to FIGS. 11 and 12. The gate driver 10 of the present embodiment differs from the gate driver 10 of the first embodiment mainly in that the gate driver 10 of the present embodiment includes a plurality of packages. In the following description, the differences from the first embodiment will be described. The same reference characters are given to those components that are the same as the corresponding components of the gate driver 10 of the first embodiment. Such components will not be described in detail.

Figure 11:
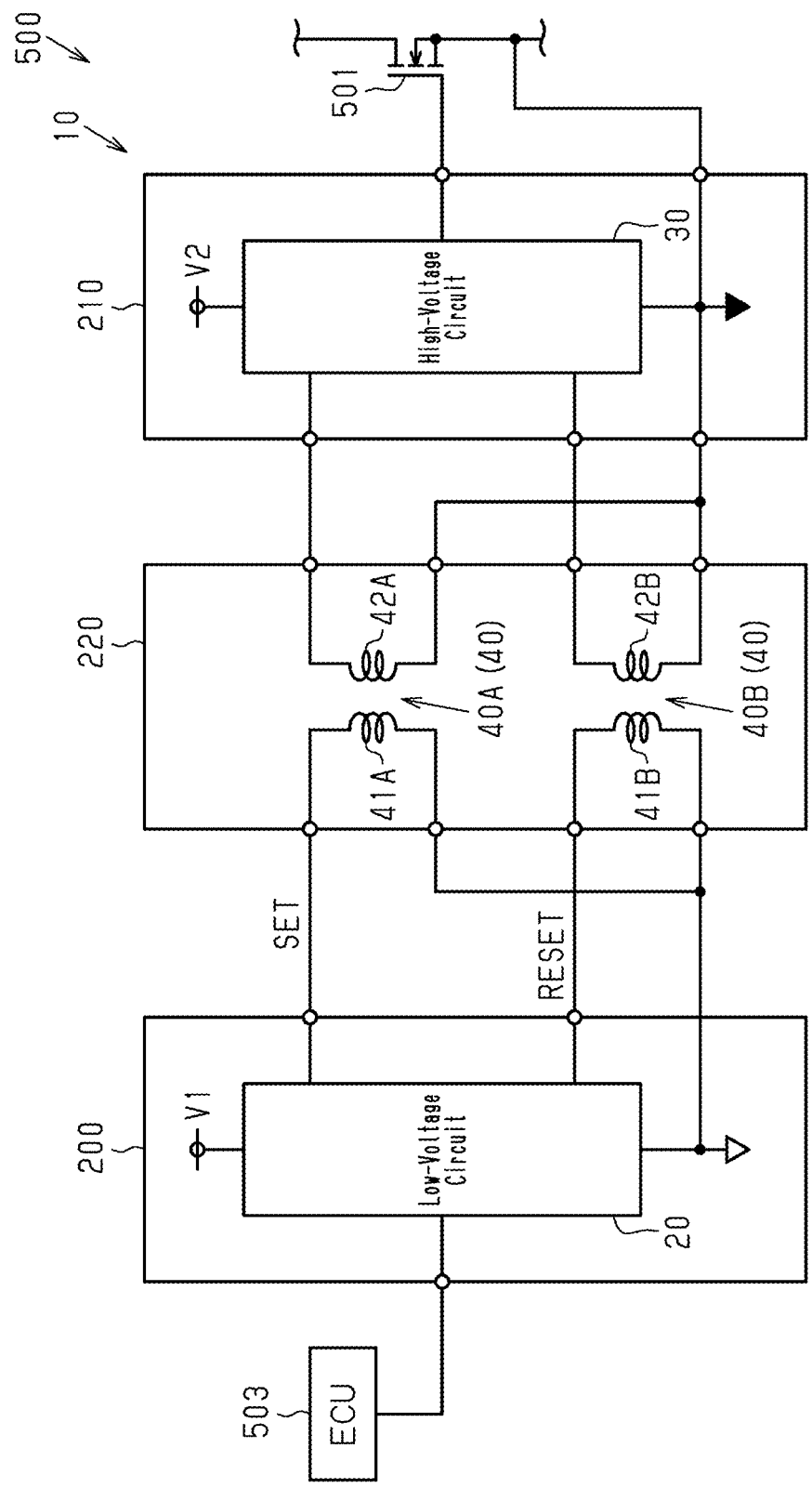
FIG. 11 is a schematic circuit diagram showing a third embodiment of a gate driver.

As shown in FIG. 11, the gate driver 10 of the present embodiment has the same circuit configuration as the gate driver 10 of the first embodiment. The gate driver 10 includes a low-voltage circuit module 200, a high-voltage circuit module 210, and an isolation module 220.

The low-voltage circuit module 200 includes a low-voltage circuit 20. In an example, although not shown, the low-voltage circuit module 200 includes a low-voltage circuit chip including the low-voltage circuit 20, a low-voltage lead frame including a low-voltage die pad on which the low-voltage circuit chip is mounted, and an encapsulation resin encapsulating a part of the low-voltage lead frame and the low-voltage circuit chip.

The high-voltage circuit module 210 includes a high-voltage circuit 30. In an example, although not shown, the high-voltage circuit module 210 includes a high-voltage circuit chip including the high-voltage circuit 30, a high-voltage lead frame including a high-voltage die pad on which the high-voltage circuit chip is mounted, and an encapsulation resin encapsulating a part of the high-voltage lead frame and the high-voltage circuit chip.

The isolation module 220 insulates the low-voltage circuit 20 from the high-voltage circuit 30 while allowing transmission of the set signal and the reset signal from the low-voltage circuit 20 to the high-voltage circuit 30. That is, the isolation module 220 is used to insulate the low-voltage circuit 20 and the high-voltage circuit 30 included in the gate driver 10. The isolation module 220 includes transformers 40. In the same manner as the first embodiment, the transformers 40 are used to transmit signals (set signal and reset signal) between the low-voltage circuit 20 and the high-voltage circuit 30. As shown in FIG. 11, the isolation module 220 is arranged between the low-voltage circuit 20 and the high-voltage circuit 30 in the circuitry. Thus, the low-voltage circuit 20 and the high-voltage circuit 30 are configured to be connected by the transformers 40.

Figure 12:
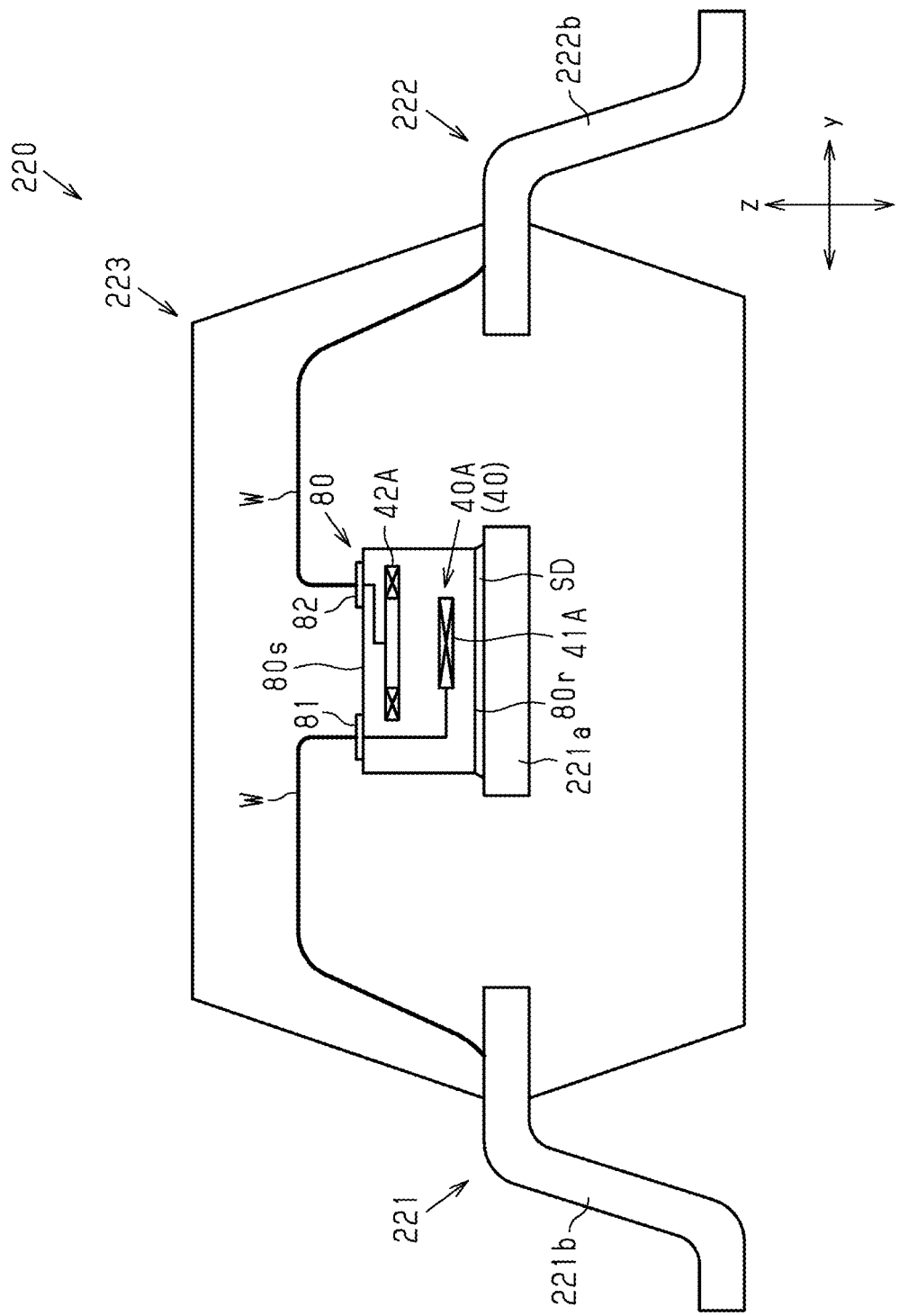
FIG. 12 is a schematic cross-sectional view of an isolation module in the gate driver according to the third embodiment.

FIG. 12 shows an example of a schematic cross-sectional structure of the isolation module 220. As shown in FIG. 12, the isolation module 220 includes a transformer chip 80, a low-voltage lead frame 221, a high-voltage lead frame 222, and an encapsulation resin 223 that encapsulates the transformer chip 80 and a part of each of the lead frames 221 and 222.

The lead frames 221 and 222 are formed from a conductor and, in the present embodiment, are formed from Cu. The lead frames 221 and 222 extend from the inside to the outside of the encapsulation resin 223.

The low-voltage lead frame 221 is electrically connected to the low-voltage circuit (refer to FIG. 11) and includes a low-voltage die pad 221a arranged in the encapsulation resin 223 and a plurality of low-voltage leads 221b extending from the inside to the outside of the encapsulation resin 223. In the present embodiment, the transformer chip 80 is mounted on the low-voltage die pad 221a. Each of the low-voltage leads 221b includes an external terminal electrically connected to the low-voltage circuit 20.

The high-voltage lead frame 222 is electrically connected to the high-voltage circuit 30 (refer to FIG. 11) and includes a plurality of high-voltage leads 222b extending from the inside to the outside of the encapsulation resin 223. Each of the high-voltage leads 222b includes an external terminal electrically connected to the high-voltage circuit 30.

In the gate driver 10, the first coils 41A and 41B (refer to FIG. 11) of the transformers 40A and 40B are electrically connected to the low-voltage circuit 20 and are connected to the ground of the low-voltage circuit 20. More specifically, each of the first coils 41A and 41B includes a first end electrically connected to the low-voltage circuit 20 and a second end connected to the ground of the low-voltage circuit 20.

The first electrode pad 81 of the transformer chip 80 is connected to one of the low-voltage leads 221b by a wire W. Thus, the first coil 41A of the transformer 40A is electrically connected to the low-voltage lead 221b. Although not shown, the first coil 41B of the transformer 40B is electrically connected to another one of the low-voltage leads 221b. Although not shown, the first coils 41A and 41B of the transformers 40A and 40B are connected by wires W to the low-voltage leads 221b integrated with the low-voltage die pad 221a.

In the gate driver 10, the second coils 42A and 42B (refer to FIG. 11) of the transformers 40A and 40B are electrically connected to the high-voltage circuit 30 and are also connected to the ground of the high-voltage circuit 30. More specifically, the first ends of the second coils 42A and 42B are electrically connected to the high-voltage circuit 30, and the second ends of the second coils 42A and 42B are connected to the ground of the high-voltage circuit 30.

The second electrode pad 82 of the transformer chip 80 is connected to one of the high-voltage leads 222b by a wire W. This electrically connects the second coil 42A of the transformer 40A and the high-voltage lead 222b. Although not shown, the second coil 42B of the transformer 40B is electrically connected to another one of the high-voltage leads 222b. Also, although not shown, the second coils 42A and 42B of the transformers 40A and 40B are connected by wires W to the high-voltage leads 222b, which are electrically connected to the ground of the high-voltage circuit 30.

Advantage of Third Embodiment

The gate driver 10 of the present embodiment obtains the following advantages in addition to the advantages of the first embodiment.

(3-1) The transformers 40 are included in the isolation module 220, which is a semiconductor module differing from the low-voltage circuit module 200 and the high-voltage circuit module 210.

This structure allows the common isolation module 220 to be used for the low-voltage circuit module 200 and high-voltage circuit module 210, which differ from each other. This reduces the costs for manufacturing different types of gate drivers that differ in at least one of the low-voltage circuit module 200 and the high-voltage circuit module 210.

Fourth Embodiment

A fourth embodiment of a gate driver 10 will be described with reference to FIGS. 13 and 14. The gate driver 10 of the present embodiment differs from the gate driver 10 of the first embodiment mainly in that the gate driver 10 of the present embodiment includes a plurality of packages. In the following description, the differences from the first embodiment will be described. The same reference characters are given to those components that are the same as the corresponding components of the gate driver 10 of the first embodiment. Such components will not be described in detail.

Figure 13:
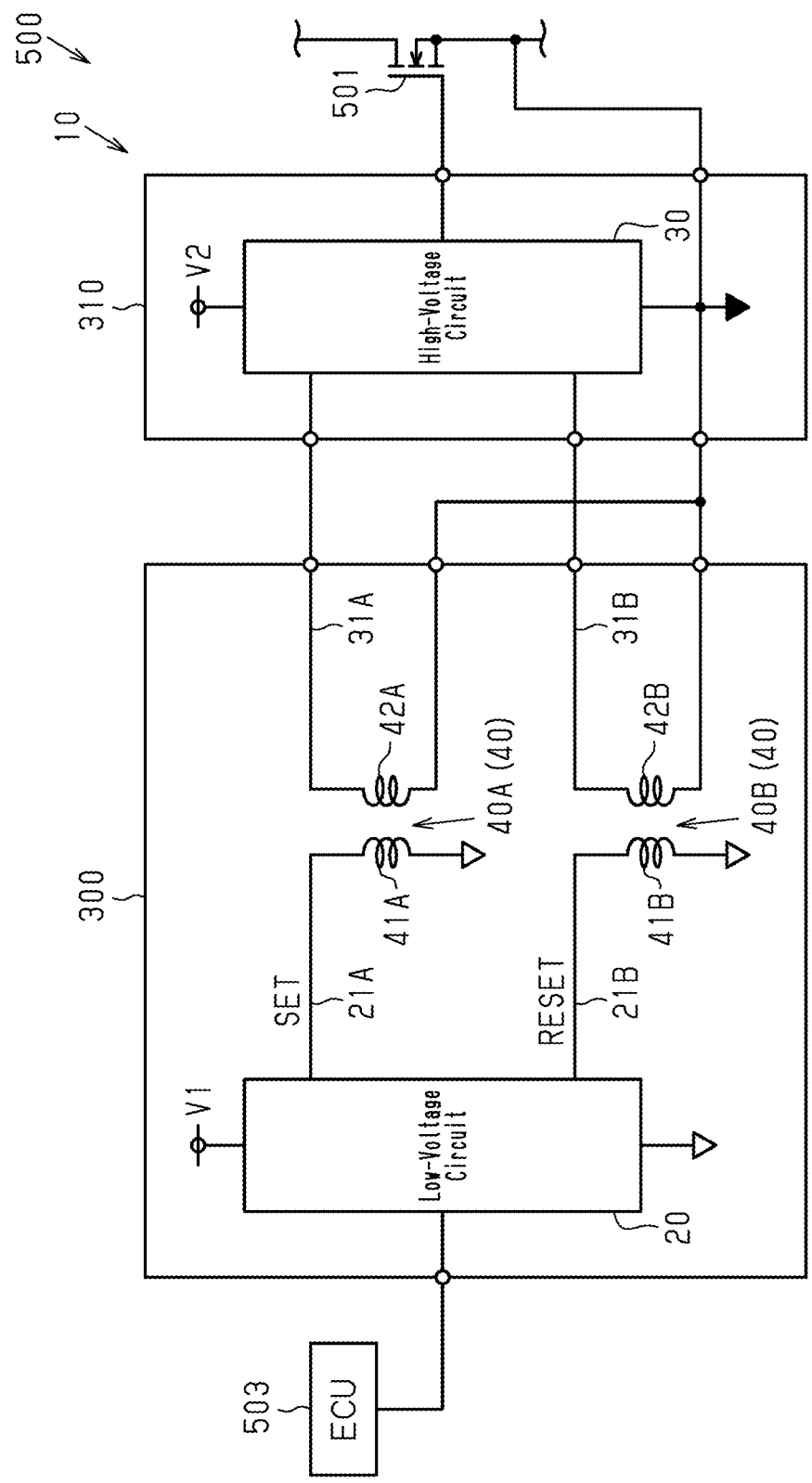
FIG. 13 is a schematic circuit diagram showing a fourth embodiment of a gate driver.

As shown in FIG. 13, the gate driver 10 of the present embodiment has the same circuit configuration as the gate driver 10 of the first embodiment. The gate driver 10 includes a low-voltage circuit unit 300 and a high-voltage circuit module 310. The high-voltage circuit module 310 has the same structure as the high-voltage circuit module 210 (refer to FIG. 11) of the third embodiment. The low-voltage circuit unit 300 corresponds to "isolation module."

The low-voltage circuit unit 300 includes a low-voltage circuit 20 and transformers 40. The low-voltage circuit unit 300 insulates the low-voltage circuit 20 from the high-voltage circuit 30 while allowing transmission of the set signal and the reset signal from the low-voltage circuit 20 to the high-voltage circuit 30.

Figure 14:
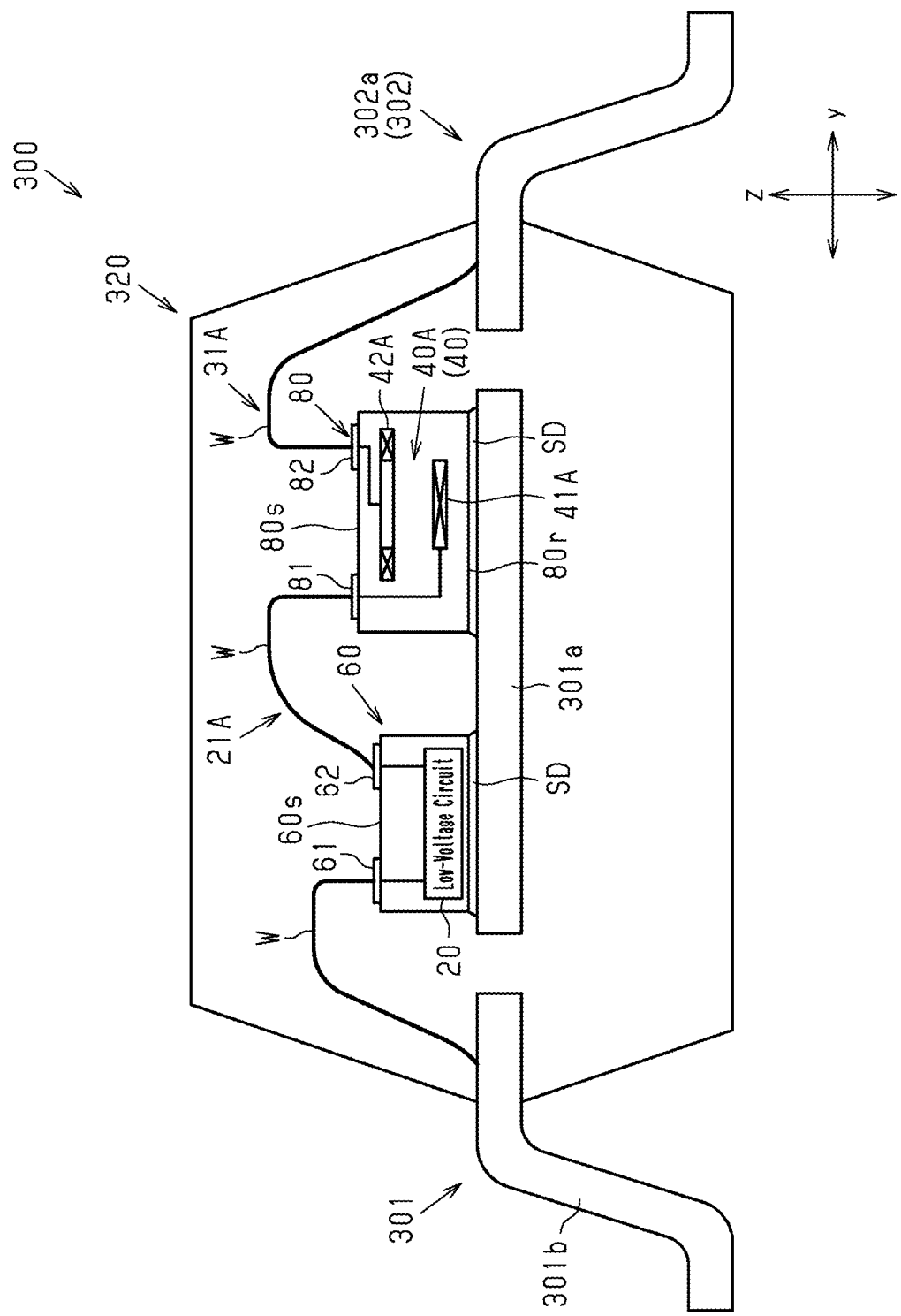
FIG. 14 is a schematic cross-sectional view of an isolation module in the gate driver according to the fourth embodiment.

FIG. 14 shows an example of a schematic cross-sectional structure of the low-voltage circuit unit 300. As shown in FIG. 14, the low-voltage circuit unit 300 includes a low-voltage circuit chip 60 including the low-voltage circuit 20, a transformer chip 80, a low-voltage lead frame 301, a high-voltage lead frame 302, and an encapsulation resin 320 that encapsulates the chips 60 and 80 and a part of each of the lead frames 301 and 302.

The lead frames 301 and 302 are formed from a conductor and, in the present embodiment, are formed from Cu. The lead frames 301 and 302 extend from the inside to the outside of the encapsulation resin 320.

The low-voltage lead frame 301 is electrically connected to the low-voltage circuit 20 and includes a low-voltage die pad 301a arranged in the encapsulation resin 320 and a plurality of low-voltage leads 301b extending from the inside to the outside of the encapsulation resin 320. Each of the low-voltage leads 301b includes an external terminal electrically connected to the low-voltage circuit 20.

The high-voltage lead frame 302 is electrically connected to the high-voltage circuit 30 (refer to FIG. 13) and includes a plurality of high-voltage leads 302a extending from the inside to the outside of the encapsulation resin 320. Each of the high-voltage leads 302a includes an external terminal electrically connected to the high-voltage circuit 30.

In the present embodiment, the low-voltage circuit chip 60 and the transformer chip 80 are mounted on the low-voltage die pad 301a. The low-voltage circuit chip 60 and the transformer chip 80 are separated from each other in the y-direction. In the present embodiment, the low-voltage circuit chip 60 and the transformer chip 80 are arranged in this order from the low-voltage leads 301b toward the high-voltage leads 302a. The low-voltage circuit chip 60 and the transformer chip 80 are connected by wires W in the same manner as those of the first embodiment. The present embodiment has the same advantages as the first embodiment.

Fifth Embodiment

A fifth embodiment of a gate driver 10 will be described with reference to FIGS. 15 and 16. The gate driver 10 of the present embodiment differs from the gate driver 10 of the first embodiment mainly in that the gate driver 10 of the present embodiment includes a plurality of packages. In the following description, the differences from the first embodiment will be described. The same reference characters are given to those components that are the same as the corresponding components of the gate driver 10 of the first embodiment. Such components will not be described in detail.

Figure 15:
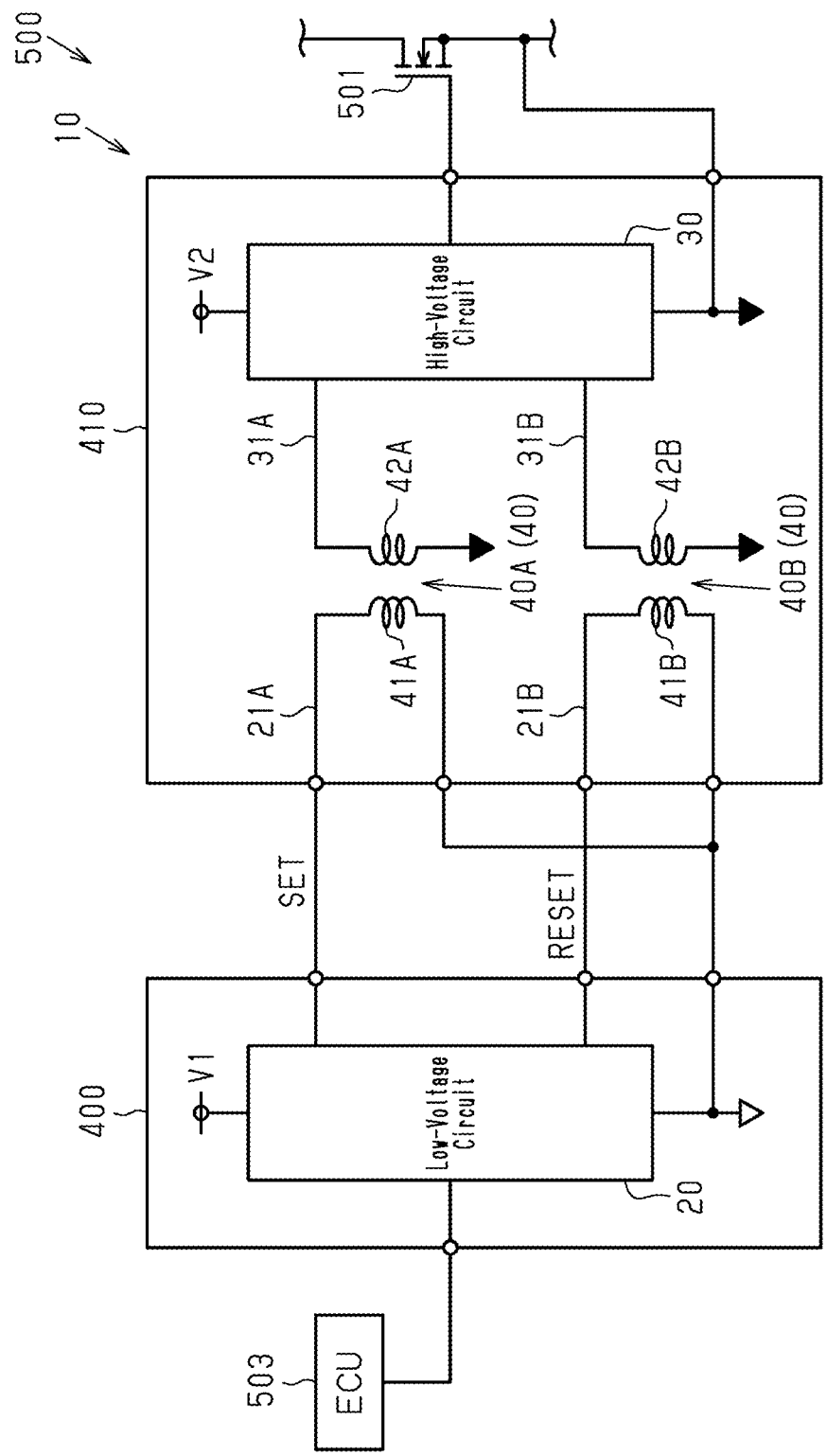
FIG. 15 is a schematic circuit diagram showing a fifth embodiment of a gate driver.

As shown in FIG. 15, the gate driver 10 of the present embodiment has the same circuit configuration as the gate driver 10 of the first embodiment. The gate driver 10 includes a low-voltage circuit module 400 and a high-voltage circuit unit 410. The low-voltage circuit module 400 has the same structure as the low-voltage circuit module 200 (refer to FIG. 11) of the third embodiment. The high-voltage circuit unit 410 corresponds to "isolation module."

The high-voltage circuit unit 410 includes a high-voltage circuit 30 and transformers 40. The high-voltage circuit unit 410 insulates the low-voltage circuit 20 from the high-voltage circuit 30 while allowing transmission of the set signal and the reset signal from the low-voltage circuit 20 to the high-voltage circuit 30.

Figure 16:
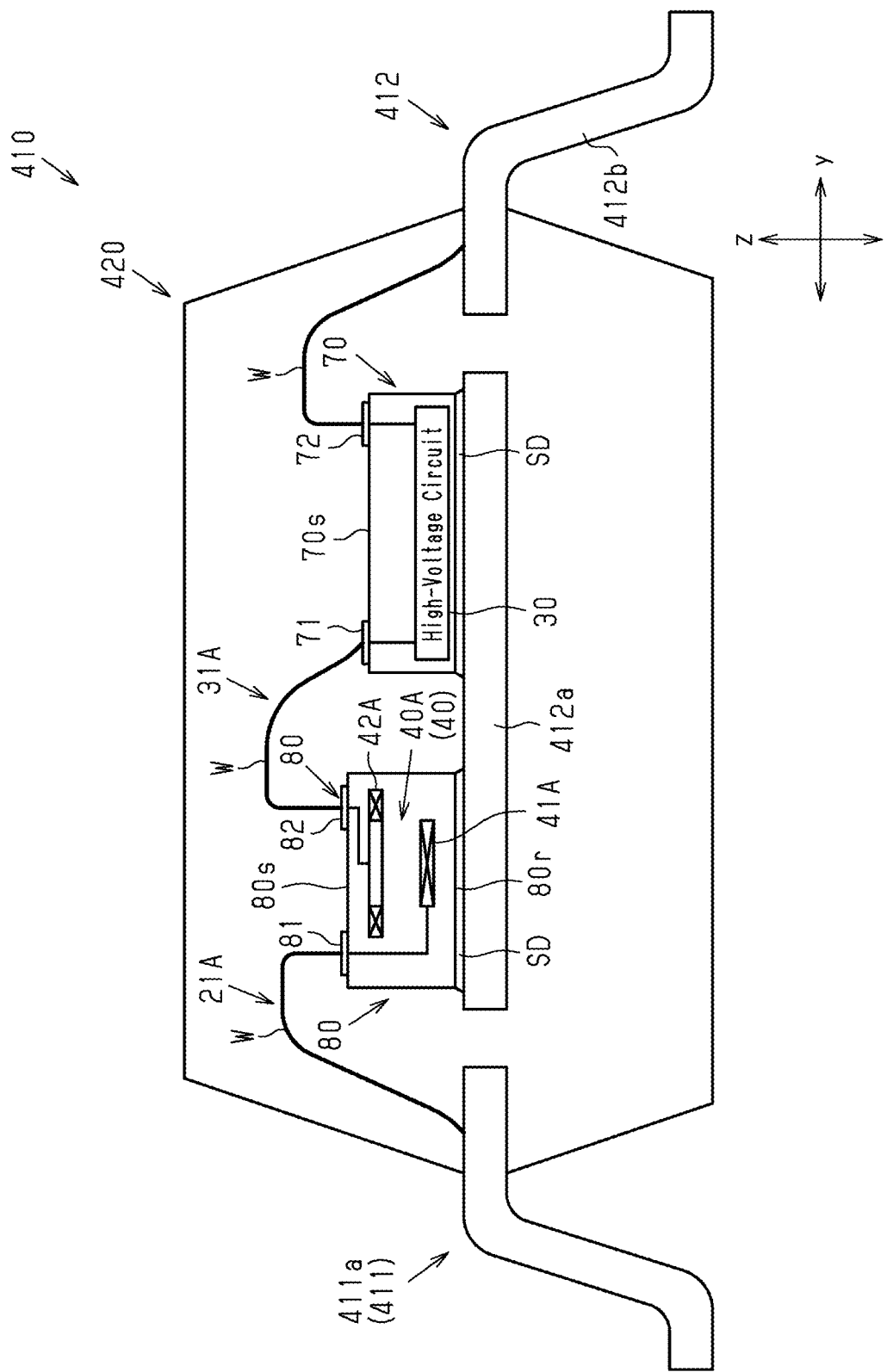
FIG. 16 is a schematic cross-sectional view of an isolation module in the gate driver of the fifth embodiment.

FIG. 16 shows an example of a schematic cross-sectional structure of the high-voltage circuit unit 410. As shown in FIG. 16, the high-voltage circuit unit 410 includes a high-voltage circuit chip 70, a transformer chip 80, a low-voltage lead frame 411, a high-voltage lead frame 412, and an encapsulation resin 420 that encapsulates the chips 70 and 80 and a part of each of the lead frames 411 and 412.

The lead frames 411 and 412 are formed from a conductor and, in the present embodiment, are formed from Cu. The lead frames 411 and 412 extend from the inside to the outside of the encapsulation resin 420.

The low-voltage lead frame 411 is electrically connected to the low-voltage circuit 20 (refer to FIG. 15) and includes a plurality of low-voltage leads 411a extending from the inside to the outside of the encapsulation resin 420. Each of the low-voltage leads 411a includes an external terminal electrically connected to the low-voltage circuit 20.

The high-voltage lead frame 412 is electrically connected to the high-voltage circuit and includes a high-voltage die pad 412a arranged in the encapsulation resin 420 and a plurality of high-voltage leads 412b extending from the inside to the outside of the encapsulation resin 420. Each of the high-voltage leads 412b includes an external terminal electrically connected to the high-voltage circuit 30.

In the present embodiment, the high-voltage circuit chip 70 and the transformer chip 80 are mounted on the high-voltage die pad 412a. The high-voltage circuit chip 70 and the transformer chip 80 are separated from each other in the y-direction. In the present embodiment, the transformer chip 80 and the high-voltage circuit chip 70 are arranged in this order from the low-voltage leads 411a to the high-voltage leads 412b.

The high-voltage circuit chip 70 and the transformer chip 80 are connected by wires W in the same manner as those of the first embodiment. The first electrode pads 81 of the transformer chip 80 are connected to the low-voltage leads 411a by wires W. The present embodiment has the same advantages as the first embodiment.

Modified Examples

The above embodiments exemplify, without any intention to limit, applicable forms of a gate driver and an isolation module according to the present disclosure. The gate driver and the isolation module according to the present disclosure can be applicable to forms differing from the above embodiments. In an example of such a form, the structure of the embodiments is partially replaced, changed, or omitted, or a further structure is added to the embodiments. The modified examples described below may be combined with one another as long as there is no technical inconsistency. In the modified examples, the same reference characters are given to those components that are the same as the corresponding components of the above embodiments. Such components will not be described in detail.

In the first and third to fifth embodiments, in plan view, the first coil wiring 51 of the first coils 41A and 41B is arranged so that the longitudinal direction of the first coil wiring 51 extends in the x-direction and the lateral direction of the first coil wiring 51 extends in the y-direction. Alternatively, for example, in plan view, the first coil wiring 51 of the first coils 41A and 41B may be arranged so that the longitudinal direction of the first coil wiring 51 extends in the y-direction and the lateral direction of the first coil wiring 51 extends in the x-direction.

In the second embodiment, in plan view, the first coil wiring 51 of the first coils 45A and 45B in the first transformer chip 80A is arranged so that the longitudinal direction of the first coil wiring 51 extends in the x-direction and the lateral direction of the first coil wiring 51 extends in the y-direction. Alternatively, for example, in plan view, the first coil wiring 51 of the first coils 45A and 45B may be arranged so that the longitudinal direction of the first coil wiring 51 extends in the y-direction and the lateral direction of the first coil wiring 51 extends in the x-direction.

In the second embodiment, in plan view, the first coil wiring 51 of the first coils 47A and 47B in the second transformer chip 80B is arranged so that the longitudinal direction of the first coil wiring 51 extends in the x-direction and the lateral direction of the first coil wiring 51 extends in the y-direction. Alternatively, for example, in plan view, the first coil wiring 51 of the first coils 47A and 47B may be arranged so that the longitudinal direction of the first coil wiring 51 extends in the y-direction and the lateral direction of the first coil wiring 51 extends in the x-direction.

In the first and third to fifth embodiments, in plan view, the second coil wiring 52 of the second coils 42A and 42B is arranged so that the longitudinal direction of the second coil wiring 52 extends in the x-direction and the lateral direction of the second coil wiring 52 extends in the y-direction. Alternatively, for example, in plan view, the second coil wiring 52 of the second coils 42A and 42B may be arranged so that the longitudinal direction of the second coil wiring 52 extends in the y-direction and the lateral direction of the second coil wiring 52 extends in the x-direction.

In the second embodiment, in plan view, the second coil wiring 52 of the second coils 46A and 46B in the first transformer chip 80A is arranged so that the longitudinal direction of the second coil wiring 52 extends in the x-direction and the lateral direction of the second coil wiring 52 extends in the y-direction. Alternatively, for example, in plan view, the second coil wiring 52 of the second coils 46A and 46B may be arranged so that the longitudinal direction of the second coil wiring 52 extends in the y-direction and the lateral direction of the second coil wiring 52 extends in the x-direction.

In the second embodiment, in plan view, the second coil wiring 52 of the second coils 48A and 48B in the second transformer chip 80B is arranged so that the longitudinal direction of the second coil wiring 52 extends in the x-direction and the lateral direction of the second coil wiring 52 extends in the y-direction. Alternatively, for example, in plan view, the second coil wiring 52 of the second coils 48A and 48B may be arranged so that the longitudinal direction of the second coil wiring 52 extends in the y-direction and the lateral direction of the second coil wiring 52 extends in the x-direction.

In the first and third to fifth embodiments, in plan view, the first coil wirings 51 of both the first coil 41A and the first coil 41B are arranged so that the longitudinal direction of each first coil wiring 51 extends in the x-direction and the lateral direction of each first coil wiring 51 extends in the y-direction. Alternatively, for example, in plan view, the first coil wiring 51 of the first coil 41A may be arranged so that the longitudinal direction of the first coil wiring 51 extends in the x-direction and the lateral direction of the first coil wiring 51 extends in the y-direction, and the first coil wiring 51 of the first coil 41B may be arranged so that the longitudinal direction of the first coil wiring 51 extends in the y-direction and the lateral direction of the first coil wiring 51 extends in the x-direction.

In the second embodiment, in plan view, the first coil wirings 51 of both the first coil 45A and the first coil 45B in the first transformer chip 80A are arranged so that the longitudinal direction of each first coil wiring 51 extends in the x-direction and the lateral direction of each first coil wiring 51 extends in the y-direction. Alternatively, for example, in plan view, the first coil wiring 51 of the first coil 45A may be arranged so that the longitudinal direction of the first coil wiring 51 extends in the x-direction and the lateral direction of the first coil wiring 51 extends in the y-direction, and the first coil wiring 51 of the first coil 45B may be arranged so that the longitudinal direction of the first coil wiring 51 extends in the y-direction and the lateral direction of the first coil wiring 51 extends in the x-direction.

In the second embodiment, in plan view, the first coil wirings 51 of both the first coil 47A and the first coil 47B in the second transformer chip 80B are arranged so that the longitudinal direction of each first coil wiring 51 extends in the x-direction and the lateral direction of each first coil wiring 51 extends in the y-direction. Alternatively, for example, in plan view, the first coil wiring 51 of the first coil 47A may be arranged so that the longitudinal direction of the first coil wiring 51 extends in the x-direction and the lateral direction of the first coil wiring 51 extends in the y-direction, and the first coil wiring 51 of the first coil 47B may be arranged so that the longitudinal direction of the first coil wiring 51 extends in the y-direction and the lateral direction of the first coil wiring 51 extends in the x-direction.

In the first and third to fifth embodiments, in plan view, the second coil wirings 52 of both the second coil 42A and the second coil 42B are arranged so that the longitudinal direction of each second coil wiring 52 extends in the x-direction and the lateral direction of each second coil wiring 52 extends in the y-direction. Alternatively, for example, in plan view, the second coil wiring 52 of the second coil 42A may be arranged so that the longitudinal direction of the second coil wiring 52 extends in the x-direction and the lateral direction of the second coil wiring 52 extends in the y-direction, and the second coil wiring 52 of the second coil 42B may be arranged so that the longitudinal direction of the second coil wiring 52 extends in the y-direction and the lateral direction of the second coil wiring 52 extends in the x-direction.

In the second embodiment, in plan view, the first coil wirings 51 of both the first coil 47A and the first coil 47B in the first transformer chip 80A are arranged so that the longitudinal direction of each first coil wiring 51 extends in the x-direction and the lateral direction of each first coil wiring 51 extends in the y-direction. Alternatively, for example, in plan view, the first coil wiring 51 of the first coil 47A may be arranged so that the longitudinal direction of the first coil wiring 51 extends in the x-direction and the lateral direction of the first coil wiring 51 extends in the y-direction, and the first coil wiring 51 of the first coil 47B may be arranged so that the longitudinal direction of the first coil wiring 51 extends in the y-direction and the lateral direction of the first coil wiring 51 extends in the x-direction.

In the second embodiment, in plan view, the second coil wirings 52 of both the second coil 48A and the second coil 48B in the second transformer chip 80B are arranged so that the longitudinal direction of each second coil wiring 52 extends in the x-direction and the lateral direction of each second coil wiring 52 extends in the y-direction. Alternatively, for example, in plan view, the second coil wiring 52 of the second coil 48A may be arranged so that the longitudinal direction of the second coil wiring 52 extends in the x-direction and the lateral direction of the second coil wiring 52 extends in the y-direction, and the second coil wiring 52 of the second coil 48B may be arranged so that the longitudinal direction of the second coil wiring 52 extends in the y-direction and the lateral direction of the second coil wiring 52 extends in the x-direction.

In the first and third to fifth embodiments, in plan view, the first coil wiring 51 of the first coil 41A and the second coil wiring 52 of the second coil 42A are arranged so that the longitudinal direction of each coil wiring extends in the x-direction and the lateral direction of each coil wiring extends in the y-direction. Alternatively, for example, in plan view, the first coil wiring 51 of the first coil 41A may be arranged so that the longitudinal direction of the first coil wiring 51 extends in the x-direction and the lateral direction of the first coil wiring 51 extends in the y-direction, and the second coil wiring 52 of the second coil 42A may be arranged so that the longitudinal direction of the second coil wiring 52 extends in the y-direction and the lateral direction of the second coil wiring 52 extends in the x-direction. In this case, in plan view, a portion of the first coil wiring 51 of the first coil 41A may overlap the second coil wiring 52 of the second coil 42A. More specifically, in plan view, the first coil wiring 51 of the first coil 41A and the second coil wiring 52 of the second coil 42A may be arranged so that a portion of the first coil wiring 51 and a portion of the second coil wiring 52 overlap each other in the winding direction.

In the second embodiment, in plan view, the first coil wiring 51 of the first coil 45A and the second coil wiring 52 of the second coil 46A in the first transformer chip 80A are arranged so that the longitudinal direction of each coil wiring extends in the x-direction and the lateral direction of each coil wiring extends in the y-direction. Alternatively, for example, in plan view, the first coil wiring 51 of the first coil 45A may be arranged so that the longitudinal direction of the first coil wiring 51 extends in the x-direction and the lateral direction of the first coil wiring 51 extends in the y-direction, and the second coil wiring 52 of the second coil 46A may be arranged so that the longitudinal direction of the second coil wiring 52 extends in the y-direction and the lateral direction of the second coil wiring 52 extends in the x-direction. In this case, in plan view, a portion of the first coil wiring 51 of the first coil 45A may overlap the second coil wiring 52 of the second coil 46A. More specifically, in plan view, the first coil wiring 51 of the first coil 45A and the second coil wiring 52 of the second coil 46A may be arranged so that a portion of the first coil wiring 51 and a portion of the second coil wiring 52 overlap each other in the winding direction.

In the second embodiment, in plan view, the first coil wiring 51 of the first coil 47A and the second coil wiring 52 of the second coil 48A in the second transformer chip 80B are arranged so that the longitudinal direction of each coil wiring extends in the x-direction and the lateral direction of each coil wiring extends in the y-direction. Alternatively, for example, in plan view, the first coil wiring 51 of the first coil 47A may be arranged so that the longitudinal direction of the first coil wiring 51 extends in the x-direction and the lateral direction of the first coil wiring 51 extends in the y-direction, and the second coil wiring 52 of the second coil 48A may be arranged so that the longitudinal direction of the second coil wiring 52 extends in the y-direction and the lateral direction of the second coil wiring 52 extends in the x-direction. In this case, in plan view, a portion of the first coil wiring 51 of the first coil 47A may overlap the second coil wiring 52 of the second coil 48A. More specifically, in plan view, the first coil wiring 51 of the first coil 47A and the second coil wiring 52 of the second coil 48A may be arranged so that a portion of the first coil wiring 51 and a portion of the second coil wiring 52 overlap each other in the winding direction.

In the first and third to fifth embodiments, in plan view, the first coil wiring 51 of the first coil 41B and the second coil wiring 52 of the second coil 42B are arranged so that the longitudinal direction of each coil wiring extends in the x-direction and the lateral direction of each coil wiring extends in the y-direction. Alternatively, for example, in plan view, the first coil wiring 51 of the first coil 41B may be arranged so that the longitudinal direction of the first coil wiring 51 extends in the x-direction and the lateral direction of the first coil wiring 51 extends in the y-direction, and the second coil wiring 52 of the second coil 42B may be arranged so that the longitudinal direction of the second coil wiring 52 extends in the y-direction and the lateral direction of the second coil wiring 52 extends in the x-direction. In this case, in plan view, a portion of the first coil wiring 51 of the first coil 41B may overlap the second coil wiring 52 of the second coil 42B. More specifically, in plan view, the first coil wiring 51 of the first coil 41B and the second coil wiring 52 of the second coil 42B may be arranged so that a portion of the first coil wiring 51 and a portion of the second coil wiring 52 overlap each other in the winding direction.

In the second embodiment, in plan view, the first coil wiring 51 of the first coil 45B and the second coil wiring 52 of the second coil 46B in the first transformer chip 80A are arranged so that the longitudinal direction of each coil wiring extends in the x-direction and the lateral direction of each coil wiring extends in the y-direction. Alternatively, for example, in plan view, the first coil wiring 51 of the first coil 45B may be arranged so that the longitudinal direction of the first coil wiring 51 extends in the x-direction and the lateral direction of the first coil wiring 51 extends in the y-direction, and the second coil wiring 52 of the second coil 46B may be arranged so that the longitudinal direction of the second coil wiring 52 extends in the y-direction and the lateral direction of the second coil wiring 52 extends in the x-direction. In this case, in plan view, a portion of the first coil wiring 51 of the first coil 45B may overlap the second coil wiring 52 of the second coil 46B. More specifically, in plan view, the first coil wiring 51 of the first coil 45B and the second coil wiring 52 of the second coil 46B may be arranged so that a portion of the first coil wiring 51 and a portion of the second coil wiring 52 overlap each other in the winding direction.

In the second embodiment, in plan view, the first coil wiring 51 of the first coil 47B and the second coil wiring 52 of the second coil 48B in the second transformer chip 80B are arranged so that the longitudinal direction of each coil wiring extends in the x-direction and the lateral direction of each coil wiring extends in the y-direction. Alternatively, for example, in plan view, the first coil wiring 51 of the first coil 47B may be arranged so that the longitudinal direction of the first coil wiring 51 extends in the x-direction and the lateral direction of the first coil wiring 51 extends in the y-direction, and the second coil wiring 52 of the second coil 48B may be arranged so that the longitudinal direction of the second coil wiring 52 extends in the y-direction and the lateral direction of the second coil wiring 52 extends in the x-direction. In this case, in plan view, a portion of the first coil wiring 51 of the first coil 47B may overlap the second coil wiring 52 of the second coil 48B. More specifically, in plan view, the first coil wiring 51 of the first coil 47B and the second coil wiring 52 of the second coil 48B may be arranged so that a portion of the first coil wiring 51 and a portion of the second coil wiring 52 overlap each other in the winding direction.

Figure 17:
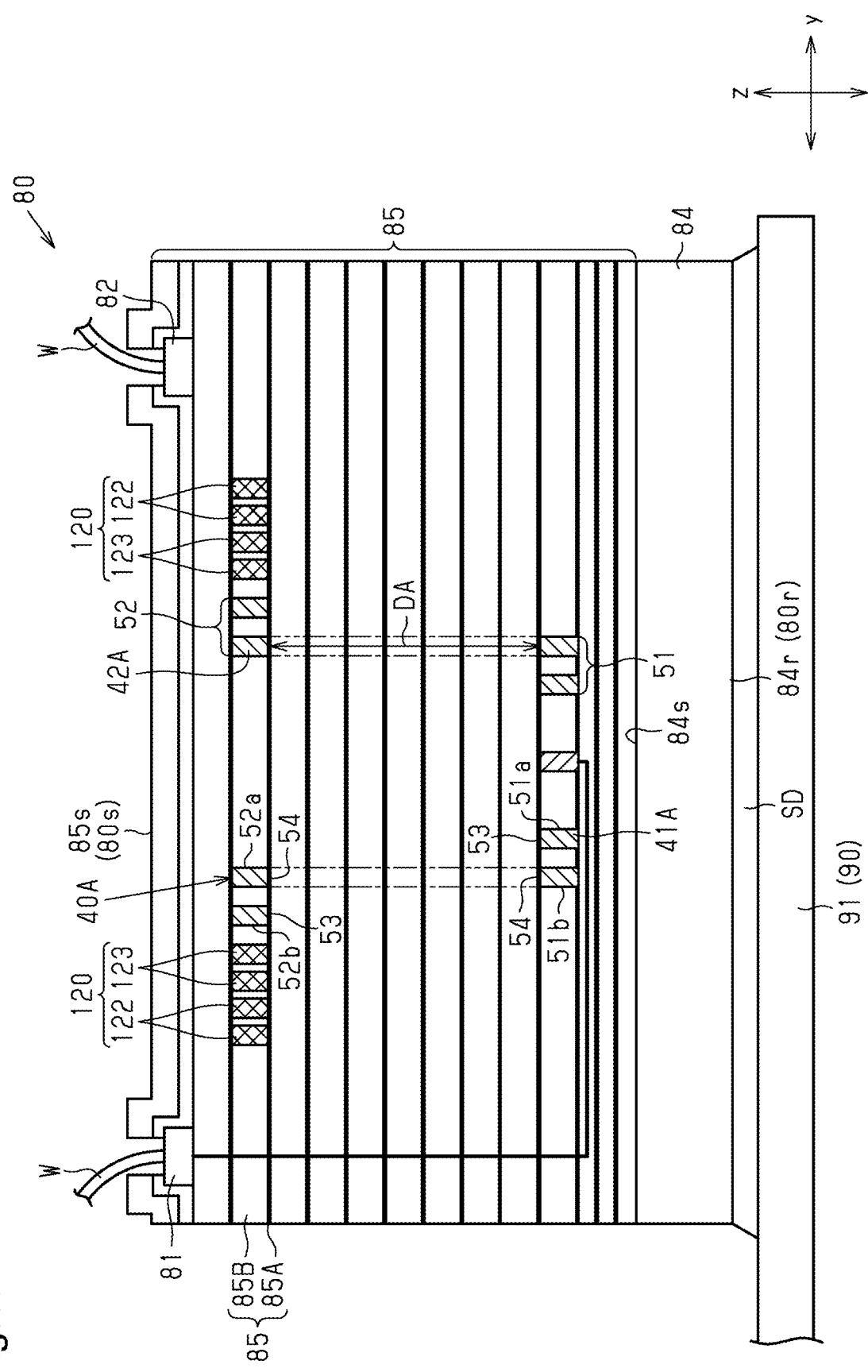
FIG. 17 is a schematic cross-sectional view showing a modified example of a transformer chip.

In the first and third to fifth embodiments, as shown in FIG. 17, as viewed in the z-direction, the first coil 41A and the second coil 42A may be arranged to partially overlap each other. More specifically, the innermost circumference 52a of the second coil wiring 52 of the second coil 42A is located inward from the outermost circumference 51b of the first coil wiring 51 of the first coil 41A. The outermost circumference 52b of the second coil wiring 52 is located outward from the outermost circumference 51b of the first coil wiring 51. Thus, as indicated by double-dashed lines in FIG. 17, the first coil 41A and the second coil 42A include overlapping portions 54 that overlap each other in plan view. In plan view, the first coil 41A and the second coil 42A also include the non-overlapping portions 53 that do not overlap each other.

In this structure, each of the first coil 41A and the second coil 42A includes the non-overlapping portion 53. Thus, the area in which the first coil 41A overlaps the second coil 42A in plan view is decreased as compared to that in a structure in which the first coil 41X and the second coil 42X entirely overlap each other in plan view as in the transformer chip 80X of the comparative example shown in FIG. 6. As a result, a path that short-circuits the first coil 41A and the second coil 42A is less likely to be formed between the first coil 41A and the second coil 42A. Thus, the dielectric strength of the transformer chip 80 is improved. The arrangement of the first coil 41B and the second coil 42B may be changed in the same manner.

In each embodiment, the shapes of the first coils 41A, 41B, 45A, 45B, 47A, and 47B in plan view are not limited to the elliptical spiral and may be changed in any manner. In an example, the shapes of the first coils 41A, 41B, 45A, 45B, 47A, and 47B in plan view may be a circular spiral or a rectangular spiral.

In each embodiment, the shapes of the second coils 42A, 42B, 46A, 46B, 48A, and 48B in plan view are not limited to the elliptical spiral and may be changed in any manner. In an example, the shapes of the second coils 42A, 42B, 46A, 46B, 48A, and 48B in plan view may be a circular spiral or a rectangular spiral. In plan view, the second coils 42A, 42B, 46A, 46B, 48A, and 48B do not have to have geometrical similarity with the second coils 42A, 42B, 46A, 46B, 48A, and 48B and may have different shapes.

In the first and third to fifth embodiments, the position of each second electrode pad 82 of the transformer chip 80 in the y-direction may be changed in any manner. In an example, as viewed in the x-direction, the second electrode pad 82 may be arranged to overlap the second coil 42A (42B). More specifically, in plan view, the second electrode pad 82 connected to the second signal terminal of the second coil 42A (42B) may be arranged inward from the innermost circumference 52a of the second coil wiring 52.

In the second embodiment, the first transformer chip 80A and the second transformer chip 80B may have the same structure. In an example, the second transformer chip 80B may have the structure of the first transformer chip 80A. More specifically, the second transformer chip 80B may have a structure in which the second coil 48A (48B) is located farther away from the substrate 84 than the first coil 47A (47B) is and the dummy pattern 120 is formed around the second coil 48A (48B).

In each embodiment, the gate driver 10 is configured to transmit a signal from the low-voltage circuit 20 to the high-voltage circuit 30. Instead, for example, the gate driver 10 may be configured to transmit a signal from the low-voltage circuit 20 to the high-voltage circuit 30 and also transmit a signal from the high-voltage circuit 30 to the low-voltage circuit 20. An example of a structure in which the gate driver 10 of the first embodiment further includes a signal path for transmitting a signal from the high-voltage circuit 30 to the low-voltage circuit 20 will be described with reference to FIG. 18.

Figure 18:
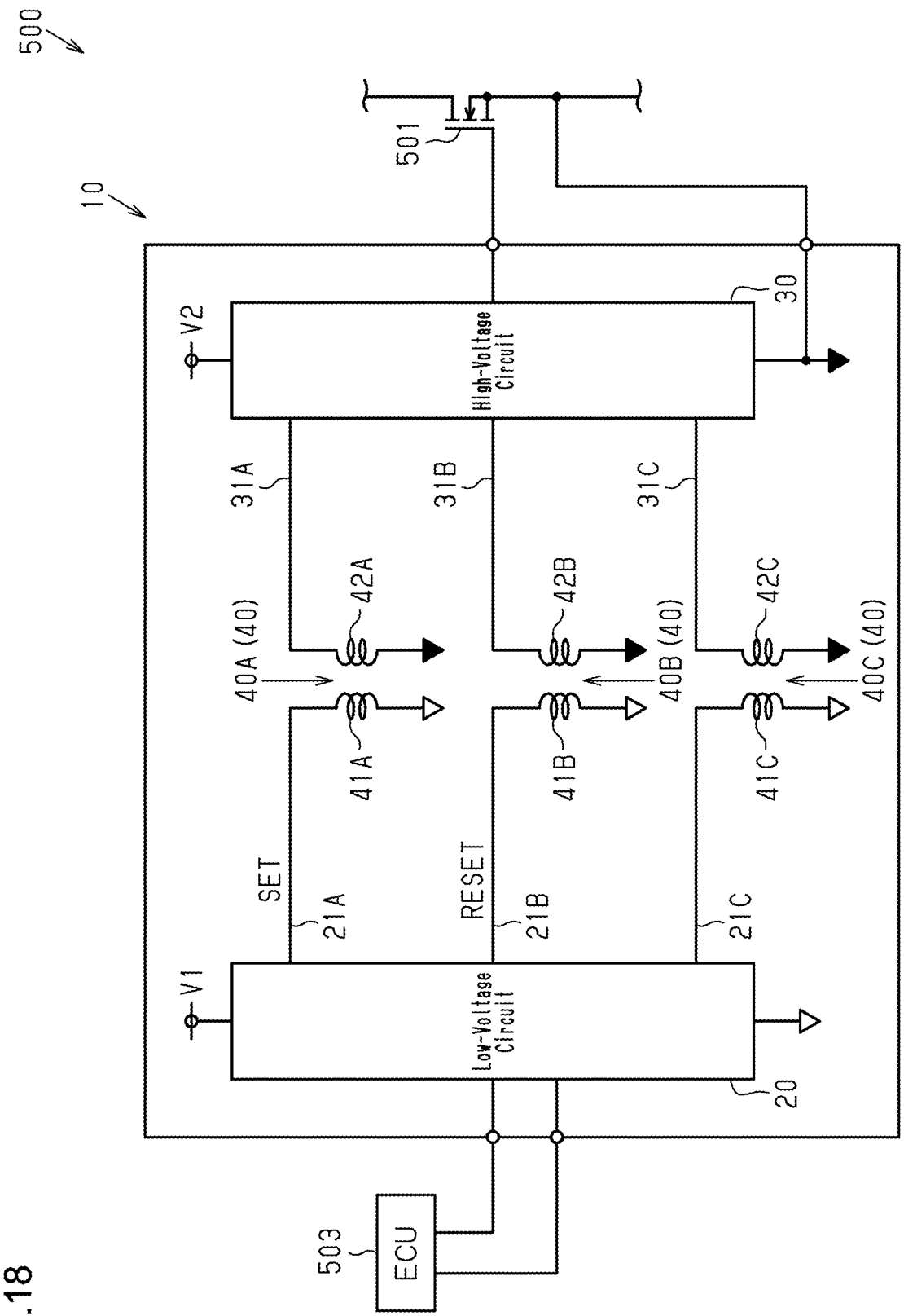
FIG. 18 is a schematic circuit diagram showing a modified example of a gate driver.

As shown in FIG. 18, the first coil 41A (41B) of the transformer 40A (40B) is electrically connected to the low-voltage circuit 20, and the second coil 42A (42B) is electrically connected to the high-voltage circuit 30. Thus, each of the transformers 40A and corresponds to a first signal transformer.

The set signal output from the low-voltage circuit 20 is transmitted through the transformer 40A to the high-voltage circuit 30. The reset signal output from the low-voltage circuit 20 is transmitted through the transformer 40B to the high-voltage circuit 30. In other words, the first signal output from the low-voltage circuit is transmitted through the first signal transformer to the high-voltage circuit.

As shown in FIG. 18, the gate driver 10 further includes a transformer 40C, a low-voltage signal line 21C, and a high-voltage signal line 31C. The transformer 40C corresponds to a second signal transformer.

The transformer 40C insulates the high-voltage circuit 30 from the low-voltage circuit 20 while transmitting a signal from the high-voltage circuit 30 toward the low-voltage circuit 20. In an example, the signal is for detecting an anomaly in the temperature of the switching element 501 and corresponds to a second signal. The transformer 40C includes a first coil 41C and a second coil 42C that is insulated from and configured to be magnetically coupled to the first coil 41C.

The first coil 41C is electrically connected to the high-voltage circuit 30 and is also electrically connected to the ground of the high-voltage circuit 30. More specifically, the first coil 41C includes a first end electrically connected to the high-voltage circuit 30 and a second end electrically connected to the ground of the high-voltage circuit 30. Thus, the potential of the second end of the first coil 41C equals the second reference potential. The second reference potential varies as the inverter device 500 is driven and may become, for example, greater than or equal to 600 V.

The second coil 42C is electrically connected to the low-voltage circuit 20 and is also electrically connected to the ground of the low-voltage circuit 20. More specifically, the second coil 42C includes a first end electrically connected to the low-voltage circuit 20 and a second end electrically connected to the ground of the low-voltage circuit 20. Thus, the potential of the second end of the second coil 42C equals the first reference potential. The first reference potential is, for example, 0 V. The signal (second signal) output from the high-voltage circuit 30 is transmitted through the transformer 40C to the low-voltage circuit 20.

As described above, in the modified example shown in FIG. 18, the gate driver 10 is configured to bidirectionally transmit signals between the low-voltage circuit 20 and the high-voltage circuit 30 through the transformer 40. The signals include a first signal transmitted from the low-voltage circuit 20 toward the high-voltage circuit 30 and a second signal transmitted from the high-voltage circuit 30 toward the low-voltage circuit 20.

The transformer chip 80 includes the transformers 40A, 40B, and 40C (refer to FIG. 18). More specifically, the transformers 40A, 40B, and 40C are integrated in a single chip. Although not shown, in plan view, the transformers 40A to 40C are aligned with each other in the y-direction and separated from each other in the x-direction. In the transformer 40C, the first coil 41C is electrically connected to the second electrode pad 82, and the second coil 42C is electrically connected to the first electrode pad 81. Since the second electrode pad 82 is connected to the first electrode pad 71 of the high-voltage circuit chip 70 by a wire W, the first coil 41C is electrically connected to the high-voltage circuit 30 through the second electrode pad 82 and the wire W. Since the first electrode pad 81 is connected to the second electrode pad 62 of the low-voltage circuit chip 60 by a wire W, the second coil 42C is electrically connected to the low-voltage circuit 20 through the first electrode pad 81 and the wire W.

Figure 19:
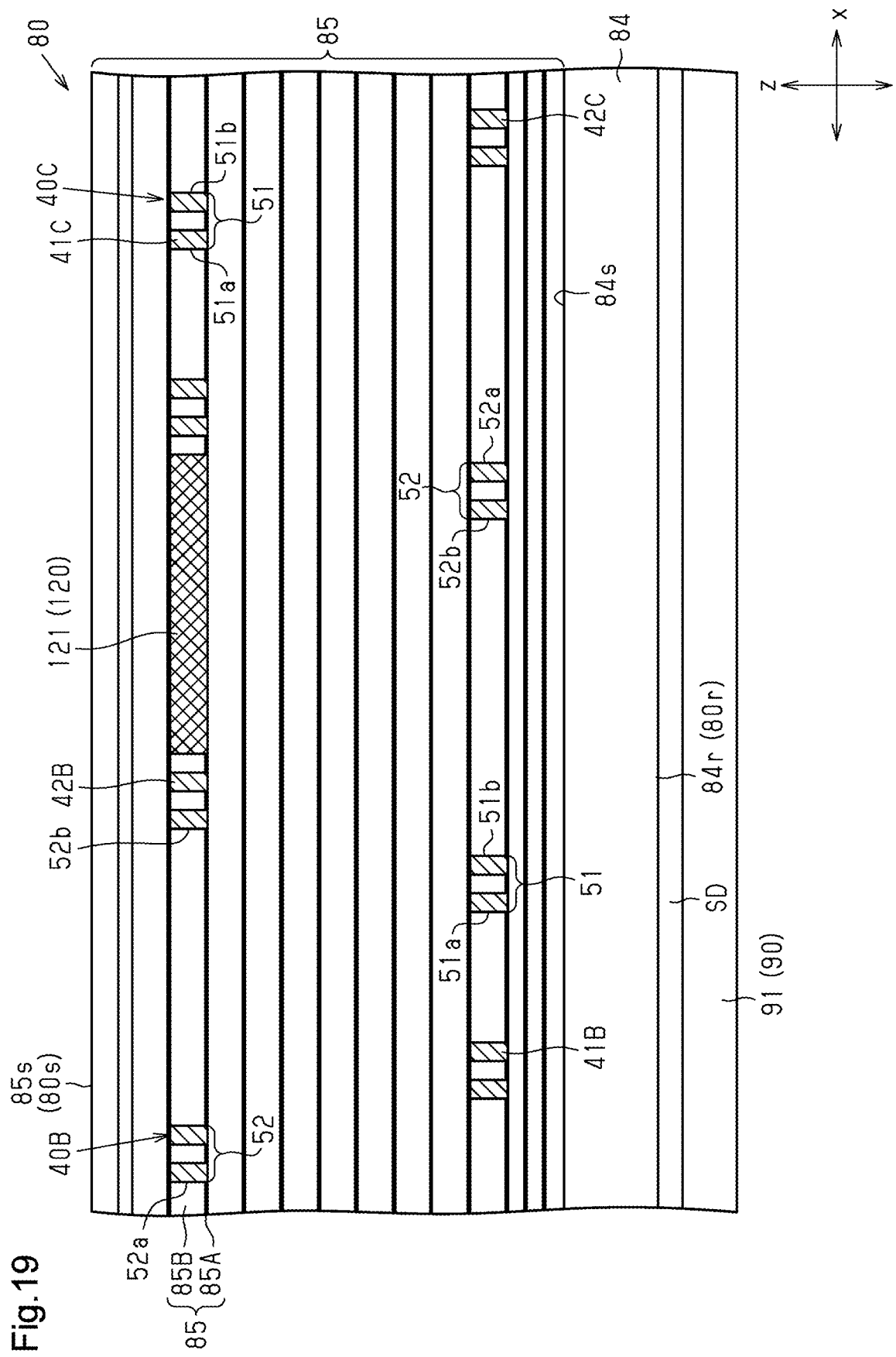
FIG. 19 is a schematic cross-sectional view of a transformer chip in the gate driver shown in FIG. 18.

FIG. 19 is a cross-sectional view of the transformer chip 80 showing an example of a cross-sectional structure of the transformer 40B and the transformer 40C.

As shown in FIG. 19, the arrangement of the first coil 41B and the second coil 42B in the transformer 40B is the same as that of the first coil 41A and the second coil 42A in the transformer 40A of the first embodiment. That is, the second coil 42B is located farther away from the substrate 84 than the first coil 41B is. The first coil 41B is identical in shape and size in plan view to the first coil 41A. The second coil 42B is identical in shape and size in plan view to the second coil 42A.

The arrangement of the first coil 41C and the second coil 42B in the transformer 40C differs from that of the first coil 41A and the second coil 42A in the transformer 40A of the first embodiment. More specifically, the first coil 41C is located farther away from the substrate 84 than the second coil 42C is.

As shown in FIG. 19, in the z-direction, the second coil 42B of the transformer 40B is aligned with the first coil 41C of the transformer 40C, and the first coil 41B of the transformer 40B is aligned with the second coil 42C of the transformer 40C. More specifically, the first coil 41C is arranged in the insulation layer 85 in which the second coil 42B is arranged. The second coil 42C is arranged in the insulation layer 85 in which the first coil 41B is arranged.

The first coil 41C is identical in shape and size in plan view to the first coil 41A. The second coil 42C is identical in shape and size in plan view to the second coil 42A. Therefore, the first coil 41C, which is located farther away from the substrate 84 than the second coil 42C, is smaller in size than the second coil 42C.

In plan view, the innermost circumference 52a of the second coil wiring 52 of the second coil 42C is located outward from the outermost circumference 51b of the first coil wiring 51 of the first coil 41C. Thus, in plan view, the entirety of the first coil wiring 51 is located inward from the second coil wiring 52. In plan view, the first coil 41C and the second coil 42C are arranged so that the entirety of the first coil wiring 51 does not overlap the second coil wiring 52.

Thus, the first coil 41C and the second coil 42C each include the non-overlapping portion 53. The non-overlapping portion 53 of the first coil 41C is the entirety of the first coil wiring 51. The non-overlapping portion 53 of the second coil 42C is the entirety of the second coil wiring 52.

With the gate driver 10 of the modified example shown in FIGS. 18 and 19, in the transformers 40A and 40B that transmit a signal from the low-voltage circuit 20 to the high-voltage circuit 30, the first coil 41A (41B), which is the transmission coil, is smaller in size than the second coil 42A (42B), which is the reception coil. This reduces leakage of the magnetic flux between the first coil 41A (41B) and the second coil 42A (42B), thereby increasing coupling coefficient. As a result, a signal is readily transmitted from the first coil 41A (41B) to the second coil 42A (42B).

Also, in the transformer 40C that transmits a signal from the high-voltage circuit 30 to the low-voltage circuit 20, the first coil 41C, which is the transmission coil, is smaller in size than the second coil 42C, which is the reception coil. This reduces leakage of the magnetic flux between the first coil 41C and the second coil 42C, thereby increasing coupling coefficient. As a result, a signal is readily transmitted from the first coil 41C to the second coil 42C. Thus, a signal is readily transmitted from the low-voltage circuit 20 to the high-voltage circuit 30 and also readily transmitted from the high-voltage circuit 30 to the low-voltage circuit 20.

The size relationship between the first coil 41C and the second coil 42C may be changed in any manner. In an example, in the same manner as the sizes of the first coil 41A and the second coil 42A, the first coil 41C may be larger in size than the second coil 42C. More specifically, in plan view, the innermost circumference 51a of the first coil wiring 51 of the first coil 41C may be formed to surround the outermost circumference 52b of the second coil wiring 52 of the second coil 42C.

The transformer chip 80 shown in FIG. 19 includes a stack of the insulation layers 85, each of which has a stacking structure of the first insulation film 85A including silicon nitride and the second insulation film 85B including silicon oxide. Alternatively, for example, the transformer chip 80 may include one or more resin layers as the insulation layer in which the transformers 40A to 40C are embedded. The resin layers may include a material including any one of polyimide resin, phenol resin, and epoxy resin.

In the transformer chip 80 shown in FIG. 19, the positional relationship between the first coil 41A (41B, 41C) and the second coil 42A (42B, 42C) in the transformers 40A to 40C may be changed to that of the first coil 41A and the second coil 42A shown in FIG. 17.

Figure 20:
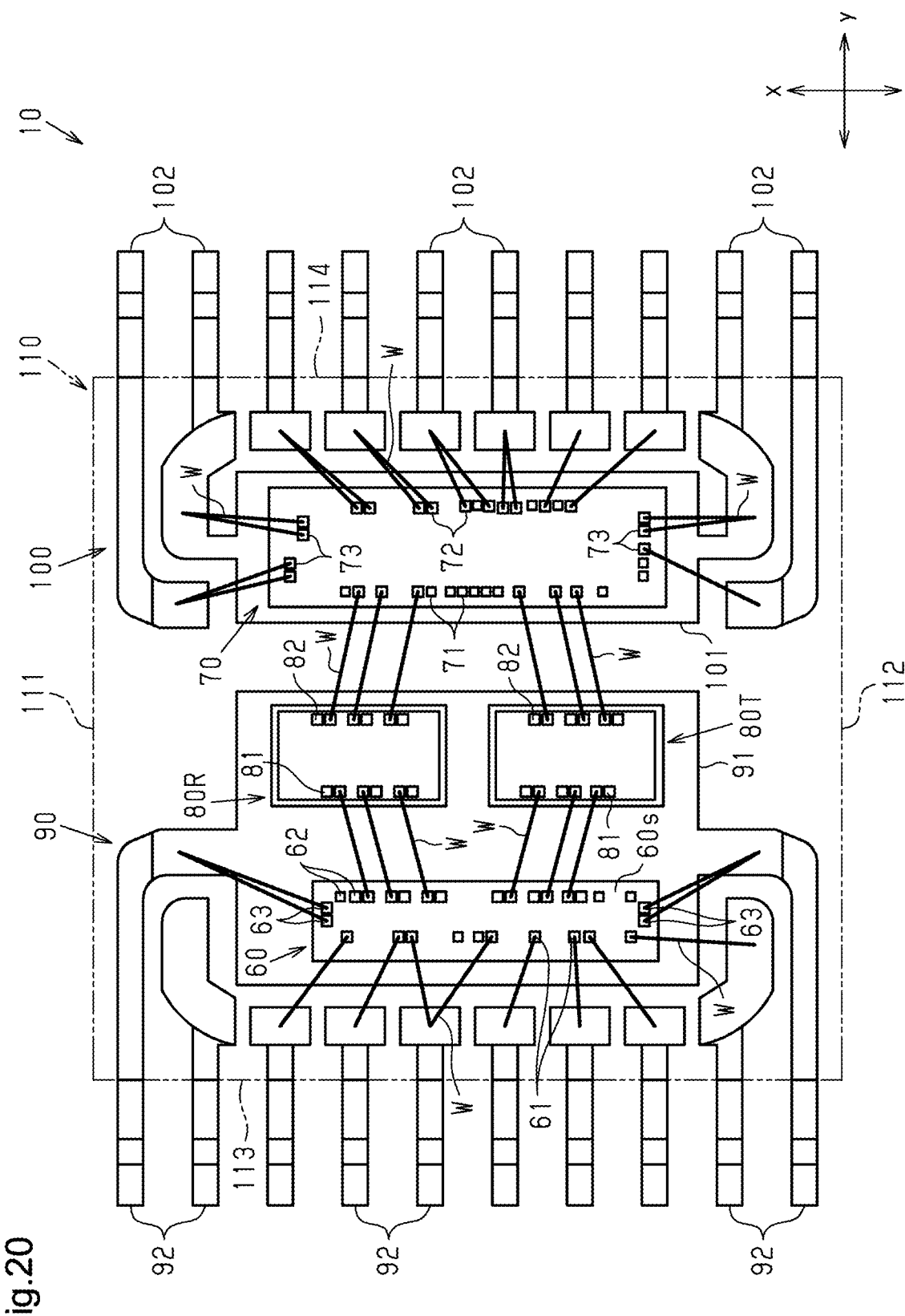
FIG. 20 is a plan view showing the internal structure of a modified example of a gate driver.

As shown in FIG. 20, the gate driver 10 including the transformer 40C shown in FIG. 18 may include a transformer chip 80T transmitting a signal (first signal) from the low-voltage circuit 20 to the high-voltage circuit 30 and a transformer chip 80R transmitting a signal (second signal) from the high-voltage circuit 30 to the low-voltage circuit 20, instead of the transformer chip 80. In the example shown, the transformer chips 80T and 80R are mounted on the low-voltage die pad 91. The transformer chip 80T and the transformer chip 80R are aligned with each other in the y-direction and separated from each other in the x-direction. The transformer chip 80T corresponds to a first transformer chip including a first signal transformer. The transformer chip 80R corresponds to a second transformer chip including a second signal transformer.

The transformer chip 80T includes the transformer 40A and the transformer 40B. More specifically, the transformers 40A and 40B are integrated in a single chip. More specifically, the transformer chip 80T is a semiconductor chip that is separate from the low-voltage circuit chip 60 and the high-voltage circuit chip 70 (refer to FIG. 2) and is dedicated to the transformers 40A and 40B. The structure of the first coil 41A (41B) and the second coil 42A (42B) in the transformer chip 80T is the same as the structure of the first coil 41A (41B) and the second coil 42A (42B) in the transformer chip 80.

The transformer chip 80R includes the transformer 40C. More specifically, the transformer 40C is arranged in a single chip. More specifically, the transformer chip 80R is a semiconductor chip dedicated to the transformer 40C, which differs from the low-voltage circuit chip 60, the high-voltage circuit chip 70, and the transformer chip 80T. The structure of the first coil 41C and the second coil 42C in the transformer chip 80R is the same as the structure of the first coil 41C and the second coil 42C in the transformer chip 80 shown in FIG. 19.

In the gate drivers 10 of the modified examples shown in FIGS. 18 to 20, the connection relationship between the first coil 41C and the second coil 42C of the transformer 40C and the arrangement of the first coil 41C and the second coil 42C in the transformer chip 80 (80R) may be changed in any manner.

In an example, the first coil 41C may be electrically connected to the low-voltage circuit 20, and the second coil 42C may be electrically connected to the high-voltage circuit 30. In this case, the second coil 42C may be greater in size than the first coil 41C. In plan view, the innermost circumference 52a of the second coil wiring 52 of the second coil 42C may be formed to surround the outermost circumference 51b of the first coil wiring 51 of the first coil 41C. The first coil 41C may be located closer to the surface 85s of the insulation layers 85 than the second coil 42C is in the z-direction. That is, the first coil 41C may be located above the second coil 42C in the z-direction. The surface 85s of the insulation layers 85 refers to the surface of the uppermost insulation layer 85 among the insulation layers 85. The surface 85s of the insulation layers 85 is the surface of the insulation layer 85 located closest to the chip main surface 80s among the insulation layers 85.

The second coil 42C may be located closer to the surface 85s of the insulation layers 85 than the first coil 41C is in the z-direction. That is, the second coil 42C may be located above the first coil 41C in the z-direction.

In each embodiment, the number of times the first coils 41A, 41B, 45A, 45B, 47A, and 47B are wound may differ from the number of times the second coils 42A, 42B, 46A, 46B, 48A, and 48B are wound.

In each embodiment, one or more of the first dummy pattern 121, the second dummy pattern 122, and the third dummy pattern 123 may be omitted from the dummy pattern 120. In each embodiment, the dummy pattern 120 may be omitted.

In each embodiment, the transformer chip 80 may include one or more resin layers as the insulation layer in which the transformers 40A to 40C are embedded. The resin layers may include a material including any one of polyimide resin, phenol resin, and epoxy resin.

Figure 21:
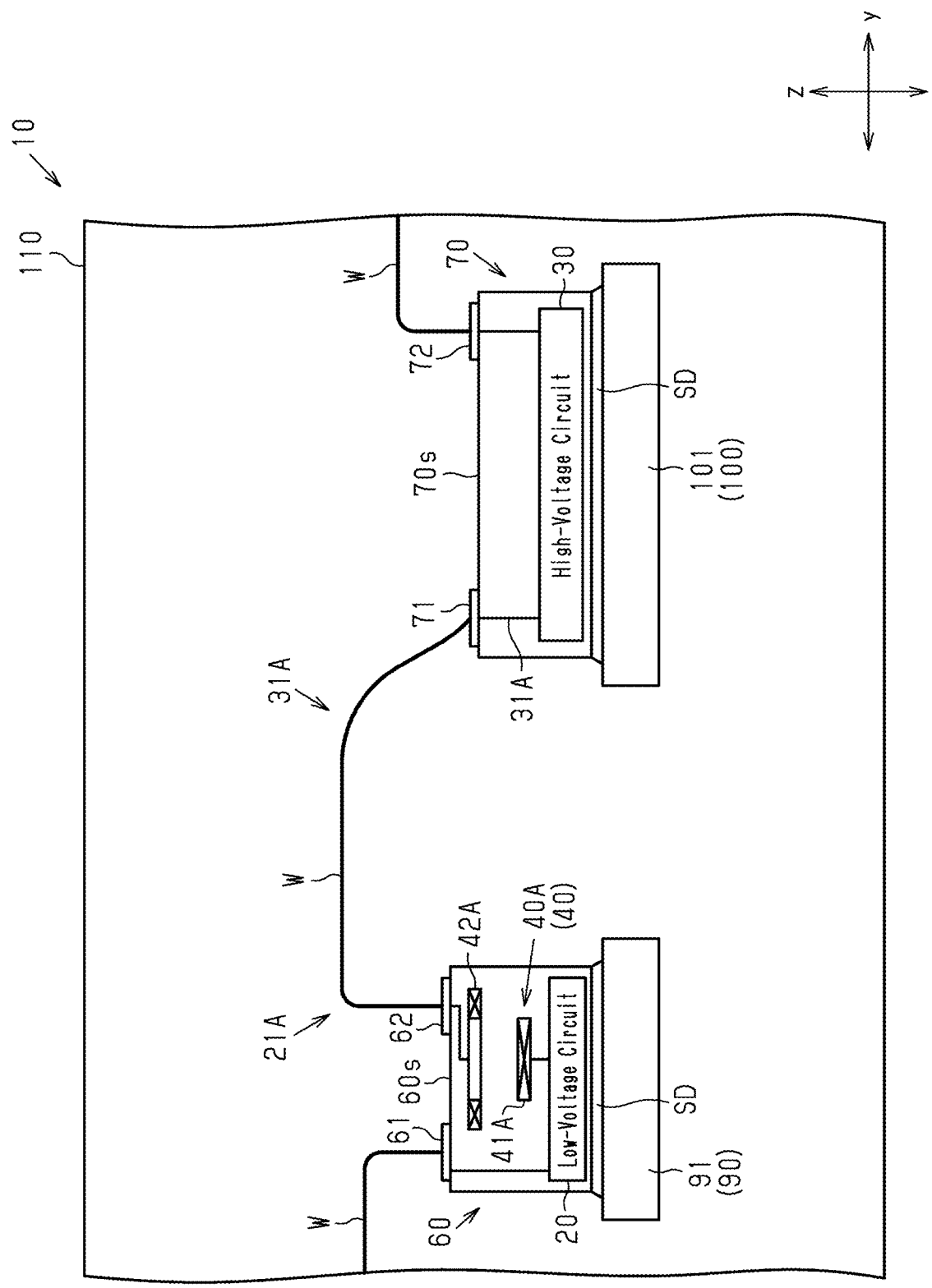
FIG. 21 is a schematic cross-sectional view showing a portion of a modified example of a gate driver.

In the first to fourth embodiments, the low-voltage circuit 20 and the transformer 40 are mounted on separate chips. Alternatively, for example, as shown in FIG. 21, the transformer 40 and the low-voltage circuit 20 may be mounted on a single chip. In an example, the transformer 40 may be arranged in insulation layers stacked on the substrate of the low-voltage circuit chip 60. In this case, the first coil 41A (41B) and the second coil 42A (42B) of the transformer 40 are embedded in the insulation layers. In an example, although not shown, the low-voltage circuit 20 may be formed on the substrate 84 of the transformer chip 80.

Figure 22:
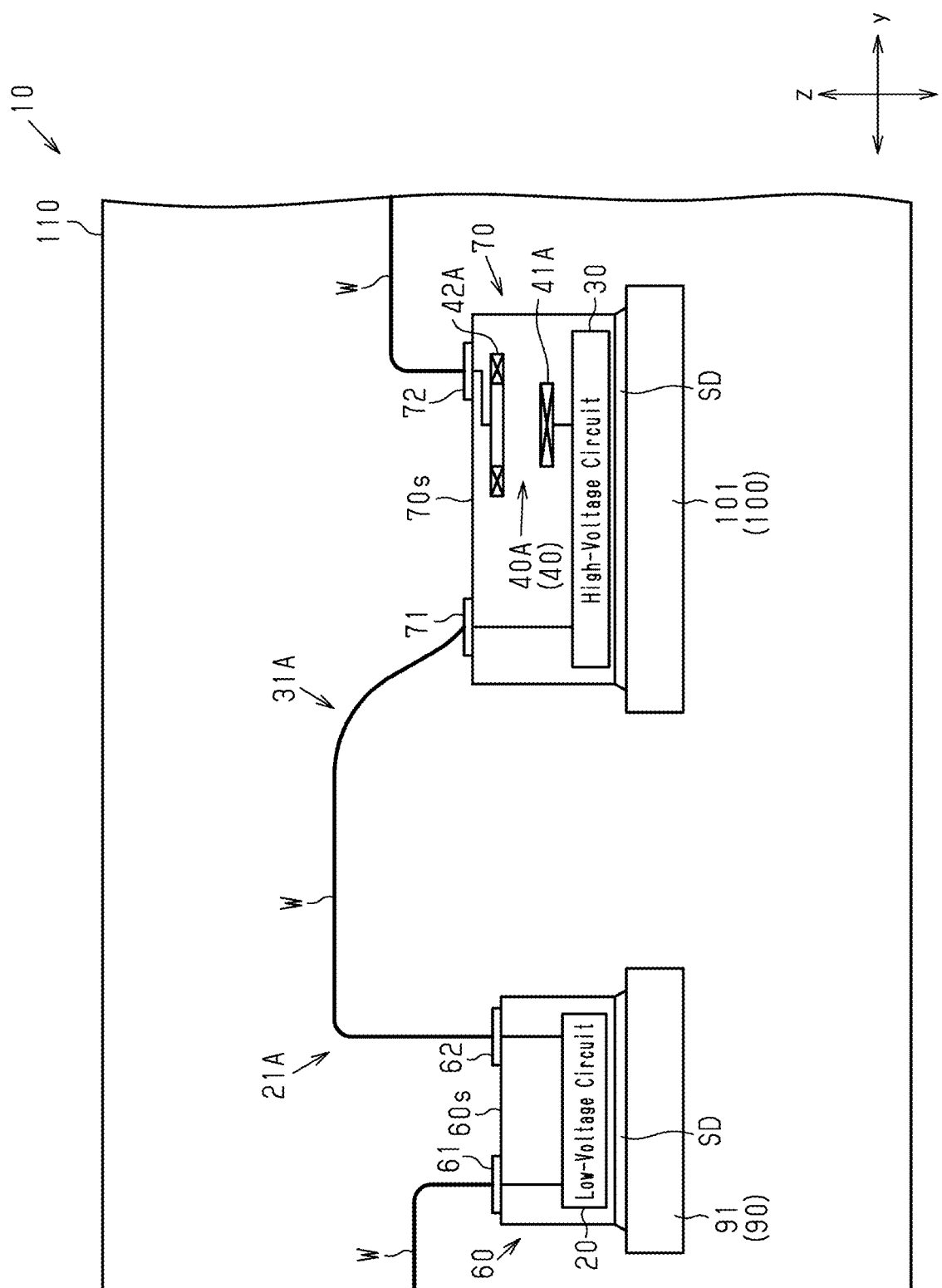
FIG. 22 is a schematic cross-sectional view showing a portion of a modified example of a gate driver.

In the first and fifth embodiments, the high-voltage circuit 30 and the transformer 40 are mounted on separate chips. Alternatively, for example, as shown in FIG. 22, the transformer 40 and the high-voltage circuit 30 may be mounted on a single chip. In an example, the transformer 40 may be arranged in insulation layers stacked on the substrate of the high-voltage circuit chip 70. In this case, the first coil 41A (41B) and the second coil 42A (42B) of the transformer 40 are embedded in the insulation layers. In an example, although not shown, the high-voltage circuit 30 may be formed on the substrate 84 of the transformer chip 80. In this case, the transformer chip 80 is mounted on the high-voltage die pad 101.

The structure of the transformer 40 in the second embodiment may be applied to the third embodiment. More specifically, the isolation module 220 may include the first transformer chip 80A and the second transformer chip 80B. Thus, the isolation module 220 may include multiple transformer chips.

The structure of the transformer 40 in the second embodiment may be applied to the fourth embodiment. More specifically, the low-voltage circuit unit 300 may include the low-voltage circuit chip 60, the first transformer chip 80A, and the second transformer chip 80B. Thus, the low-voltage circuit unit 300 may include multiple transformer chips.

The structure of the transformer 40 in the second embodiment may be applied to the fifth embodiment. More specifically, the high-voltage circuit unit 410 may include the high-voltage circuit chip 70, the first transformer chip 80A, and the second transformer chip 80B. Thus, the high-voltage circuit unit 410 may include multiple transformer chips.

In the first embodiment, the transformer chip 80 may be mounted on the high-voltage die pad 101. In the transformer chip 80, the first coil 41A is separated from the high-voltage die pad 101 by a distance sufficient to maintain insulation between the transformer chip 80 and the high-voltage die pad 101 even when the second reference potential of the high-voltage die pad 101 fluctuates and becomes high.

In the second embodiment, both the first transformer chip 80A and the second transformer chip 80B may be mounted on the low-voltage die pad 91. In the second transformer chip 80B, the second coil 48A (48B) is separated from the low-voltage die pad 91 by a distance sufficient to maintain insulation between the second transformer chip 80B and the low-voltage die pad 91 even when the second reference potential of the high-voltage die pad 101 fluctuates and becomes high.

The first transformer chip 80A and the second transformer chip 80B may be mounted on the high-voltage die pad 101. In the first transformer chip 80A, the first coil 45A (45B) is separated from the high-voltage die pad 101 by a distance sufficient to maintain insulation between the first transformer chip 80A and the high-voltage die pad 101 even when the second reference potential of the high-voltage die pad 101 fluctuates and becomes high.

In the present disclosure, the term "on" includes the meaning of "above" in addition to the meaning of "on" unless otherwise clearly indicated in the context. Thus, the phrase "A is formed on B" is intended to mean that A may be disposed directly on B in contact with B in the present embodiment and also that A may be disposed above B without contacting B in a modified example. In other words, the term "on" does not exclude a structure in which another member is formed between A and B.

The z-direction as referred to in the present disclosure does not necessarily have to be the vertical direction and does not necessarily have to fully conform to the vertical direction. In the structures according to the present disclosure, "upward" and "downward" in the z-direction as referred to in the present description are not limited to "upward" and "downward" in the vertical direction. In an example, the x-direction may conform to the vertical direction. In another example, the y-direction may conform to the vertical direction.

In this specification, "at least one of A and B" should be understood to mean "only A, only B, or both A and B."

Clauses

The technical aspects that are understood from the embodiments and the modified examples will be described below. The reference signs of the elements in the embodiments are given to the corresponding elements in clauses with parentheses. The reference signs used as examples to facilitate understanding, and the elements in each clause are not limited to those elements given with the reference signs.

[Clause 1] An isolation transformer, including:
an insulation layer (85); and
a transformer (40) including a first coil (41A/41B) and a second coil (42A/42B) embedded in the insulation layer (85), where
the first coil (41A/41B) and the second coil (42A/42B) are opposed to each other in a thickness-wise direction (z-direction) of the insulation layer (85), and
the first coil (41A/41B) and the second coil (42A/42B) include non-overlapping portions (53) that do not overlap each other in the thickness-wise direction (z-direction) of the insulation layer (85).

[Clause 2] The isolation transformer according to clause 1, where
the first coil (41A/41B) and the second coil (42A/42B) do not overlap each other as viewed in the thickness-wise direction (z-direction) of the insulation layer (85), and
the first coil (41A/41B) and the second coil (42A/42B) are entirely the non-overlapping portions (53).

[Clause 3] The isolation transformer according to clause 2, where
each of the first coil (41A/41B) and the second coil (42A/42B) is annular or spiral as viewed in the thickness-wise direction (z-direction) of the insulation layer (85), and
as viewed in the thickness-wise direction (z-direction) of the insulation layer (85), the second coil (42A/42B) includes an innermost circumference (52a) that is larger than an outermost circumference (51b) of the first coil (41A/41B) so that the second coil (42A/42B) surrounds the first coil (41A/41B).

[Clause 4] The isolation transformer according to clause 1, where
the first coil (41A/41B) and the second coil (42A/42B) partially overlap each other as viewed in the thickness-wise direction (z-direction) of the insulation layer (85), and
the first coil (41A/41B) and the second coil (42A/42B) include overlapping portions (54) that overlap each other as viewed in the thickness-wise direction (z-direction) of the insulation layer (85), and the non-overlapping portions (53).

[Clause 5] The isolation transformer according to any one of clauses 1 to 4, where
the first coil (41A/41B) is equal to the second coil (42A/42B) in number of turns, and
as viewed in the thickness-wise direction (z-direction) of the insulation layer (85), the first coil (41A/41B) is concentric with the second coil (42A/42B).

[Clause 6] The isolation transformer according to any one of clauses 1 to 5, where
the first coil (41A/41B) includes a transmission coil that transmits a signal, and
the second coil (42A/42B) includes a reception coil that receives the signal from the first coil (41A/41B).

[Clause 7] The isolation transformer according to any one of clauses 1 to 6, where the insulation layer (85) includes at least one of an oxide film or a resin.

[Clause 8] An isolation module, including:
the isolation transformer (80) according to any one of clauses 1 to 7; and
a low-voltage circuit chip (60) included in a gate driver (10) configured to apply a drive voltage signal to a gate of a switching element (501), where
the isolation transformer (80) is configured to be connected between the low-voltage circuit chip (60) and a high-voltage circuit chip (70) included in the gate driver (10).

[Clause 9] An isolation module, including:
the isolation transformer (80) according to any one of clauses 1 to 7; and
a high-voltage circuit chip (70) included in a gate driver (10) configured to apply a drive voltage signal to a gate of a switching element (501), where
the isolation transformer (80) is configured to be connected between the high-voltage circuit chip (70) and a low-voltage circuit chip (60) included in the gate driver (10).

[Clause 10] A gate driver (10) that applies a drive voltage signal to a gate of a switching element (501), the gate driver, including:

a low-voltage circuit chip (60) including a low-voltage circuit (20) configured to be actuated by application of a first voltage (V1);

a high-voltage circuit chip (70) including a high-voltage circuit (30) configured to be actuated by application of a second voltage (V2) that is higher than the first voltage (V1); and a transformer chip (80) connected between the low-voltage circuit chip (60) and the high-voltage circuit chip (70), the transformer chip (80) includes
the insulation layer (85), and
a transformer (40) including a first coil (41A/41B) and a second coil (42A/42B) embedded in the insulation layer (85) and separated from each other in a thickness-wise direction (z-direction) of the insulation layer (85), the first coil (41A/41B) and the second coil (42A/42B) are opposed to each other in the thickness-wise direction (z-direction) of the insulation layer (85), and the first coil (41A/41B) and the second coil (42A/42B) include non-overlapping portions (53) that do not overlap each other as viewed in the thickness-wise direction (z-direction) of the insulation layer (85).

[Clause 11] The gate driver according to clause 10, where
the gate driver (10) is configured to transmit the signal from the low-voltage circuit (20) toward the high-voltage circuit (30) through the transformer (40), the transformer chip (80) includes a chip main surface (80s) facing in the thickness-wise direction (z-direction) of the insulation layer (85) and a first electrode pad (81) and a second electrode pad (82) that are formed on the chip main surface (80s), the first coil (41A/41B) is electrically connected to the first electrode pad (81), the first electrode pad (81) is electrically connected to the low-voltage circuit (20), the second coil (42A/42B) is electrically connected to the second electrode pad (82), the second electrode pad (82) is electrically connected to the high-voltage circuit (30), the first coil (41A/41B) is located farther away from the chip main surface (80s) than the second coil (42A/42B) is, the first electrode pad (81) is arranged on the chip main surface (80s) near the low-voltage circuit chip (60) as viewed in the thickness-wise direction (z-direction) of the insulation layer (85), and the second electrode pad (82) is arranged on the chip main surface (80s) near the high-voltage circuit chip (70) as viewed in the thickness-wise direction (z-direction) of the insulation layer (85).

[Clause 12] The gate driver according to clause 10 or 11, where
the gate driver (10) is configured to bidirectionally transmit a signal between the low-voltage circuit (20) and the high-voltage circuit (30) through the transformer (40), the signal transmitted through the transformer (40) includes a first signal and a second signal, the transformer (40) includes a first signal transformer (40A/40B) and a second signal transformer (40C), the first signal is transmitted from the low-voltage circuit (20) toward the high-voltage circuit (30) through the first signal transformer (40A/40B), and the second signal is transmitted from the high-voltage circuit (30) toward the low-voltage circuit (20) through the second signal transformer (40C).

[Clause 13] The gate driver according to clause 12, where
each of the first coil (41A to 41C) and the second coil (42A to 42C) of the first signal transformer (40A/40B) and the second signal transformer (40C) is annular or spiral as viewed in the thickness-wise direction (z-direction) of the insulation layer (85), as viewed in the thickness-wise direction (z-direction) of the insulation layer (85), the second coil (42A/42B) of the first signal transformer (40A/40B) includes an innermost circumference (52a) that is larger than an outermost circumference (51b) of the first coil (41A/41B) of the first signal transformer (40A/40B) so that the second coil (42A/42B) surrounds the first coil (41A/41B), and as viewed in the thickness-wise direction (z-direction) of the insulation layer (85), the second coil (42C) of the second signal transformer (40C) includes an innermost circumference (52a) that is larger than an outermost circumference (51b) of the first coil (41C) of the second signal transformer (40C) so that the second coil (42C) surrounds the first coil (41C).

[Clause 14] The gate driver according to clause 13, where
the first coil (41A/41B) of the first signal transformer (40A/40B) and the second coil (42C) of the second signal transformer (40C) are electrically connected to the low-voltage circuit (20), and the second coil (42A/42B) of the first signal transformer (40A/40B) and the first coil (41C) of the second signal transformer (40C) are electrically connected to the high-voltage circuit (30).

[Clause 15] The gate driver according to clause 14, where
in the thickness-wise direction (z-direction) of the insulation layer (85), the second coil (42A/42B) of the first signal transformer (40A/40B) is located closer to a surface (85s) of the insulation layer (85) than the first coil (41A/41B) of the first signal transformer (40A/40B) is, and in the thickness-wise direction (z-direction) of the insulation layer (85), the first coil (41C) of the second signal transformer (40C) is located closer to the surface (85s) of the insulation layer (85) than the second coil (42C) of the second signal transformer (40C) is.

[Clause 16] The gate driver according to any one of clauses 12 to 15, where the transformer chip (80) includes the first signal transformer (40A/40B) and the second signal transformer (40C).

[Clause 17] The gate driver according to any one of clauses 12 to 15, where the transformer chip includes
a first transformer chip (80T) including the first signal transformer (40A/40B), and
a second transformer chip (80R) including the second signal transformer (40C).

[Clause 18] The gate driver according to clause 12, where
each of the first coil (41A to 41C) and the second coil (42A to 42C) of the first signal transformer (40A/40B) and the second signal transformer (40C) is annular or spiral as viewed in the thickness-wise direction (z-direction) of the insulation layer (85), as viewed in the thickness-wise direction (z-direction) of the insulation layer (85), the second coil (42A/42B) of the first signal transformer (40A/40B) includes an innermost circumference (52a) that is larger than an outermost circumference (51b) of the first coil (41A/

41B) of the first signal transformer (40A/40B) so that the second coil (42A/42B) surrounds the first coil (41A/41B), and as viewed in the thickness-wise direction (z-direction) of the insulation layer (85), the first coil (41C) of the second signal transformer (40C) includes an innermost circumference (51a) that is larger than an outermost circumference (52b) of the second coil (42C) of the second signal transformer (40C) so that the first coil (41C) surrounds the second coil (42C).

[Clause 19] The gate driver according to clause 18, where the first coil (41A/41B) of the first signal transformer (40A/40B) and the first coil (41C) of the second signal transformer (40C) are electrically connected to the low-voltage circuit (20), and the second coil (42A/42B) of the first signal transformer (40A/40B) and the second coil (42C) of the second signal transformer (40C) are electrically connected to the high-voltage circuit (30).

[Clause 20] The gate driver according to clause 19, where in the thickness-wise direction (z-direction) of the insulation layer (85), the second coil (42A/42B) of the first signal transformer (40A/40B) is located closer to a surface (85s) of the insulation layer (85) than the first coil (41A/41B) of the first signal transformer (40A/40B) is, and in the thickness-wise direction (z-direction) of the insulation layer (85), the second coil (42C) of the second signal transformer (40C) is located closer to the surface (85s) of the insulation layer (85) than the first coil (41C) of the second signal transformer (40C) is.

[Clause 21] A gate driver (10) that applies a drive voltage signal to a gate of a switching element (501), the gate driver, including:

a low-voltage circuit chip (60) including a low-voltage circuit (20) configured to be actuated by application of a first voltage (V1); and a high-voltage circuit chip (70) including a high-voltage circuit (30) configured to be actuated by application of a second voltage (V2) that is higher than the first voltage (V1), where the low-voltage circuit chip (60) includes
an insulation layer (85); and
a transformer (40) including a first coil (41A/41B) and a second coil (42A/42B) embedded in the insulation layer (85) and separated from each other in a thickness-wise direction (z-direction) of the insulation layer (85), the first coil (41A/41B) and the second coil (42A/42B) are opposed to each other in the thickness-wise direction (z-direction) of the insulation layer (85), and the first coil (41A/41B) and the second coil (42A/42B) include non-overlapping portions (53) that do not overlap each other as viewed in the thickness-wise direction (z-direction) of the insulation layer (85).

[Clause 22] A gate driver (10) that applies a drive voltage signal to a gate of a switching element (501), the gate driver, including:

a low-voltage circuit chip (60) including a low-voltage circuit (20) configured to be actuated by application of a first voltage (V1);

a high-voltage circuit chip (70) including a high-voltage circuit (30) configured to be actuated by application of a second voltage (V2) that is higher than the first voltage (V1), where the high-voltage circuit chip (70) includes
an insulation layer (85), and
a transformer (40) including a first coil (41A/41B) and a second coil (42A/42B) embedded in the insulation layer (85) and separated from each other in a thickness-wise direction (z-direction) of the insulation layer (85), the first coil (41A/41B) and the second coil (42A/42B) are opposed to each other in the thickness-wise direction (z-direction) of the insulation layer (85), and the first coil (41A/41B) and the second coil (42A/42B) include non-overlapping portions (53) that do not overlap each other as viewed in the thickness-wise direction (z-direction) of the insulation layer (85).

Various changes in form and details may be made to the examples above without departing from the spirit and scope of the claims and their equivalents. The examples are for the sake of description only, and not for purposes of limitation. Descriptions of features in each example are to be considered as being applicable to similar features or aspects in other examples. Suitable results may be achieved if sequences are performed in a different order, and/or if components in a described system, architecture, device, or circuit are combined differently, and/or replaced or supplemented by other components or their equivalents. The scope of the disclosure is not defined by the detailed description, but by the claims and their equivalents. All variations within the scope of the claims and their equivalents are included in the disclosure.

What is claimed is:

1. An isolation transformer, comprising:
an insulation layer; and
a transformer including a first coil and a second coil embedded in the insulation layer, wherein
the first coil and the second coil are opposed to each other in a thickness-wise direction of the insulation layer,
the first coil and the second coil include non-overlapping portions that do not overlap each other in the thickness-wise direction of the insulation layer, and
the first coil and the second coil are entirely the non-overlapping portions.

2. The isolation transformer according to claim 1, wherein each of the first coil and the second coil is annular or spiral as viewed in the thickness-wise direction of the insulation layer, and
as viewed in the thickness-wise direction of the insulation layer, the second coil includes an innermost circumference that is larger than an outermost circumference of the first coil so that the second coil surrounds the first coil.

3. The isolation transformer according to claim 1, wherein the first coil is equal to the second coil in number of turns, and
as viewed in the thickness-wise direction of the insulation layer, the first coil is concentric with the second coil.

4. The isolation transformer according to claim 1, wherein the first coil includes a transmission coil that transmits a signal, and
the second coil includes a reception coil that receives the signal from the first coil.

5. The isolation transformer according to claim 1, wherein the insulation layer includes at least one of an oxide film or a resin.

6. An isolation module, comprising:
the isolation transformer according to claim 1; and
a low-voltage circuit chip included in a gate driver, the gate driver configured to apply a drive voltage signal to a gate of a switching element, wherein the isolation transformer is configured to be connected between the low-voltage circuit chip and a high-voltage circuit chip included in the gate driver.

7. An isolation module, comprising:
the isolation transformer according to claim 1; and
a high-voltage circuit chip included in a gate driver, the gate driver configured to apply a drive voltage signal to a gate of a switching element, wherein
the isolation transformer is configured to be connected between the high-voltage circuit chip and a low-voltage circuit chip included in the gate driver.

8. A gate driver that applies a drive voltage signal to a gate of a switching element, the gate driver, comprising:
a low-voltage circuit chip including a low-voltage circuit configured to be actuated by application of a first voltage;
a high-voltage circuit chip including a high-voltage circuit configured to be actuated by application of a second voltage that is higher than the first voltage; and
an isolation transformer connected between the low-voltage circuit chip and the high-voltage circuit chip,
the isolation transformer includes
the insulation layer, and
a transformer including a first coil and a second coil embedded in the insulation layer and separated from each other in a thickness-wise direction of the insulation layer,
the first coil and the second coil are opposed to each other in the thickness-wise direction of the insulation layer, and
the first coil and the second coil include non-overlapping portions that do not overlap each other as viewed in the thickness-wise direction of the insulation layer.

9. The gate driver according to claim 8, wherein
the gate driver is configured to transmit a signal from the low-voltage circuit toward the high-voltage circuit through the transformer,
the isolation transformer includes a chip main surface facing in the thickness-wise direction of the insulation layer and a first electrode pad and a second electrode pad that are formed on the chip main surface,
the first coil is electrically connected to the first electrode pad,
the first electrode pad is electrically connected to the low-voltage circuit,
the second coil is electrically connected to the second electrode pad,
the second electrode pad is electrically connected to the high-voltage circuit,
the first coil is located farther away from the chip main surface than the second coil is,
the first electrode pad is arranged on the chip main surface near the low-voltage circuit chip as viewed in the thickness-wise direction of the insulation layer, and
the second electrode pad is arranged on the chip main surface near the high-voltage circuit chip as viewed in the thickness-wise direction of the insulation layer.

10. The gate driver according to claim 8, wherein
the gate driver is configured to bidirectionally transmit a signal between the low-voltage circuit and the high-voltage circuit through the transformer,
the signal transmitted through the transformer includes a first signal and a second signal,
the transformer includes a first signal transformer and a second signal transformer,
the first signal is transmitted from the low-voltage circuit toward the high-voltage circuit through the first signal transformer, and
the second signal is transmitted from the high-voltage circuit toward the low-voltage circuit through the second signal transformer.

11. The gate driver according to claim 10, wherein
each of the first coil and the second coil of the first signal transformer and the second signal transformer is annular or spiral as viewed in the thickness-wise direction of the insulation layer,
as viewed in the thickness-wise direction of the insulation layer, the second coil of the first signal transformer includes an inner circumference that is larger than an outermost circumference of the first coil of the first signal transformer so that the second coil surrounds the first coil, and
as viewed in the thickness-wise direction of the insulation layer, the second coil of the second signal transformer includes an inner circumference that is larger than an outermost circumference of the first coil of the second signal transformer so that the second coil surrounds the first coil.

12. The gate driver according to claim 11, wherein
the first coil of the first signal transformer and the second coil of the second signal transformer are electrically connected to the low-voltage circuit, and
the second coil of the first signal transformer and the first coil of the second signal transformer are electrically connected to the high-voltage circuit.

13. The gate driver according to claim 12, wherein
in the thickness-wise direction of the insulation layer, the second coil of the first signal transformer is located closer to a surface of the insulation layer than the first coil of the first signal transformer is, and
in the thickness-wise direction of the insulation layer, the first coil of the second signal transformer is located closer to the surface of the insulation layer than the second coil of the second signal transformer is.

14. The gate driver according to claim 10, wherein the isolation transformer includes the first signal transformer and the second signal transformer.

15. The gate driver according to claim 10, wherein the isolation transformer includes
a first transformer chip including the first signal transformer, and
a second transformer chip including the second signal transformer.

* * * * *